US012777646B2

(12) United States Patent
Kim et al.

(10) Patent No.: US 12,777,646 B2
(45) Date of Patent: Oct. 27, 2026

(54) VERTICAL MEMORY STRUCTURE COMPRISING A CONTACT PLUG ELECTRICALLY CONNECTED TO A LOWER CIRCUIT PATTERN

(71) Applicant: SAMSUNG ELECTRONICS CO., LTD., Suwon-si (KR)

(72) Inventors: Heesuk Kim, Suwon-si (KR); Seungyoon Kim, Suwon-si (KR); Yejin Park, Suwon-si (KR); Inhwan Baek, Suwon-si (KR); Jongseon Ahn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 361 days.

(21) Appl. No.: 18/379,849

(22) Filed: Oct. 13, 2023

(65) Prior Publication Data

US 2024/0276719 A1 Aug. 15, 2024

(30) Foreign Application Priority Data

Feb. 10, 2023 (KR) ........................ 10-2023-0017870

(51) Int. Cl.
*H10B 43/27* (2023.01)
*H10B 43/35* (2023.01)
*H10B 43/40* (2023.01)

(52) U.S. Cl.
CPC ............. *H10B 43/27* (2023.02); *H10B 43/35* (2023.02); *H10B 43/40* (2023.02)

(58) Field of Classification Search
None
See application file for complete search history.

(56) References Cited

U.S. PATENT DOCUMENTS 9,887,097 B2 2/2018 Hudson
11,387,184 B2 7/2022 Kim et al.
(Continued)

FOREIGN PATENT DOCUMENTS

KR 10-2021-0035558 4/2021
KR 10-2021-0050772 5/2021
(Continued)

OTHER PUBLICATIONS

Office Action dated Aug. 10, 2026 issued in corresponding to Korean Patent Application No. 10-2023-0017870.

*Primary Examiner* — Daniel Whalen
(74) *Attorney, Agent, or Firm* — Morgan, Lewis & Bockius LLP

(57) ABSTRACT

A semiconductor device includes: a lower circuit pattern disposed on a substrate; a common source plate (CSP) disposed on the lower circuit pattern; a channel connection pattern disposed on the CSP; a sacrificial layer structure disposed on the CSP and spaced apart from the channel connection pattern; a support layer disposed on the channel connection pattern and the sacrificial layer structure; first and second gate electrode structures including gate electrodes stacked on the support layer and spaced apart from each other; a first channel disposed on the CSP, wherein the first channel extends through the first gate electrode structure, the support layer and the channel connection pattern; and a contact plug extending through the second gate electrode structure, the support layer, the sacrificial layer structure and the CSP, wherein the contact plug is electrically connected to the lower circuit pattern.

20 Claims, 49 Drawing Sheets

(56) References Cited

U.S. PATENT DOCUMENTS

| | | | | |
|---|---|---|---|---|
| 11,411,018 | B2 | 8/2022 | Kim et al. | |
| 11,456,317 | B2 | 9/2022 | Kim et al. | |
| 2021/0217765 | A1 | 7/2021 | Kim et al. | |
| 2021/0399005 | A1 | 12/2021 | Lee et al. | |
| 2022/0045082 | A1 | 2/2022 | Jeong et al. | |
| 2022/0123001 | A1 | 4/2022 | Kim et al. | |
| 2022/0139946 | A1 | 5/2022 | Takaki | |
| 2022/0173118 | A1* | 6/2022 | Kang | H10B 43/27 |
| 2022/0344267 | A1 | 10/2022 | Kim et al. | |
| 2023/0307353 | A1* | 9/2023 | Lee | H10B 43/27 |

FOREIGN PATENT DOCUMENTS

| | | |
|---|---|---|
| KR | 10-2021-0092363 | 7/2021 |
| KR | 10-2022-0019896 | 2/2022 |
| KR | 10-2022-0057917 | 5/2022 |
| KR | 10-2022-0077399 A | 6/2022 |

* cited by examiner

VERTICAL MEMORY STRUCTURE COMPRISING A CONTACT PLUG ELECTRICALLY CONNECTED TO A LOWER CIRCUIT PATTERN

CROSS-REFERENCE TO RELATED APPLICATION

This application claims priority under 35 U.S.C. § 119 to Korean Patent Application No. 10-2023-0017870 filed on Feb. 10, 2023 in the Korean Intellectual Property Office, the disclosure of which is incorporated by reference herein in its entirety.

TECHNICAL FIELD

Example embodiments of the present inventive concept relate to a semiconductor device. More particularly, example embodiments of the present inventive concept relate to a vertical memory device.

DISCUSSION OF THE RELATED ART

In an electronic system requiring data storage, a high capacity semiconductor device that may store high capacity data is desirable. Thus, a method of increasing the data storage capacity of the semiconductor device has been under development. For example, a semiconductor device including memory cells that may be 3-dimensionally stacked has been under development.

Research on a method for highly integrating memory cells in the semiconductor device is currently being conducted.

SUMMARY

According to an example embodiment of the present inventive concept, a semiconductor device includes: a lower circuit pattern disposed on a substrate; a common source plate (CSP) disposed on the lower circuit pattern; a channel connection pattern disposed on the CSP; a sacrificial layer structure disposed on the CSP, wherein the sacrificial layer structure is spaced apart from the channel connection pattern; a support layer disposed on the channel connection pattern and the sacrificial layer structure; first and second gate electrode structures each including gate electrodes sequentially stacked on the support layer and spaced apart from each other in a first direction substantially perpendicular to an upper surface of the substrate, wherein each of the gate electrodes extends in a second direction substantially parallel to the upper surface of the substrate; a first channel disposed on the CSP, wherein the first channel extends through the first gate electrode structure, the support layer and the channel connection pattern; and a contact plug extending through the second gate electrode structure, the support layer, the sacrificial layer structure and the CSP, wherein the contact plug is electrically connected to the lower circuit pattern.

According to an example embodiment of the present inventive concept, a semiconductor device includes: a lower circuit pattern disposed on a substrate; a common source plate (CSP) disposed on the lower circuit pattern; a channel connection pattern disposed on the CSP; a sacrificial layer structure disposed on the CSP, wherein the sacrificial layer structure is spaced apart from the channel connection pattern; a support pattern disposed on the CSP, wherein the support pattern is interposed between the channel connection pattern and the sacrificial layer structure; a support layer disposed on the channel connection pattern and the sacrificial layer structure, wherein the support layer includes substantially a same material as that of the support pattern and is connected to the support pattern; first and second gate electrode structures each including gate electrodes sequentially stacked on the support layer and spaced apart from each other in a first direction substantially perpendicular to an upper surface of the substrate, wherein each of the gate electrodes extends in a second direction substantially parallel to the upper surface of the substrate; a channel disposed on the CSP, wherein the channel extends through the first gate electrode structure, the support layer and the channel connection pattern; and a contact plug extends through the second gate electrode structure, the support layer, the sacrificial layer structure and the CSP, wherein the contact plug is electrically connected to the lower circuit pattern, wherein the support pattern overlaps the second gate electrode structure in the first direction.

According to an example embodiment of the present inventive concept, a semiconductor device includes: a lower circuit pattern disposed on a substrate; a common electrode plate (CSP) disposed on the lower circuit pattern; a channel connection pattern disposed on the CSP; a sacrificial layer structure disposed on the CSP, wherein the sacrificial layer structure is spaced apart from the channel connection pattern; a support pattern disposed on the CSP, wherein the support pattern is interposed between the channel connection pattern and the sacrificial layer structure; a support layer disposed on the channel connection pattern and the sacrificial layer structure, wherein the support layer includes substantially a same material as that of the support pattern, and is connected to the support pattern; first and second gate electrode structures each including gate electrodes sequentially stacked on the support layer and spaced apart from each other in a first direction substantially perpendicular to an upper surface of the substrate, wherein each of the gate electrodes extends in a second direction substantially parallel to the upper surface of the substrate; a division pattern extending in the second direction on the CSP through the support layer and the channel connection pattern, wherein the division pattern separates the first and second gate electrode structures from each other; a first memory channel structure disposed on the CSP, wherein the first memory channel structure extends through the first gate electrode structure and the support layer and is connected to the channel connection pattern; a second memory channel structure disposed on the first memory channel structure; a support structure extending through the second gate electrode structure and the support pattern, and contacting an upper surface of the CSP; and a contact plug extending through the second gate electrode structure, the support layer, the sacrificial layer structure and the CSP, and is electrically connected to the lower circuit pattern.

BRIEF DESCRIPTION OF THE DRAWINGS

The above and other features of the present inventive concept will become more apparent by describing in detail example embodiments thereof, with reference to the accompanying drawings, in which.

DETAILED DESCRIPTION OF THE EMBODIMENTS

The above and other aspects and features of the capacitor structures and the methods of manufacturing the same, the semiconductor devices including the capacitor structures and the methods of manufacturing the same in accordance with example embodiments of the present inventive concept will become readily understood from detail descriptions that follow, with reference to the accompanying drawings. It will be understood that, although the terms "first," "second," and/or "third" may be used herein to describe various materials, layers, regions, pads, electrodes, patterns, structure and/or processes, these various materials, layers, regions, pads, electrodes, patterns, structure and/or processes should not be limited by these terms. These terms are only used to distinguish one material, layer, region, pad, electrode, pattern, structure or process from another material, layer, region, pad, electrode, pattern, structure or process. Thus, "first", "second" and/or "third" may be used selectively or interchangeably for each material, layer, region, electrode, pad, pattern, structure or process respectively.

Hereinafter, a vertical direction substantially perpendicular to an upper surface of a substrate (or another layer) may be referred to as a first direction D1, and two directions crossing each other and extending substantially parallel to the upper surface of the substrate (or another layer) may be referred to as second and third directions D2 and D3, respectively. In example embodiments of the present inventive concept, the second and third directions D2 and D3 may be substantially perpendicular to each other.

FIGS. 1 to 6 are plan views and cross-sectional views illustrating a semiconductor device in accordance with example embodiments of the present inventive concept.

Figure 1:
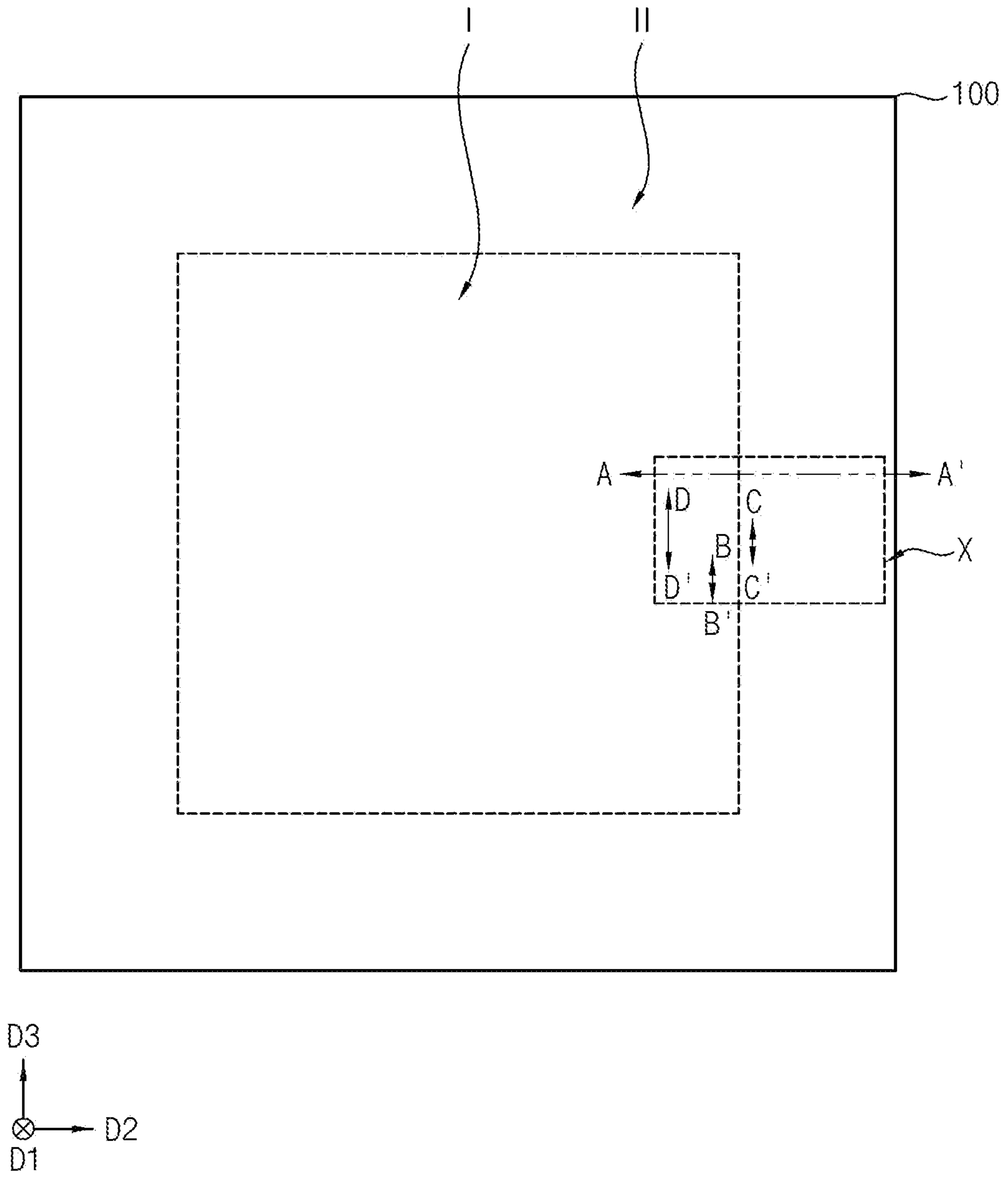
FIGS. 1, 2, 3, 4, 5 and 6 are plan views and cross sectional views illustrating a semiconductor device in accordance with example embodiments of the present inventive concept.
Figure 2:
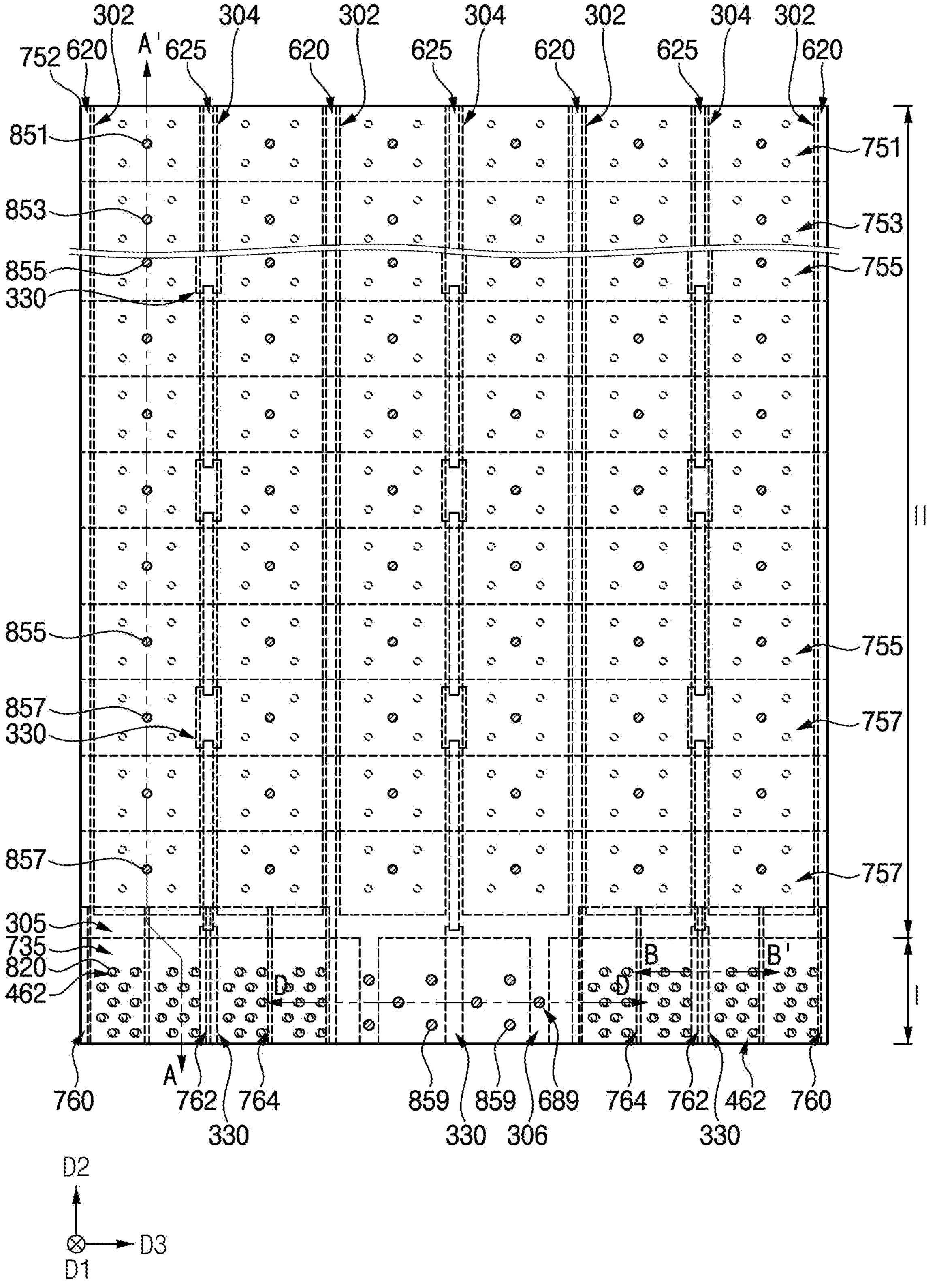
Figure 3:
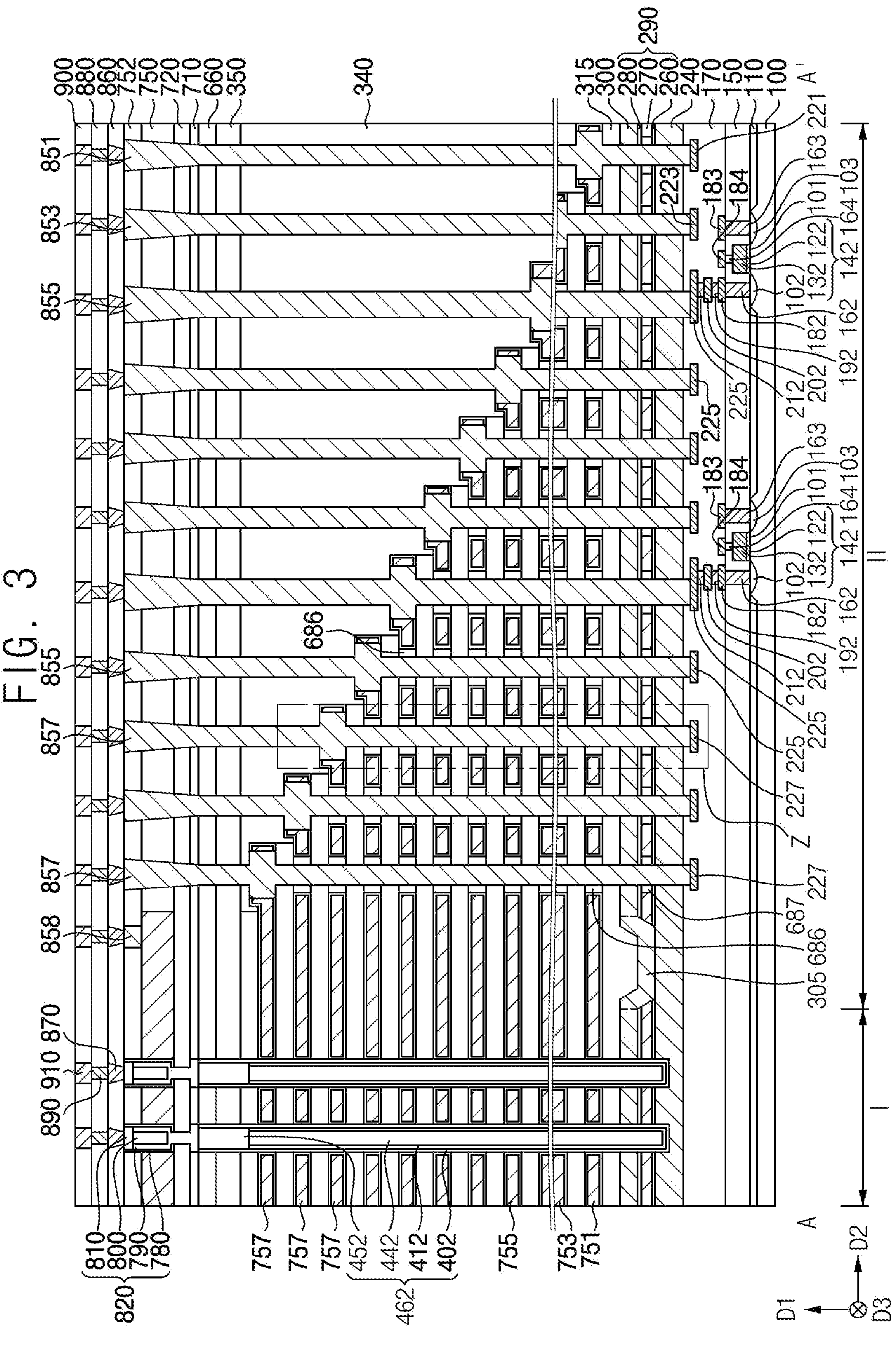
Figure 4:
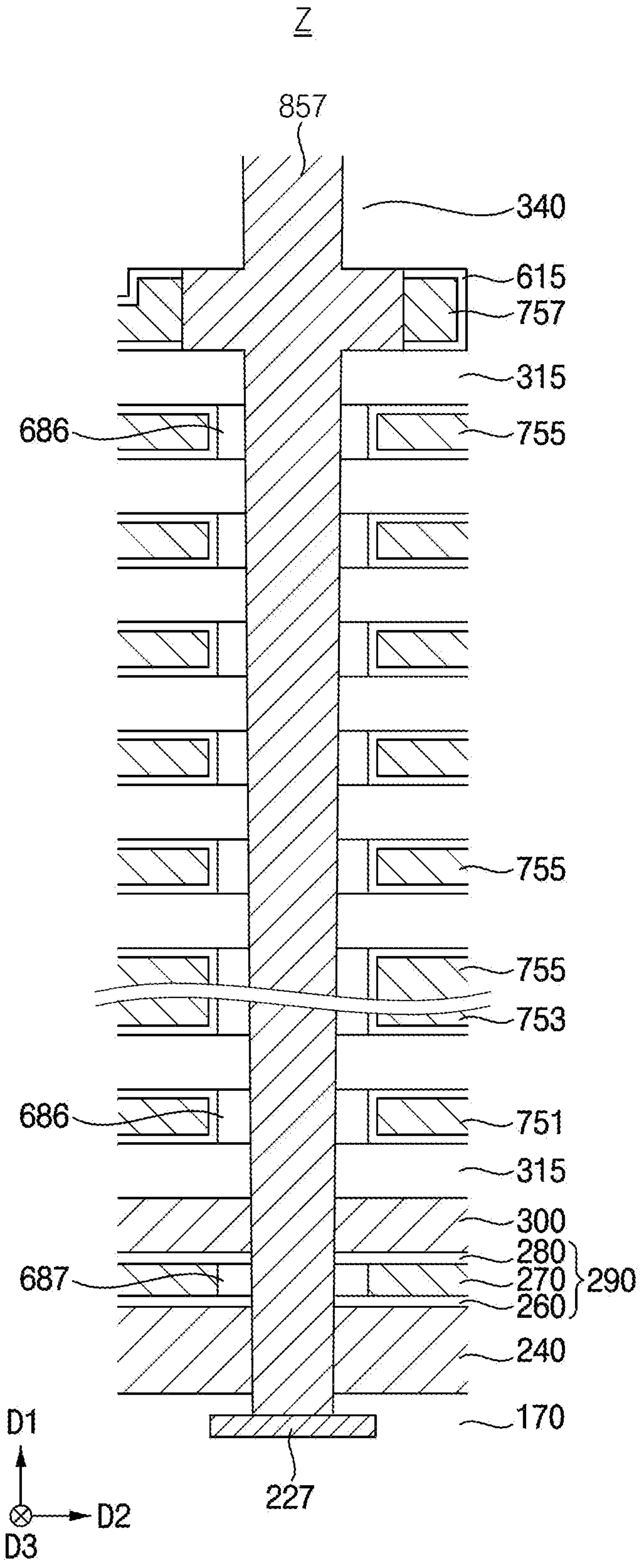
Figure 5:
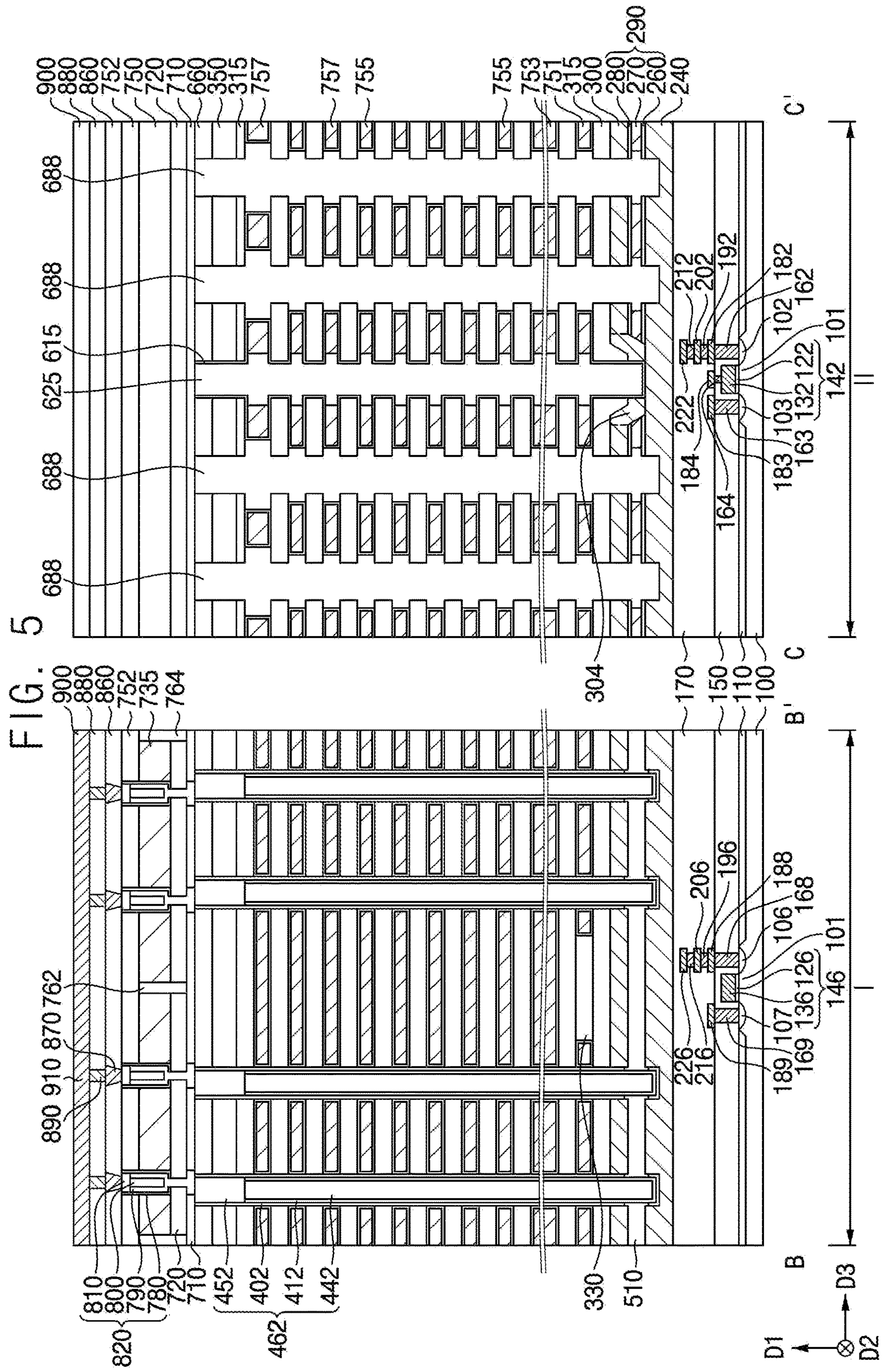
Figure 6:
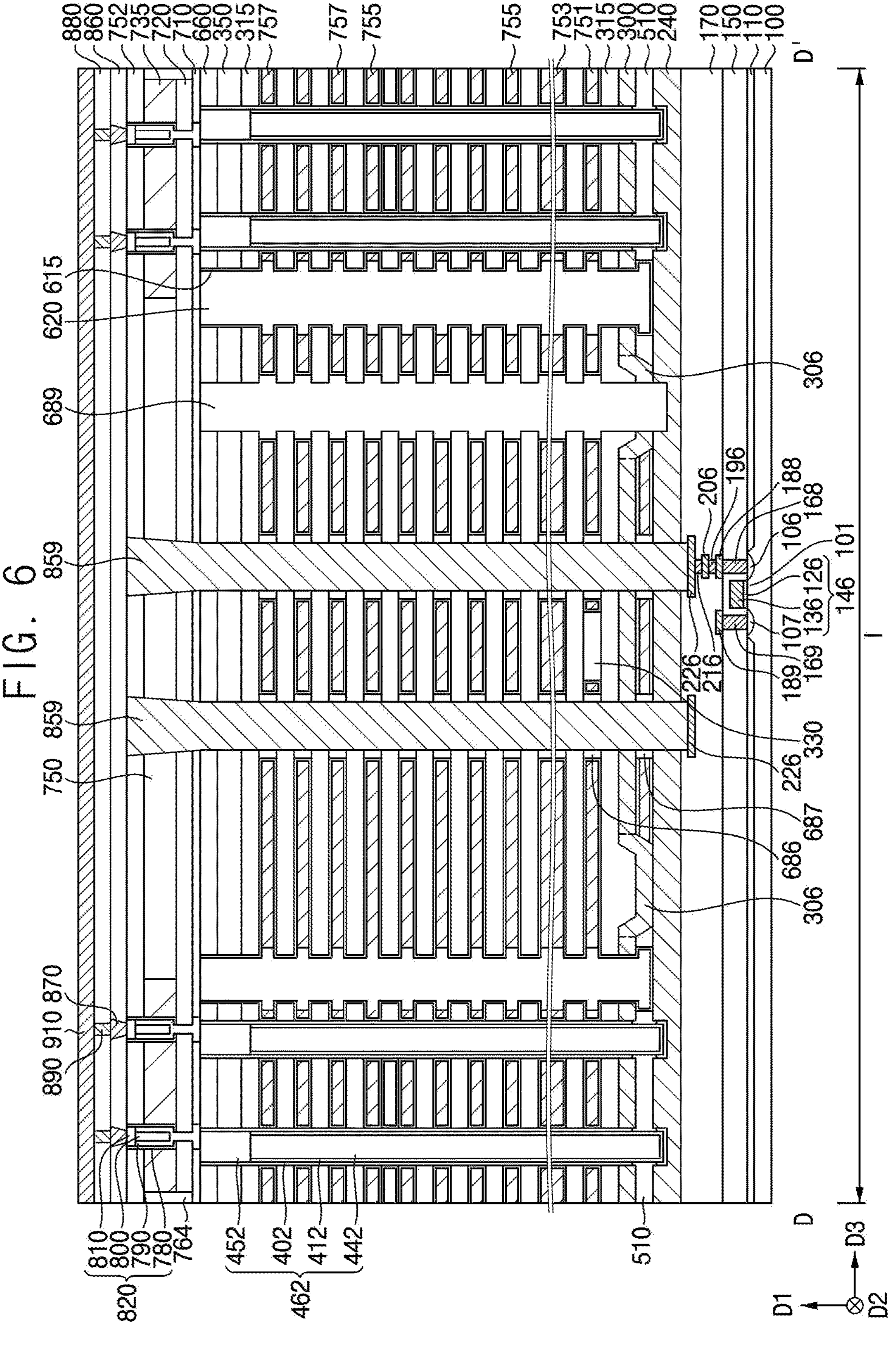

Specifically, FIGS. 1 and 2 are the plan view, and FIGS. 3 and 4 are cross-sectional views taken along line A-A' of FIG. 2. Further, FIG. 5 includes cross-sectional views taken along lines B-B' and C-C' of FIG. 2, and FIG. 6 is a cross-sectional view taken along line D-D' of FIG. 2. FIGS. 2 to 6 are drawings about region X in FIG. 1, and FIG. 3 is an enlarged cross-sectional view of region Z of FIG. 3.

Referring to FIGS. 1 to 6, the semiconductor device may include a lower circuit pattern, a common source plate (CSP), a gate electrode structure, first to sixth division patterns 330, 620, 625, 760, 762 and 764, a support layer 300, first to fourth support patterns 302, 304, 306 and 305, first and second support structures 688 and 689, first and second memory channel structures 462 and 820, first to seventh upper contact plugs 851, 853, 855, 857, 859, 858 and 870, an upper via 890 and an upper wiring 910 on a substrate 100.

In addition, the semiconductor device may include a sacrificial layer structure 290, a channel connection pattern 510, a second blocking pattern 615, first, fourth and fifth insulation patterns 315, 686 and 687, first to fifth insulating interlayers 150, 170, 340, 350 and 660, an etch stop layer 720, and seventh to twelfth insulating interlayers 710, 750, 752, 860, 880 and 900.

The substrate 100 may include a semiconductor material, e.g., silicon, germanium, silicon-germanium, etc., or a III-V group compound semiconductor, e.g., GaP, GaAs, GaSb, etc. In some example embodiments of the present inventive concept, the substrate 100 may be a silicon-on-insulator (SOI) substrate or a germanium-on-insulator (GOI) substrate.

The substrate 100 may include a first region I and a second region II at least partially surrounding the first region I. In some example embodiments of the present inventive concept, the first region I may be a cell array region, and the second region II may be a pad region or an extension region. The first and second regions I and II of the substrate 100 may collectively form a cell region.

For example, memory cells each of which includes a gate electrode, a channel and a charge storage structure may be formed on the first region I of the substrate 100, and upper contact plugs for transferring electrical signals to the memory cells and pads of the gate electrodes contacting the upper contact plugs may be formed on the second region II of the substrate 100. FIG. 1 shows that the second region II of the substrate 100 entirely surrounds the first region I of the substrate 100, however, the present inventive concept might not be limited thereto, and for example, the second region II of the substrate 100 may be formed only at opposite sides of the first region I of the substrate 100 in the second direction D2.

The substrate 100 may further include a third region surrounding the second region IL, and upper circuit patterns for applying electrical signals to the memory cells through the upper contact plugs may be formed on the third region of the substrate 100.

The substrate 100 may include a field region on which an isolation pattern 110 is formed, and an active region 101 on which no isolation pattern is formed. The isolation pattern 110 may include an oxide, e.g., silicon oxide.

In some example embodiments of the present inventive concept, the semiconductor device may have a cell over periphery (COP) structure. For example, the lower circuit pattern may be disposed on the substrate 100, and the memory cells, the upper contact plugs and the upper circuit pattern may be disposed over the lower circuit pattern. The lower circuit pattern may include, e.g., transistors, lower contact plugs, lower wirings, lower vias, etc.

For example, first and second transistors may be disposed on the second and first regions II and I, respectively, of the substrate 100. The first transistor may include a first lower gate structure 142 on the substrate 100, and first and second impurity regions 102 and 103 at upper portions, respectively, of the active region 101 adjacent to the first lower gate structure 142, which may serve as source/drains, respectively. The second transistor may include a second lower gate structure 146 on the substrate 100, and third and fourth impurity regions 106 and 107 at upper portions, respectively, of the active region 101 adjacent to the second lower gate structure 146, which may serve as source/drains, respectively.

The first lower gate structure 142 may include a first lower gate insulation pattern 122 and a first lower gate electrode 132 sequentially stacked on the substrate 100, and the second lower gate structure 146 may include a second lower gate insulation pattern 126 and a second lower gate electrode 136 sequentially stacked on the substrate 100.

The first insulating interlayer 150 may be disposed on the substrate 100, and may cover the first and second transistors. First, second, fourth and fifth lower contact plugs 162, 163, 168 and 169 may extend through the first insulating interlayer 150 and may contact the first to fourth impurity regions 102, 103, 106 and 107, respectively. A third lower contact plug 164 may extend through the first insulating interlayer 150 and may contact the first lower gate electrode 132. A sixth lower contact plug may extend through the first insulating interlayer 150 and may contact the second lower gate electrode 136.

First to fifth lower wirings 182, 183, 184, 188 and 189 may be disposed on the first insulating interlayer 150, and may contact upper surfaces of the first to fifth lower contact plugs 162, 163, 164, 168 and 169, respectively. A first lower via 192, a sixth lower wiring 202, a third lower via 212 and an eighth lower wiring 225 may be sequentially stacked on the first lower via 182, and a second lower via 196, a seventh lower wiring 206, a fourth lower via 216 and a ninth lower wiring 226 may be sequentially stacked on the fourth lower wiring 188.

Tenth to twelfth lower wirings 221, 223 and 227 may be further disposed at the same level as the eighth and ninth lower wirings 225 and 226, and may be electrically connected to transistors that are disposed on the substrate 100 other than the first and second transistors, respectively.

The second insulating interlayer 170 may be disposed on the first insulating interlayer 150, and may cover the first to twelfth lower wirings 182, 183, 184, 188, 189, 202, 206, 225, 226, 221, 223 and 227 and the first to fourth lower vias 192, 196, 212 and 216.

The CSP 240 may be formed on the second insulating interlayer 170. The CSP 240 may include, e.g., polysilicon doped with n-type impurities. In addition, the CSP 240 may include a metal silicide layer and a doped polysilicon layer sequentially stacked. The metal silicide layer may include, e.g., tungsten silicide.

The sacrificial layer structure 290, the channel connection pattern 510, the support layer 300, and the first to fourth support pattern 302, 304, 306 and 305 may be disposed on the CSP 240.

The channel connection pattern 510 may be disposed on the first region I of the substrate 100, and may include an air gap therein. The sacrificial layer structure 290 may be disposed on the second region II of the substrate 100, and may also be disposed on a portion of the first region I of the substrate 100.

The channel connection pattern 510 may include, for example, polysilicon doped with n-type impurities or undoped polysilicon. The sacrificial layer structure 290 may include first to third sacrificial layers 260, 270 and 280 sequentially stacked in the first direction D1. For example, each of the first and third sacrificial layers 260 and 280 may include an oxide, e.g., silicon oxide, and the second sacrificial layer 270 may include a nitride, e.g., silicon nitride.

Figure 7:
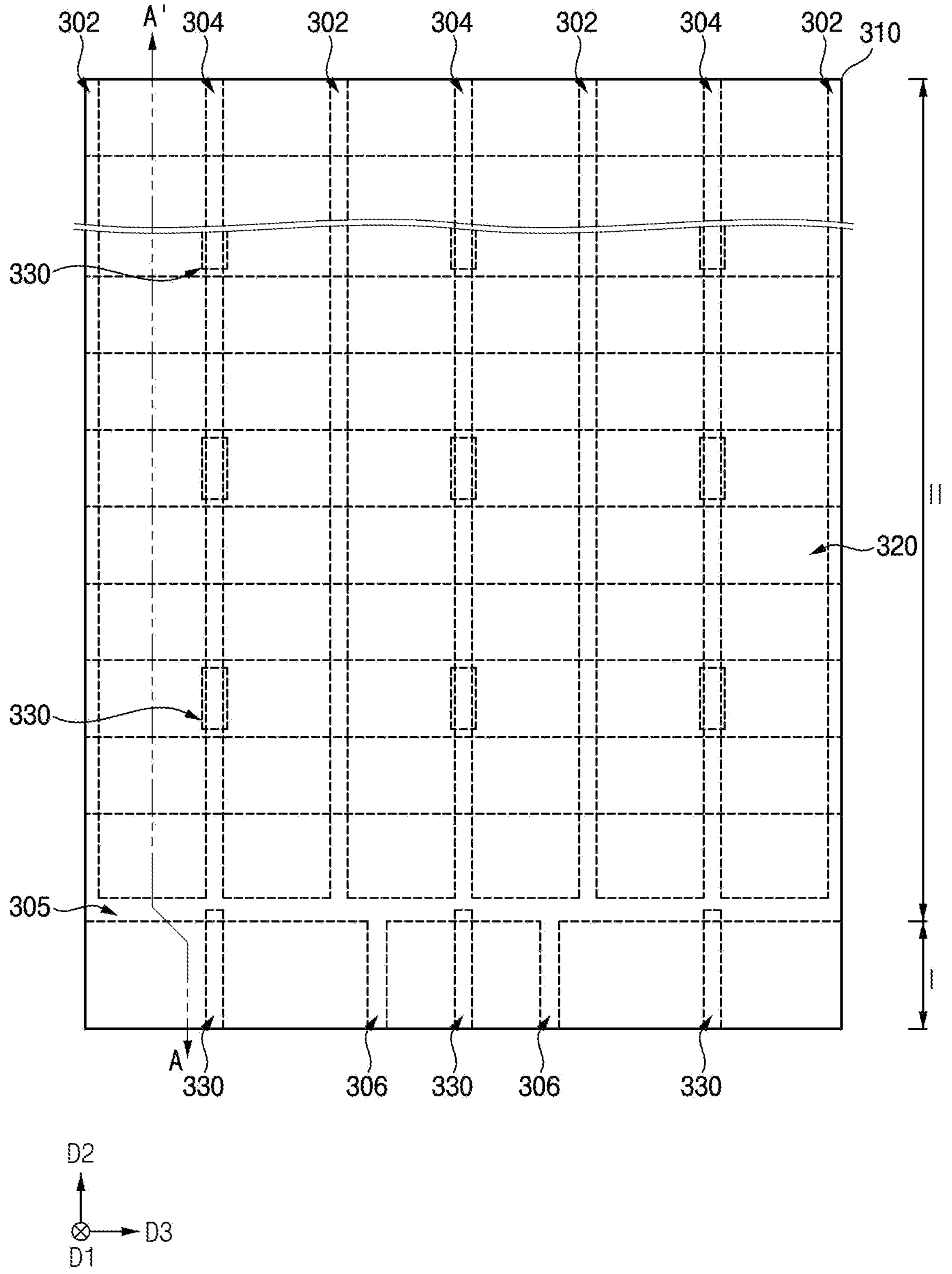
FIGS. 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, and 49 are plan views and cross-sectional views illustrating a method of manufacturing a semiconductor device in accordance with example embodiments of the present inventive concept.
Figure 8:
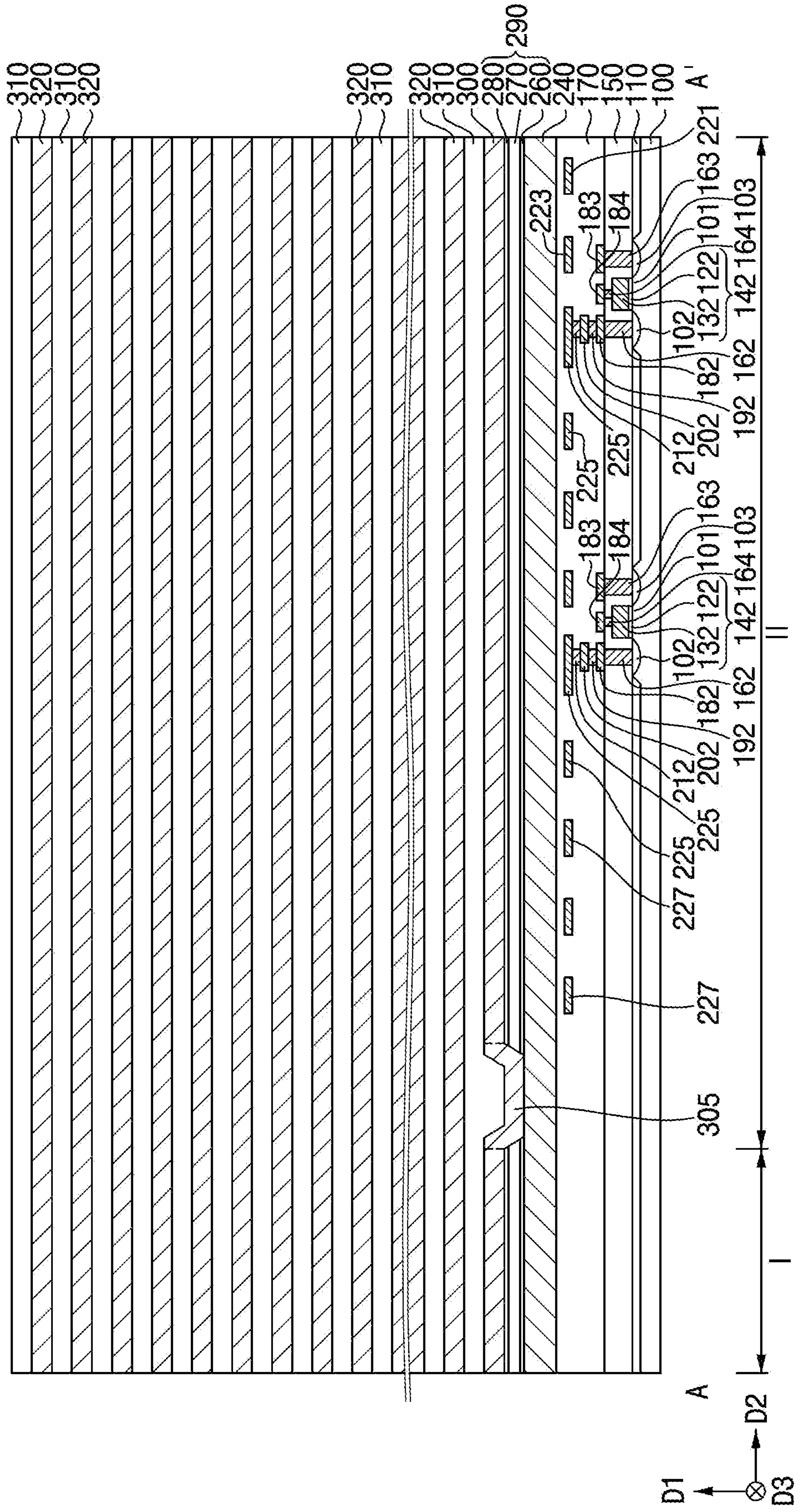

Referring to FIGS. 1 to 6 together with FIGS. 7 and 8, the support layer 300 may be disposed on the channel connection pattern 510 and the sacrificial layer structure 290, and may also be disposed in a first opening 302 extending through the channel connection pattern 510 and the sacrificial layer structure 290 to expose an upper surface of the CSP 240, which may be referred to as a support pattern.

The support pattern may have various layouts in a plan view, and may include the first to fourth support patterns 302, 304, 306 and 305. In some example embodiments of the present inventive concept, the fourth support pattern 305 may be disposed on a portion of the second region H of the substrate 100 adjacent to the first region I of the substrate 100, and may at least partially surround the first region I. Accordingly, the fourth support pattern 305 may have a rectangular annular shape in a plan view.

In some example embodiments of the present inventive concept, a plurality of first support patterns 302, each of which may extend in the second direction D2, may be spaced apart from each other at a regular distance from each other in the third direction D3, and each of the first support patterns 302 may be connected to the fourth support pattern 305.

In some example embodiments of the present inventive concept, the second support pattern 304 may extend in the second direction D2 on the second region II of the substrate 100 to be connected to the fourth support pattern 305, and a plurality of second patterns 304 may be spaced apart from each other in the third direction D3. Each of the second support patterns 304 may be disposed between ones of the first support patterns 302 that are adjacent to each other in the third direction D3 on the second region II of the substrate 100. In some example embodiments of the present inventive concept, the first and second support patterns 302 and 304 may be alternately and repeatedly disposed at a regular distance from each other in the third direction D3 on the second region II of the substrate 100.

The third support pattern 306 may extend in the second direction D2 on the first region I of the substrate 100, and may be connected to the fourth support pattern 305. In some example embodiments of the present inventive concept, the third support pattern 306 may be offset from the first support pattern 302 in the third direction D3, instead of being disposed on a straight line with the first support pattern 302 in the second direction D2 on the second region II of the substrate 100. In some example embodiments of the present inventive concept, the third support pattern 306 may be misaligned with the first support pattern 302 and the second support pattern 304.

In some example embodiments of the present inventive concept, two of the third support patterns 306 adjacent to each other in the third direction D3 may form a third support pattern pair, and a plurality of third support pattern pairs may be spaced apart from each other in the third direction D3.

Each of the support layer 300 and the first to fourth support patterns 302, 304, 306 and 305 may include a material having an etching selectivity with respect to the first to third sacrificial layers 260, 270 and 280, e.g., polysilicon doped with n-type impurities.

The gate electrode structure may include gate electrodes, which may be formed at a plurality of levels, respectively, spaced apart from each other in the first direction D1 on the support layer 300 and the fourth support pattern 305, and each of the gate electrodes may extend in the second direction D2.

In some example embodiments of the present inventive concept, the gate electrode structure may include first to fifth gate electrodes 751, 753, 755, 757 and 735 sequentially stacked on each other in the first direction D1. Each of the first, second, fourth and fifth gate electrodes 751, 753, 757 and 735 may be disposed at one or a plurality of levels, and the third gate electrode 755 may be formed at a plurality of levels. FIGS. 3 to 6 show that the first, second, fourth and fifth gate electrodes 751, 753, 757 and 735 are disposed at one level, one level, three levels and one level, respectively, however, the present inventive concept might not be limited thereto.

In some example embodiments of the present inventive concept, the first gate electrode 751 may serve as a ground selection line (GSL), and the third gate electrode 755 may serve as a word line. Further, the fifth gate electrode 735 may serve as a string selection line (SSL). Each of the second and fourth gate electrodes 753 and 757 may be a GIDL gate electrode, which may be used for erasing data stored in the first memory channel structure 462 by using a gate induced drain leakage (GIDL) phenomenon.

Each of the first to fourth gate electrodes 751, 753, 755 and 757 may include a gate conductive pattern and a gate barrier pattern covering a surface of the gate conductive pattern. The gate conductive pattern may include a metal having a low resistance, e.g., tungsten, titanium, tantalum, platinum, etc., and the gate barrier pattern may include a metal nitride, e.g., titanium nitride, tantalum nitride, etc. In some example embodiments of the present inventive concept, the fifth gate electrode 735 may include, e.g., polysilicon doped with n-type impurities.

The first insulation pattern 315 may be formed between neighboring ones of the first to fourth gate electrodes 751, 753, 755 and 757 in the first direction D1, on an upper surface of an uppermost one of the fourth gate electrodes 757, and between the first gate electrode 751 and the support layer 300 or the support pattern. The first insulation pattern 315 may include an oxide, e.g., silicon oxide.

In some example embodiments of the present inventive concept, the gate electrode structure may have a staircase shape in which lengths in the second direction D2 decreases in a stepwise manner from a lowermost level toward an uppermost level in the first direction D1, and may include steps arranged in the second direction D2 on the second region II of the substrate 100. In some example embodiments of the present inventive concept, the gate electrode structure may further include steps arranged in the third direction D3 on the second region II of the substrate 100.

Hereinafter, a portion of the gate electrodes corresponding to the steps of the gate electrode structure, that is, an end portion of each of the gate electrodes that might not overlapped by upper ones of the gate electrodes may be referred to as a pad. Thus, the pad of each of the gate electrodes may be disposed on the second region II of the substrate 100. In some example embodiments of the present inventive concept, the pad of each of the first to fourth gate electrodes 751, 753, 755 and 757 may have a greater thickness than other portions of the same gate electrode including the corresponding pad.

In some example embodiments of the present inventive concept, a plurality of gate electrode structures may be spaced apart from each other in the third direction D3. The second division pattern 620, which may extend in the second direction D2 on the first and second regions I and II of the substrate 100, may be disposed between and separating the first to fourth gate electrodes 751, 753, 755 and 757 included in neighboring ones of the gate structures in the third direction D3 on the CSP 240. In some example embodiments of the present inventive concept, the second division pattern 620 may extend through the third to fifth insulating interlayers 340, 350 and 660, the first to fourth gate electrodes 751, 753, 755 and 757, the support layer 300, the first and fourth support patterns 302 and 305, and the sacrificial layer structure 290. In some example embodiments of the present inventive concept, the second division patterns 620 may be disposed at a regular distance from each other in the third direction D3.

In some example embodiments of the present inventive concept, each of the gate electrode structures separated by the second division patterns 620 and the first and second memory channel structures 462 and 820 extending through a corresponding one of the gate electrode structures may collectively form a memory block, and a plurality of memory blocks may be disposed in the third direction D3.

However, one of the memory blocks, on which the third support pattern pair is formed, might not include the first and second memory channel structures 462 and 820, and thus may be referred to as a dummy memory block. Hereinafter, ones of other memory blocks except for the dummy memory block may be referred to as an active memory block.

The first division pattern 330 may extend through the first gate electrode 751, and a plurality of first division patterns 330 may be spaced apart from each other at a regular distance from each other in the second direction D2 on the first and second regions I and II of the substrate 100.

In some example embodiments of the present inventive concept, the first division pattern 330 on the second region II of the substrate 100 may overlap the second support pattern 304 in the first direction D1, and a plurality of first division patterns 330 may be spaced apart from each other in the second direction D2 on the second support pattern 304. The first division pattern 330 on the first region I of the substrate 100 may extend in the second direction D2, and may be aligned on a straight line in the second direction D2 with the first division pattern 330 on the second region II of the substrate 100. In some example embodiments of the present inventive concept, the first division pattern 330 on the first region I of the substrate 100 in the second direction D2 may have an end portion in the second direction D2 which may overlap the fourth support pattern 305 in the first direction D1. For example, the first division pattern 330 on the first region I of the substrate 100 may overlap a portion of the fourth support pattern 305.

The third division pattern 625 may extend through the third to fifth insulating interlayers 340, 350 and 660, the first to fourth gate electrodes 751, 753, 755 and 757, the support layer 300 and the sacrificial layer structure 290. In some example embodiments of the present inventive concept, the third division patterns 625 may be spaced apart from each other in the second direction D2 on the second region II of the substrate 100, which may correspond to a layout of the second support pattern 304. An end portion of each of the third division pattern 625 in the second directions D2 may partially extend through the first division pattern 330, and thus the first division patterns 330 and the third division patterns 625 may be aligned on a straight line in the second direction D2.

In some example embodiments of the present inventive concept, the second and third division patterns 620 and 625 on the second region II of the substrate 100 may be disposed at a regular distance from each other in the third direction D3.

Each of the fourth to sixth division patterns 760, 762 and 764 may be disposed on the first region I of the substrate 100 and a portion of the second region II adjacent to the first region I of the substrate 100, and may extend through the fifth gate electrode 735 and the etch stop layer 720. In addition, each of the fourth to sixth division patterns 760, 762 and 764 may contact an upper surface of the seventh insulating interlayer 710.

In some example embodiments of the present inventive concept, the fourth division pattern 760 may overlap the second division pattern 620 in the first direction D1, and the fifth division pattern 762 may overlap an end portion of the third division pattern 625 and the first division pattern 330 in the first direction D1. Further, the sixth division pattern 764 may be disposed on a central portion in the third direction D3 between the fourth and fifth division patterns 760 and 762. In some example embodiments of the present inventive concept, each of the fourth to sixth division patterns 760, 762 and 764 may extend in the second direction D2 on the first region I of the substrate 100 and the portion of the second region II adjacent to of the first region I of the substrate 100.

The fifth gate electrodes 735 may be separated from each other in the third direction D3 by the fourth to sixth division patterns 760, 762 and 764.

Each of the first to sixth division patterns 330, 620, 625, 760, 762 and 764 may include an oxide, e.g., silicon oxide.

In an example embodiment of the present inventive concept, each of the active memory blocks may include two of the first gate electrodes 751 divided by the first and third division patterns 330 and 625 at each level, one of the second gate electrodes 753, one of the third gate electrodes 755 and one of the fourth gate electrodes at each level, and four of the fifth gate electrodes 735 divided by the fourth to sixth division patterns 625, 760, 762 and 764 at each level, however, the present inventive concept might not necessarily be limited thereto. Accordingly, in an embodiment, each of the active memory blocks may include two of the first gate electrodes 751 at each level, one of the second gate electrodes 753, one of the third gate electrodes 755 and one of the fourth gate electrodes at each level, and six of the fifth gate electrodes 735 divided by the fourth to sixth division patterns 625, 760, 762 and 764 at each level.

Figure 17:
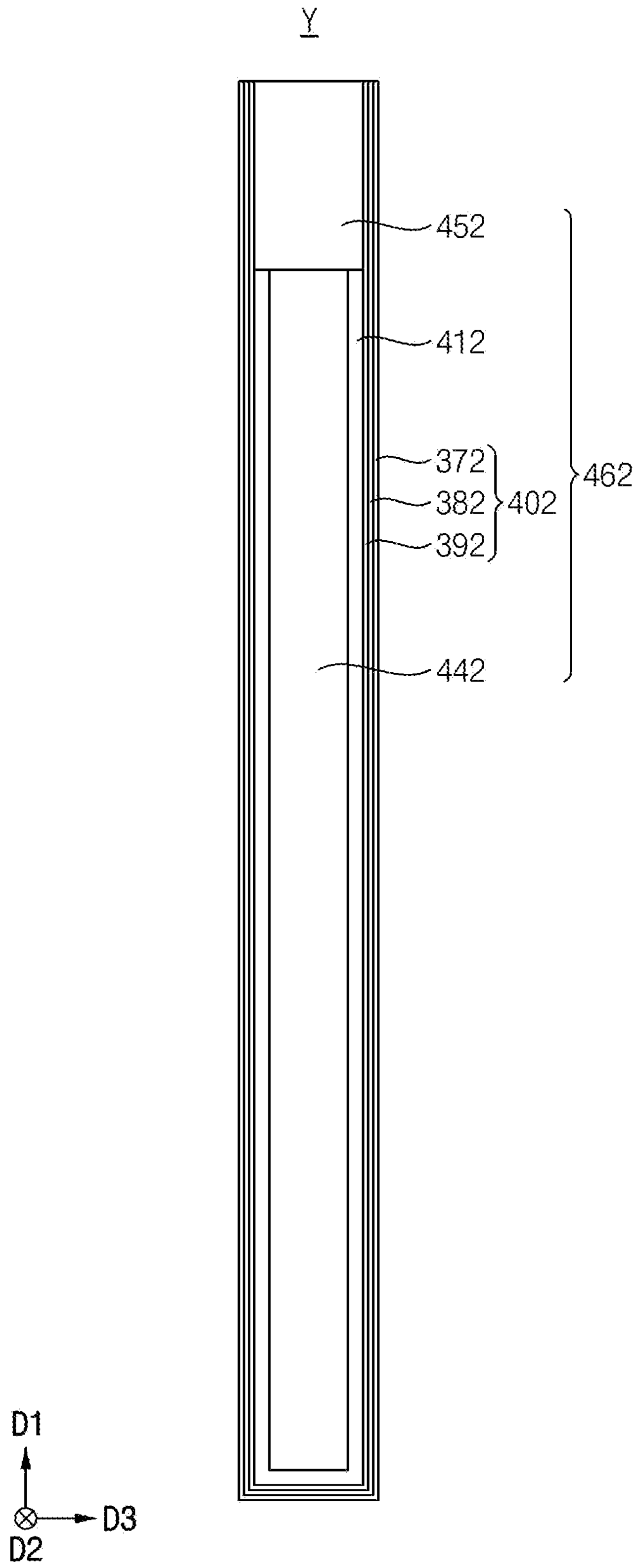
Figure 18:
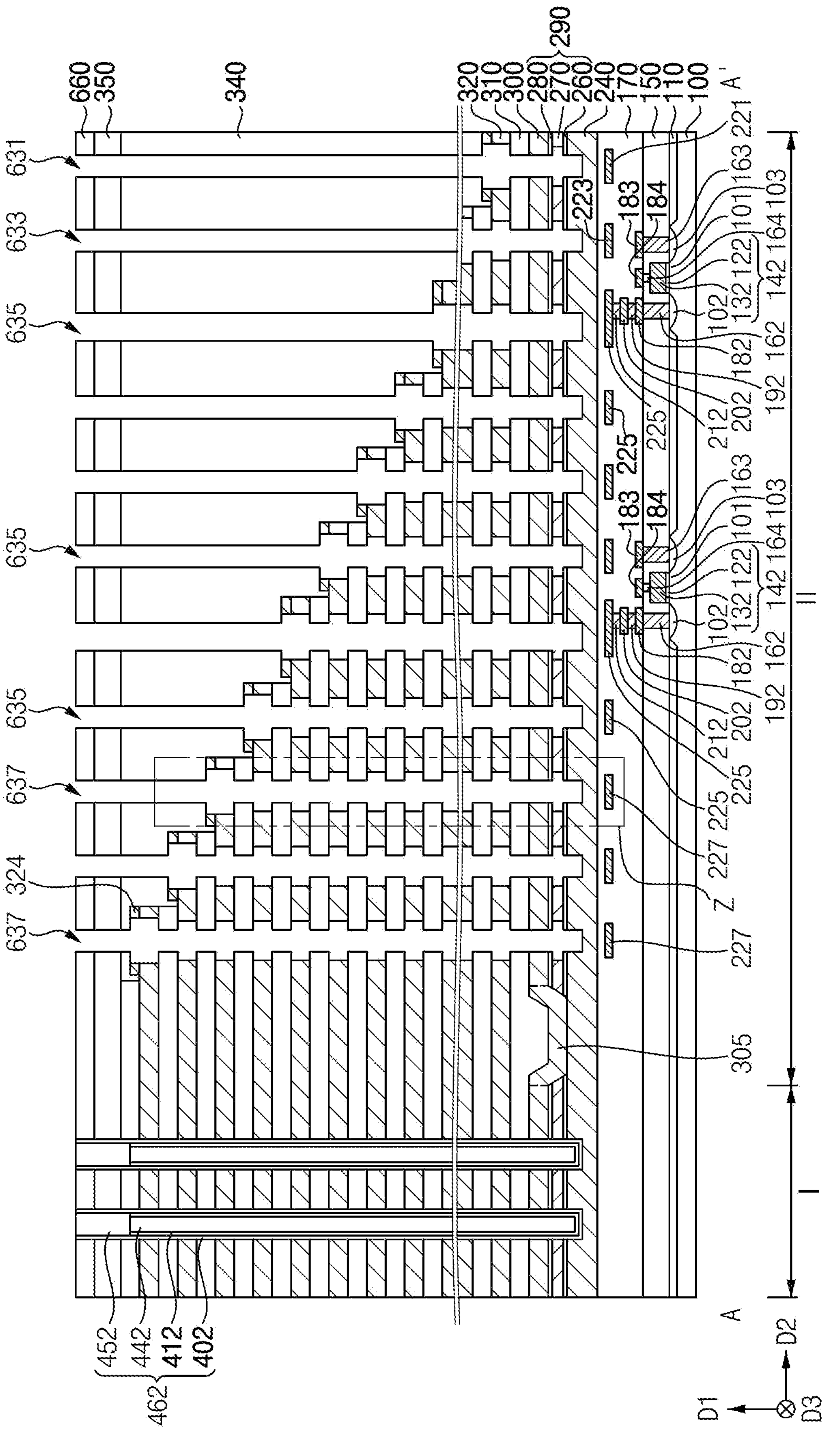
Figure 19:
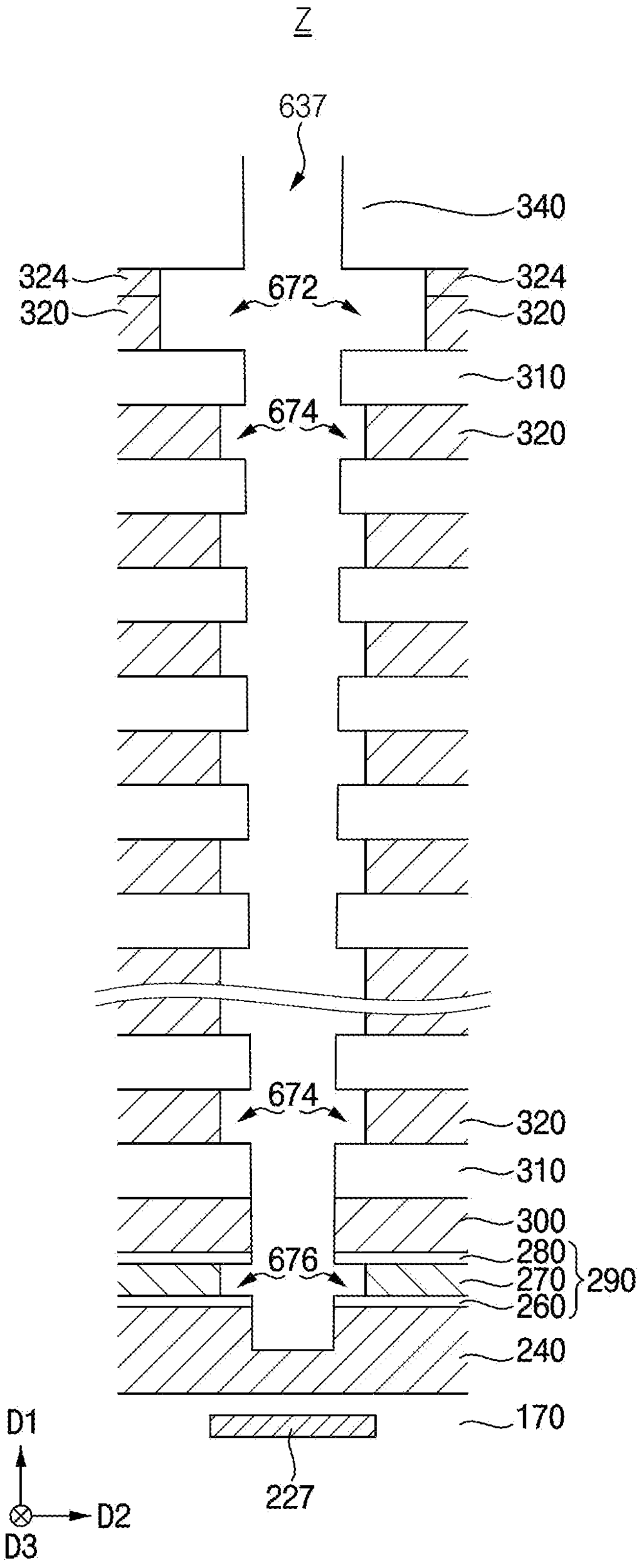
Figure 20:
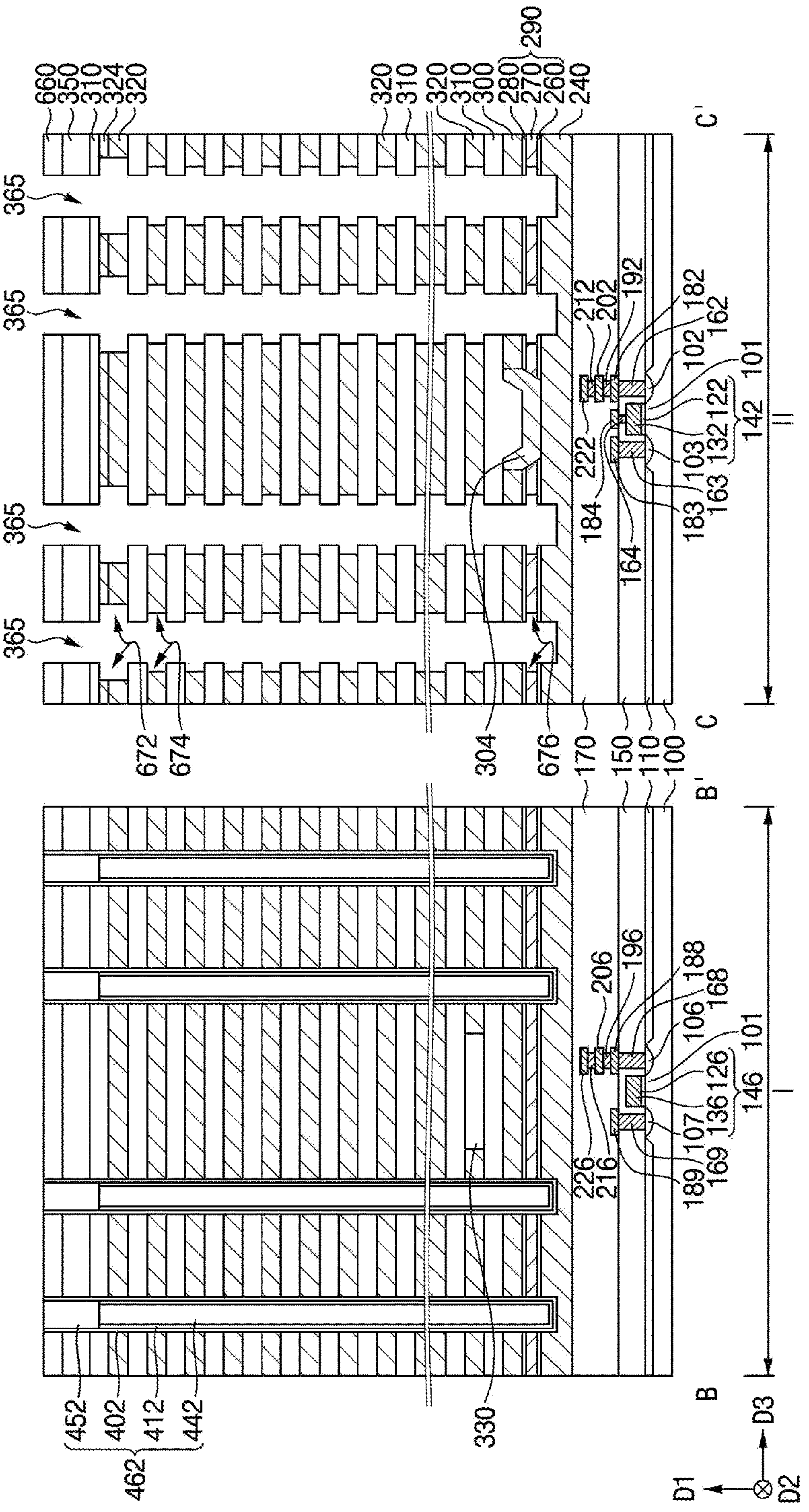

Referring to FIGS. 1 to 6 together with FIG. 17, the first memory channel structure 462 may be disposed on the first region I of the substrate 100 to contact the upper surface of the CSP 240, and may extend through the channel connection pattern 510, the support layer 300, the first to fourth gate electrodes 751, 753, 755 and 757, the first insulation pattern 315, and the third and fourth insulating interlayers 340 and 350 in each of the active memory blocks.

In some example embodiments of the present inventive concept, the first memory channel structure 462 may include a first filling pattern 442, which may extend in the first direction D1 and have a pillar or cylindrical shape, a first channel 412, which may be disposed on a sidewall of the first filling pattern 442 and have a cup shape, a first capping pattern 452 contacting upper surfaces of the first channel 412 and the first filling pattern 442, and a first charge storage structure 402 on an outer sidewall of the first channel 412 and a sidewall of the first capping pattern 452.

The first charge storage structure 402 may include a first tunnel insulation pattern 392, a first charge storage pattern 382 and a first blocking pattern 372 sequentially stacked in the horizontal direction from the outer sidewall of the first channel 412.

In some example embodiments of the present inventive concept, a plurality of first memory channel structures 462 may be spaced apart from each other in the second and third directions D2 and D3 in each of the active memory blocks on the first region I of the substrate 100 to form a first memory channel structure array, and the plurality of first memory channel structures 462 included in the first memory channel structure array may be connected to each other by the channel connection pattern 510. For example, the first charge storage structure 402 might not be formed on a portion of the outer wall of each of the first channels 412, and the channel connection pattern 510 may contact the outer sidewall of the first channels 412 to electrically connect the first channels 412 to each other.

The first support structure 688 may be disposed on the second region II of the substrate 100, and may contact the upper surface of the CSP 240. The first support structure may extend through the sacrificial layer structure 290, the first to fourth gate electrodes 751, 753, 755 and 757, the first insulation pattern 315, and the third and fourth insulating interlayers 340 and 350. In some example embodiments of the present inventive concept, a plurality of first support structures 688 may be spaced apart from each other in the second and third directions D2 and D3 on the second region II of the substrate 100.

In some example embodiments of the present inventive concept, the first support structure 688 may have a pillar or cylindrical shape extending in the first direction D1, and may include a plurality of protrusions spaced apart from each other in the first direction D1 and extending from a sidewall of the support structure 688. The protrusions may protrude in the horizontal direction. The plurality of protrusions of the first support structure 688 may be disposed on portions of the sidewall that may face the first to fourth gate electrodes 751, 753, 755 and 757, respectively. In some example embodiments of the present inventive concept, a width in the horizontal direction of one of the protrusions at an uppermost level may be greater than widths in the horizontal direction of other ones of the protrusions at other lower levels. The first support structure 688 may include an oxide, e.g., silicon oxide. For example, a width in the horizontal direction of an uppermost protrusion of the plurality of protrusions may larger than widths of the protrusions, of the plurality of protrusions, which are below the uppermost protrusion.

The second support structure 689 may be disposed in the dummy memory block on the first region I of the substrate 100 and may contact the upper surface of the CSP 240. The second support structure 689 may extend through the third support pattern 306, the first to fourth gate electrodes 751, 753, 755 and 757, the first insulation pattern 315, and the third and fourth insulating interlayers 340 and 350. In some example embodiments of the present inventive concept, the second support structure 689 may extend through each of the third support patterns 306 on the first region I of the substrate 100, and a plurality of second support structures 689 may be spaced apart from each other in the second direction D2.

In some example embodiments of the present inventive concept, the second support structure 689 may have a shape substantially the same as or similar to a shape of the first support structure 688. Accordingly, the second support structure 689 may have a pillar shape or cylindrical shape extending in the first direction D1. The second support structure 689 may include a plurality of protrusions protruding in the horizontal direction from the second support structure 689 and may be spaced apart from each other in the first direction D1 on a sidewall of the second support structure 689. The plurality of protrusions of the second support structure 689 may be disposed on portions of the sidewall that may face the first to fourth gate electrodes 751, 753, 755 and 757, respectively. In some example embodiments of the present inventive concept, a width in the horizontal direction of one of the protrusions at an uppermost level may be greater than widths in the horizontal direction of other ones of the protrusions at other lower levels. For example, a width in the horizontal direction of an uppermost protrusion of the plurality of protrusions may larger than widths of the protrusions, of the plurality of protrusions, which are below the uppermost protrusion. The second support structure 689 may include an oxide, e.g., silicon oxide.

In some example embodiments of the present inventive concept, upper surfaces of the first memory channel structure 462, the first and second support structures 688 and 689, and the second and third division patterns 620 and 625 may be substantially coplanar with each other.

The second memory channel structure 820 may include a second filling pattern 800, a second channel 790, a second charge storage structure 780 and a second capping pattern 810, which may correspond to the first memory channel structure 462. In some example embodiments of the present inventive concept, the second memory channel structure 820 may extend through the seventh insulating interlayer 710, the etch stop layer 720, the fifth gate electrode 735 and the ninth insulating interlayer 752, and at least partially contact an upper surface of the first memory channel structure 462.

In some example embodiments of the present inventive concept, the second channel 790 may include a lower portion, a central portion, and an upper portion. The lower portion of the second channel 790 may extend through the seventh insulating interlayer 710 and may have a first width. A central portion of the second channel 790 may extend through the etch stop layer 720 and may have a second width. An upper portion of the second channel 790 may extend through the fifth gate electrode 735 and the ninth insulating interlayer 752 and may have a third width. Each of the first and third widths may be greater than the second width. The upper portion of the second channel 790 may have a cup shape or a "U" shape, and the second filling pattern 800 may fill a space formed by the upper portion of the second channel 790.

The second charge storage structure 780 may extend through the fifth gate electrode 735 and the ninth insulating interlayer 752, and may cover a sidewall and a lower surface of an edge portion of the upper portion of the second channel 790. The second charge storage structure 780 may cover a sidewall of the second capping pattern 810. The second charge storage structure 780 may include a second tunnel insulation pattern, a second charge storage pattern and a third blocking pattern sequentially stacked in the horizontal direction from an outer sidewall of the second channel 790, which may correspond to the first charge storage structure 402.

The second capping pattern 810 may contact upper surfaces of the upper portion of the second channel 790 and the second filling pattern 800, and may also contact an inner sidewall of the second charge storage structure 780.

In some example embodiments of the present inventive concept, the second memory channel structure 820 may contact each of the first memory channel structures 462, so that a plurality of second memory channel structures 820 may be spaced apart from each other in the second and third directions D2 and D3 in each of the active memory blocks on the first region I of the substrate 100 to form a second memory channel structure array.

The first and second channels 412 and 790 may include, e.g., undoped polysilicon. The first and second filling patterns 442 and 800 may include an oxide, e.g., silicon oxide, and the first and second capping patterns 452 and 810 may include, e.g., polysilicon doped with impurities.

The first tunnel insulation pattern 392 and the second tunnel insulation pattern may include an oxide, e.g., silicon oxide. The first charge storage pattern 382 and the second charge storage pattern may include a nitride, e.g., silicon nitride, and the first blocking pattern 372 and the third blocking pattern may include an oxide, e.g., silicon oxide.

The second blocking pattern 615 may cover upper and lower surfaces of each of the first to fourth gate electrodes 751, 753, 755 and 757, and a sidewall of each of the first to fourth gate electrodes 751, 753, 755 and 757 that may face the first memory channel structure 462, the first and second support structures 688 and 689, and the first to fifth upper contact plugs 851, 853, 855, 857 and 859. The second blocking pattern 615 may include a metal oxide, e.g., aluminum oxide or hafnium oxide.

The third insulating interlayer 340 may be disposed on the support layer 300, and may cover sidewalls of the first to fourth gate electrodes 751, 753, 755 and 757. The third insulating interlayer 340 may be disposed on the first insulation pattern 315. The fourth insulating interlayer 350 may be disposed on the third insulating interlayer 340 and the first insulation pattern 315.

The fifth insulating interlayer 660, the seventh insulating interlayer 710 and the etch stop layer 720 may be sequentially stacked on the fourth insulating interlayer 350, and the eighth insulating interlayer 750 may be disposed on the etch stop layer 720 and may cover a sidewall of the fifth gate electrode 735. For example, the eighth insulating interlayer 750 may be disposed on a portion of the second region II of the substrate 100 except for a portion thereof adjacent to the first region I of the substrate 100, and may also be disposed in an area in which the dummy memory block is formed on the first region I of the substrate 100. For example, the eighth insulating interlayer 750 might not cover an entirety of the second region II of the substrate 100.

The ninth insulating interlayer 752 may be disposed on the eighth insulating interlayer 750 and the fifth gate electrode 735, and the tenth to twelfth insulating interlayers 860, 880 and 900 may be sequentially stacked on the ninth insulating interlayer 752.

Each of the first to fifth insulating interlayers 150, 170, 340, 350 and 660, each of the eighth to twelfth insulating interlayers 750, 752, 860, 880 and 900, and the etch stop layer 720 may include an oxide, e.g., silicon oxide, and the seventh insulating interlayer 710 may include a nitride, e.g., silicon nitride.

Each of the first to fifth upper contact plugs 851, 853, 855, 857 and 859 may include a lower portion extending through the third to fifth insulating interlayers 340, 350 and 660, the gate electrode structure, the first insulation pattern 315, the sacrificial layer structure 290, the CSP 240 and an upper portion of the second insulating interlayer 170 to contact an upper surface of a corresponding one of the tenth, eleventh, eighth, twelfth, and ninth lower wirings 221, 223, 225, 227 and 226. In addition, each of the first to fifth upper contact plugs 851, 853, 855, 857 and 859 may include an upper portion that is disposed on the lower portion and that extends through the seventh insulating interlayer 710, the etch stop layer 720 and the eighth and ninth insulating interlayers 750 and 752. In some example embodiments of the present inventive concept, each of the upper and lower portions of the first to fifth upper contact plugs 851, 853, 855, 857 and 859 may have a width gradually increasing from a bottom to a top thereof in the first direction D1. In some example embodiments of the present inventive concept, an upper surface of the lower portion may have an area greater than an area of a lower surface of the upper portion. In some example embodiments of the present inventive concept, an upper surface of the upper portion may have an area greater than an area of a lower surface of the lower portion.

Each of the first to fourth upper contact plugs 851, 853, 855 and 857 may be disposed on the second region II of the substrate 100, and the fifth upper contact plug 859 may be disposed on the first region I of the substrate 100 in the dummy memory block.

In some example embodiments of the present inventive concept, the first upper contact plug 851 may extend through a pad of the first gate electrode 751, and the second upper contact plug 853 may extend through a pad of the second gate electrode 753 and the first gate electrode 751. The third upper contact plug 855 may extend through a pad of one of the third gate electrodes 755, other ones of the third gate electrodes at lower levels if any are present, respectively, and the first and second gate electrodes 751 and 753. The fourth upper contact plug 857 may extend through a pad of one of the fourth gate electrodes 757, other ones of the fourth gate electrodes at lower levels if any are present, respectively, and the first to third gate electrodes 751, 753 and 755. The fifth upper contact plug 859 may extend through the first to fourth gate electrodes 751, 753, 755 and 757.

In some example embodiments of the present inventive concept, the fourth insulation pattern 686 may be disposed on a portion of a sidewall of each of the first to fifth upper contact plugs 851, 853, 855, 857 and 859, which may face each of the first to fourth gate electrodes 751, 753, 755 and 757, and the fifth insulation pattern 687 may be disposed on a portion of the sidewall of each of the first to fifth upper contact plugs 851, 853, 855, 857 and 859, which may face the second sacrificial layer 270 that is included in the sacrificial layer structure 290. However, the fourth insulation pattern 686 might not be formed on a portion of the sidewall of each of the first to fourth upper contact plugs 851, 853, 855 and 857 that may face one of the first to fourth gate electrodes 751, 753, 755 and 757 of which a pad is being penetrated by a corresponding one of the first to fourth upper contact plugs 851, 853, 855 and 857. For example, the fourth insulation pattern 686 might not be formed on a portion of the sidewall of each of the first to fourth upper contact plugs 851, 853, 855 and 857 that may face an uppermost one of the first to fourth gate electrodes 751, 753, 755 and 757 among the first to fourth gate electrodes 751, 753, 755 and 757 through which a corresponding one of the first to fourth upper contact plugs 851, 853, 855 and 857 extends.

In some example embodiments of the present inventive concept, each of the first to fourth upper contact plugs 851, 853, 855 and 857 may include a protrusion protruding in the horizontal direction from the portion of the sidewall facing the uppermost one of the first to fourth gate electrodes 751, 753, 755 and 757, and the protrusion may directly contact the uppermost one of the first to fourth gate electrodes 751, 753, 755 and 757.

Each of the fourth and fifth insulation patterns 686 and 687 may include, for example, an oxide such as silicon oxide.

The sixth upper contact plug 858 may extend through the ninth insulating interlayer 752, and contact an upper surface of the fifth gate electrode 735.

In some example embodiments of the present inventive concept, upper surfaces of the first to sixth upper contact plugs 851, 853, 855, 857, 859 and 858 may be substantially coplanar with each other.

Each of the seventh contact plugs 870 may extend through the tenth insulating interlayer 860, and contact an upper surface of a corresponding one of the first to sixth upper contact plugs 851, 853, 855, 857, 859 and 858 and the second memory channel structure 820. Each of upper vias 890 may extend through the eleventh insulating interlayer 880, and contact an upper surface of a corresponding one of the seventh contact plugs 870. Each of the upper wirings 910 may extend through the twelfth insulating interlayer 900, and contact an upper surface of a corresponding one of the upper vias 890.

In some example embodiments of the present inventive concept, each of ones of the upper wirings 910 may extend in the third direction D3 and serve as a bit line, and the upper wirings 910 may be spaced apart from each other in the second direction D2.

The upper wirings 910, the upper vias 890 and the seventh upper contact plugs 870 may be arranged in various layouts, and additional upper wirings, additional upper vias and additional upper contact plugs may be disposed at upper levels.

The first to seventh upper contact plugs 851, 853, 855, 857, 859, 858 and 870, the upper vias 890 and the upper wirings 910 may include a conductive material, e.g., metal, metal nitride, metal silicide, etc.

The semiconductor device may include the dummy memory block between the active memory blocks that may be disposed in the third direction D3, and each of the active memory blocks may include the first and second memory channel structures 412 and 820. The first memory channel structures 412 may be electrically connected to each other by the channel connection pattern 510, and thus may serve as the active memory block by receiving electrical signals through the channel connection pattern 510. For example, the channel connection pattern 510 may also be disposed on ones of the active memory blocks at opposite sides, respectively, in the third direction D3 of the dummy memory block, and thus, the semiconductor device may have an increased degree of integration when compared to a semiconductor device in which the channel connection pattern 510 is not formed in ones of the memory blocks at opposite sides, respectively, of the dummy memory block so that the ones of the memory blocks might not serve as active memory blocks.

The fifth contact plug 859 may extend through the gate electrode structure to be electrically connected to the lower circuit pattern in a portion of the dummy memory block on the first region I of the substrate 100, and the fourth insulation pattern 686 may be disposed between the fifth contact plug 859 and each of the gate electrodes included in the gate electrode structure so that the fifth contact plug 859 and each of the gate electrodes may be electrically insulated from each other.

FIGS. 7 to 49 are plan views and cross-sectional views illustrating a method of manufacturing a semiconductor device. Particularly, FIGS. 7, 9, 12, 25, 30, 34, 37 and 40 are the plan views, and FIGS. 8, 10-11, 13-24, 26-29, 31-33, 35-36, 38-39 and 41-49 are the cross-sectional views.

FIGS. 8, 10-11, 13, 18-19, 43, 45-46 and 48 are cross-sectional views taken along lines A-A' of corresponding plan views, respectively. Each of FIGS. 14, 16-17, 20, 23, 26, 28, 31, 35 and 41 includes cross-sectional views taken along lines B-B' and C-C' of corresponding plan views, respectively, and FIGS. 15, 21-22, 24, 27, 29, 32-33, 36, 39, 42, 44, 47 and 49 are cross-sectional views taken along lines D-D' of corresponding plan views, respectively.

Figure 21:
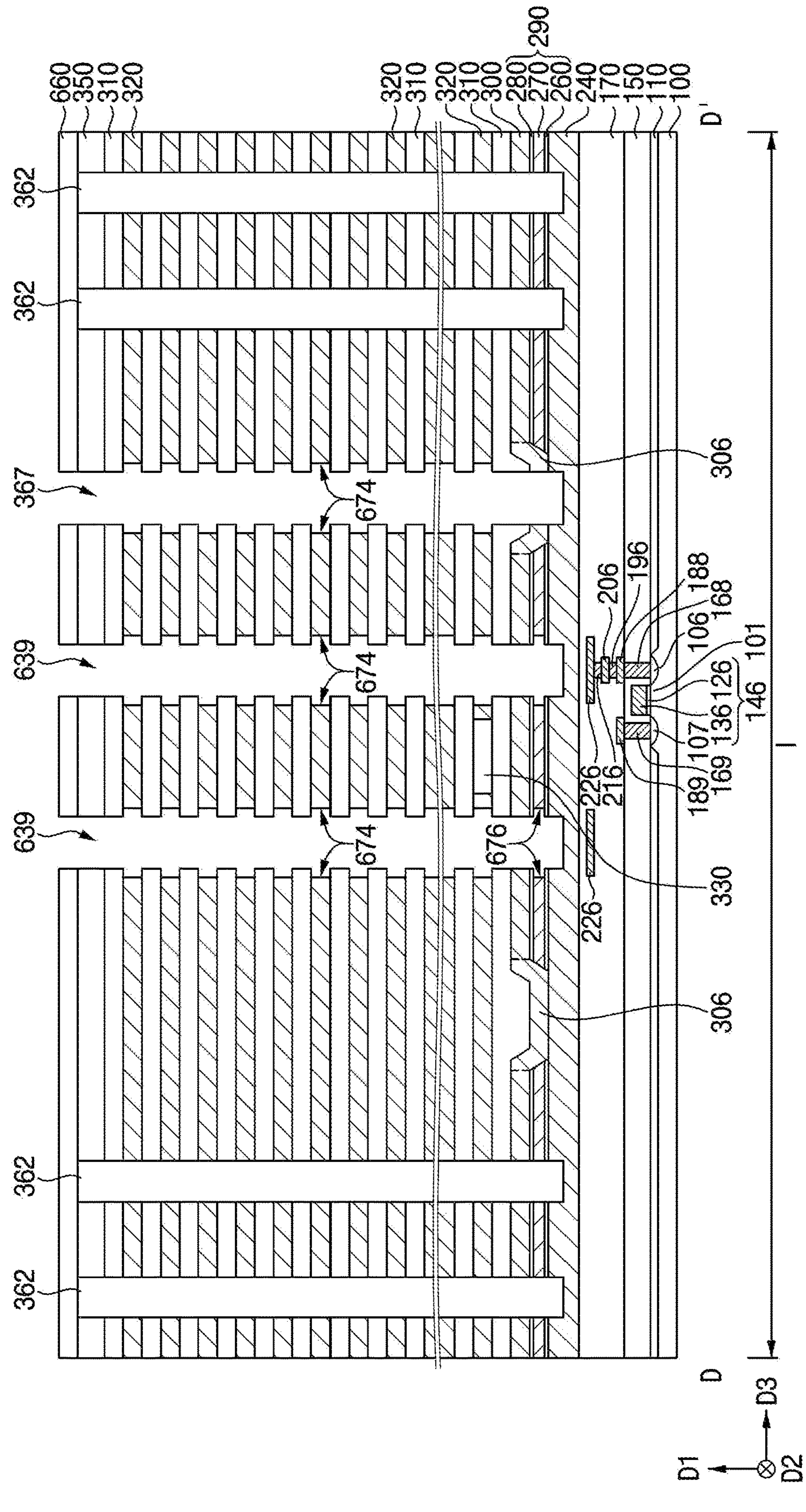
Figure 22:
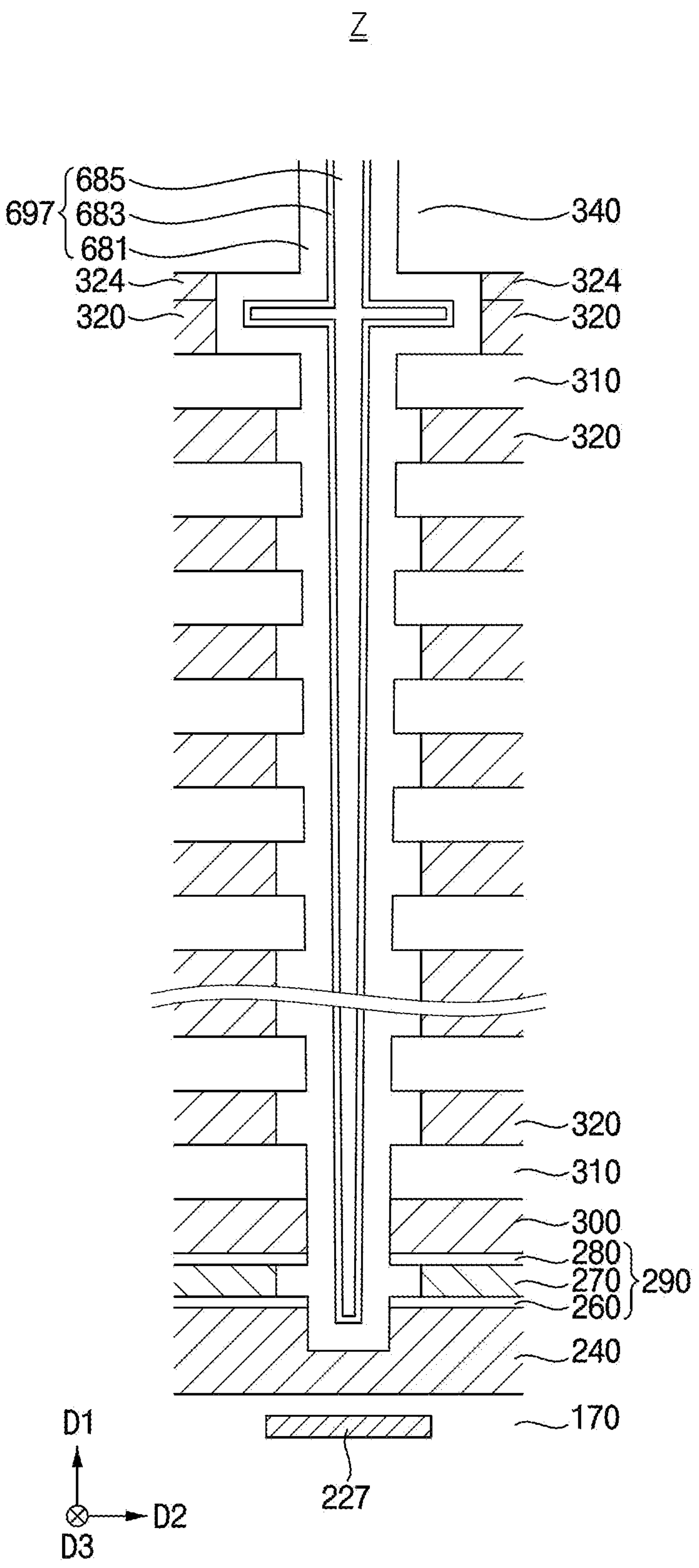

FIGS. 7 to 49 are drawings of region X of FIG. 1. FIG. 17 is an enlarged cross-sectional view of region Y of FIG. 16. FIG. 22 is an enlarged cross-sectional view of region Z of FIG. 21, and FIG. 46 is an enlarged cross-sectional view of region Z of FIG. 45.

Referring to FIGS. 7 and 8, a lower circuit pattern may be formed on a substrate 100, and first and second insulating interlayers 150 and 170 may be sequentially stacked on the substrate 100 to cover the lower circuit pattern.

Each element of the lower circuit pattern may be formed by a patterning process or a damascene process.

A CSP 240 and a sacrificial layer structure 290 may be sequentially formed on the second insulating interlayer 170. The sacrificial layer structure 290 may be partially removed to form a first opening 302 that exposes an upper surface of the CSP 240, and a support layer 300 may be formed on an upper surface of the sacrificial layer structure 290 and the exposed upper surface of the CSP 240.

The sacrificial layer structure 290 may include first, second and third sacrificial layers 260, 270 and 280 sequentially stacked on the CSP 240. Each of the first and third sacrificial layers 260 and 280 may include an oxide, e.g., silicon oxide, and the second sacrificial layer 270 may include a nitride, e.g., silicon nitride.

The support layer 300 may include a material having an etching selectivity with respect to the first to third sacrificial layers 260, 270 and 280, e.g., polysilicon doped with n-type impurities. The support layer 300 may be conformally formed, and thus, a first recess may be formed on a portion of the support layer 300 in the first opening 302. For example, the support layer 300 may be conformally formed on the sacrificial structure 290. Hereinafter, the portion of the support layer 300 in the first opening 302, which may contact the upper surface of the CSP 240, may be referred to as a support pattern.

The support pattern may have various layouts in a plan view, and include first to fourth support patterns 302, 304, 306 and 305.

A first insulation layer 310 and a fourth sacrificial layer 320 may be alternately and repeatedly stacked in the first direction D1 on the support layer 300 and the first to fourth support patterns 302, 304, 306 and 305, and thus, a mold layer including the first insulation layers 310 and the fourth sacrificial layers 320 may be formed. The first insulation layer 310 may include an oxide, e.g., silicon oxide, and the fourth sacrificial layer 320 may include a material having an etching selectivity with respect to the first insulation layer 310, e.g., a nitride such as silicon nitride.

A first division pattern 330 extending through a lowermost one of the fourth sacrificial layers 320 may be formed. In some example embodiments of the present inventive concept, a plurality of first division patterns 330 may be spaced apart from each other in the second and third directions D2 and D3 on the first and second regions I and II.

In some example embodiments of the present inventive concept, first ones of the first division patterns 330 on the second region II of the substrate 100 may overlap the second support pattern 304 in the first direction D1, and may be spaced apart from each other in the second direction D2 on the second support pattern 304. A second one of the division patterns 330 on the first region I of the substrate 100 may extend in the second direction D2, and may be aligned with the first ones of the first division patterns 330 on the second region II of the substrate 100 in the second direction D2. In some example embodiments of the present inventive concept, an end portion in the second direction D2 of the second one of the first division patterns 330 on the first region I of the substrate 100 may overlap the fourth support pattern 305 in the first direction D1.

Figure 9:
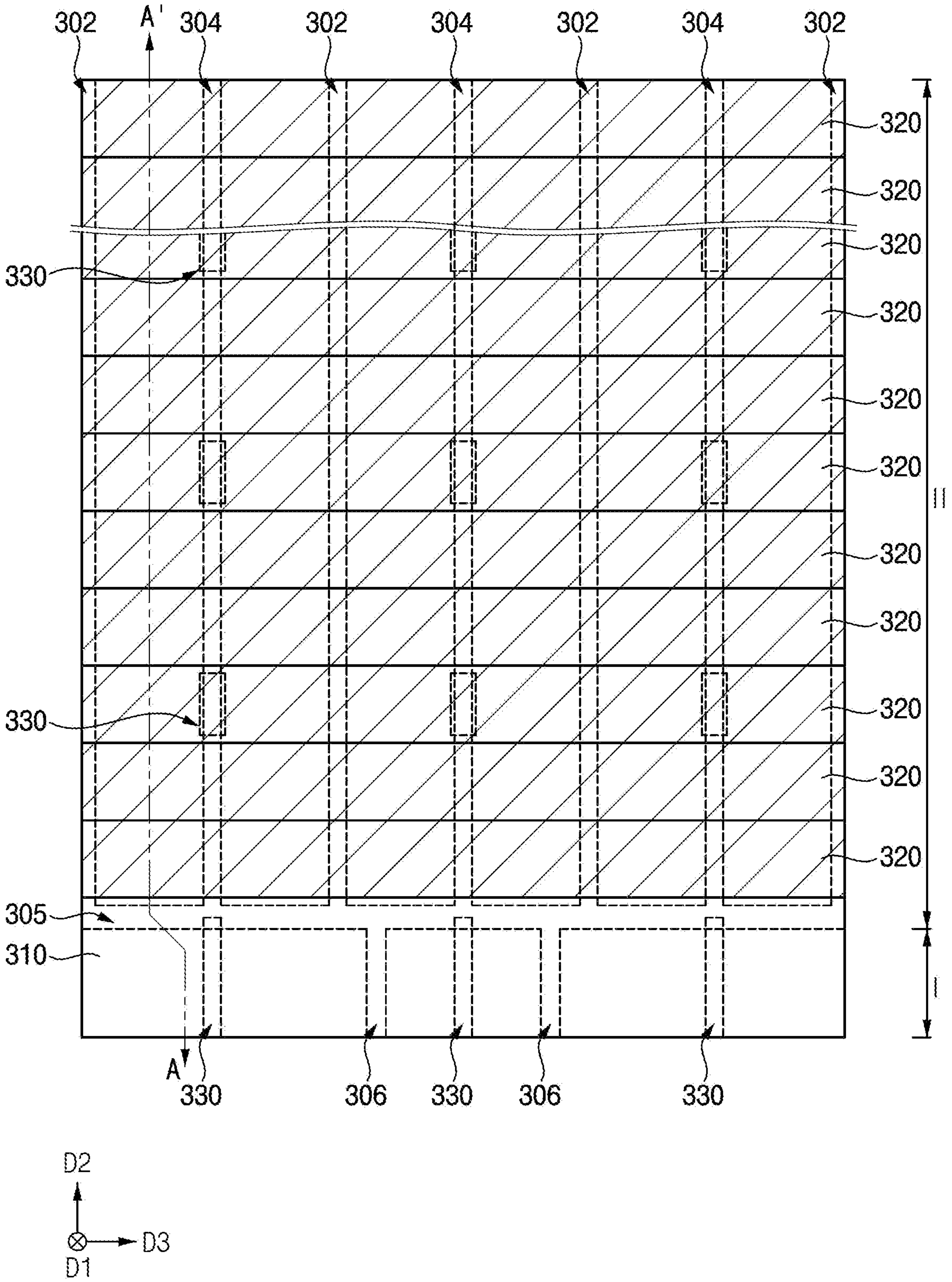
Figure 10:
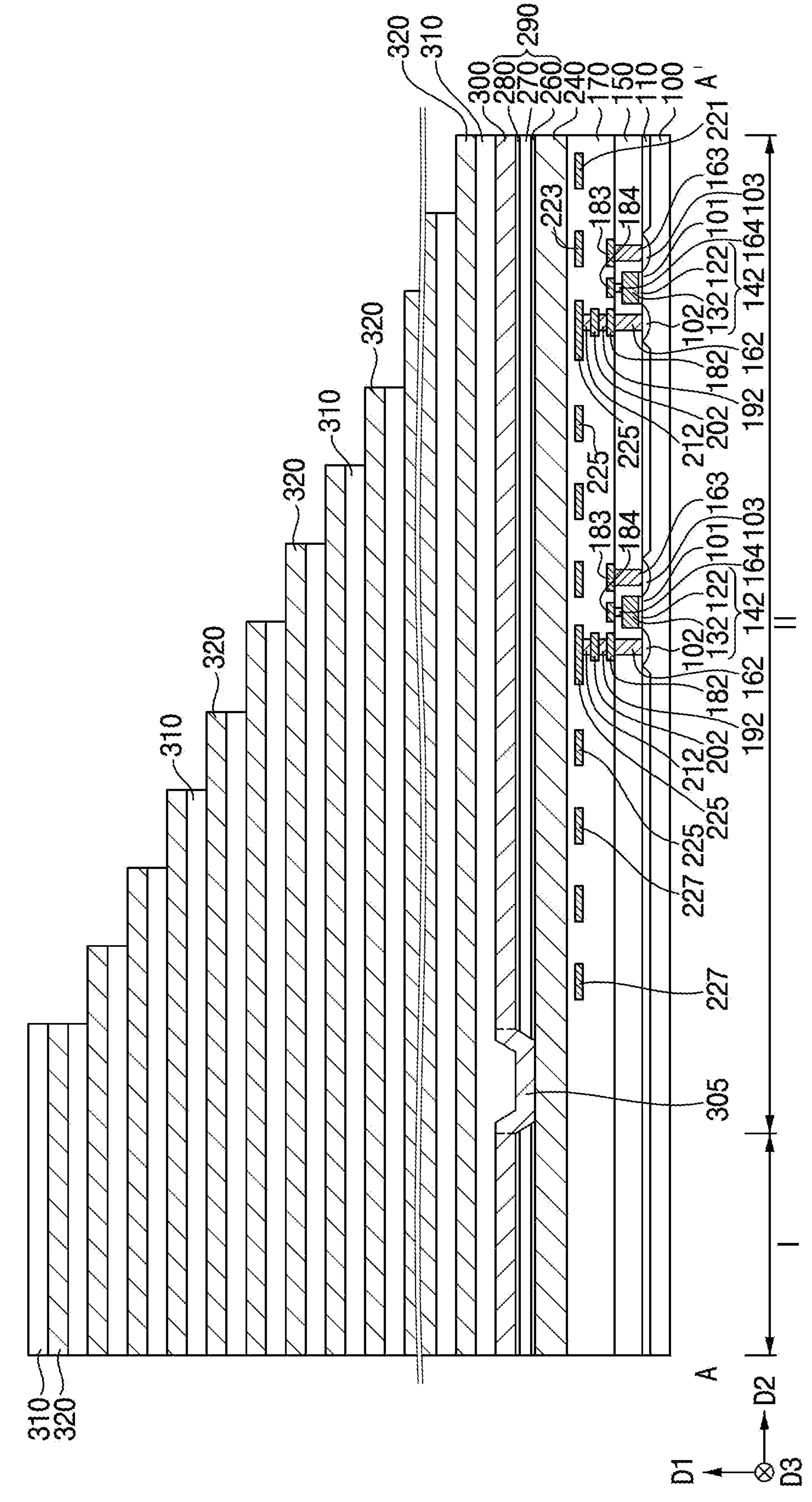

Referring to FIGS. 9 and 10, a photoresist pattern partially covering an uppermost one of the first insulation layers 310 may be formed, and the uppermost one of the first insulation layers 310 and an uppermost one of the fourth sacrificial layers 320 may be etched using the photoresist pattern as an etching mask. Thus, a portion of one of the first insulation layers 310 directly under the uppermost one of the fourth sacrificial layers 320 may be exposed.

After performing a trimming process for reducing an area of the photoresist pattern, the uppermost one of the first insulation layers 310, the uppermost one of the fourth sacrificial layers 320, the exposed one of the first insulation layers 310 and one of the fourth sacrificial layers 320 that is directly under the exposed one of the first insulation layers 310 may be etched by an etching process by using the reduced photoresist pattern as an etching mask. The trimming process and the etching process may be repeatedly performed to form a mold, which may have a staircase shape and include a plurality of step layers each of which may include one fourth sacrificial layer 320 and one first insulation layer 310 sequentially stacked.

Hereinafter, the "step layer" may refer to all portions of the fourth sacrificial layer 320 and the first insulation layer 310 at the same level, which may include an unexposed portion as well as an exposed portion of the fourth sacrificial layer 320 and the first insulation layer 310, and a "step" may refer to only the exposed portion of the "step layer." In some example embodiments of the present inventive concept, the steps may be arranged in the second direction D2. In addition, the steps may be arranged in the third direction D3.

The mold may be formed on the support layer 300 and the first to fourth support patterns 302, 304, 306 and 305 that are on the first and second regions I and II of the substrate 100, and each of the steps included in the mold may be formed on the second region II of the substrate 100.

Figure 11:
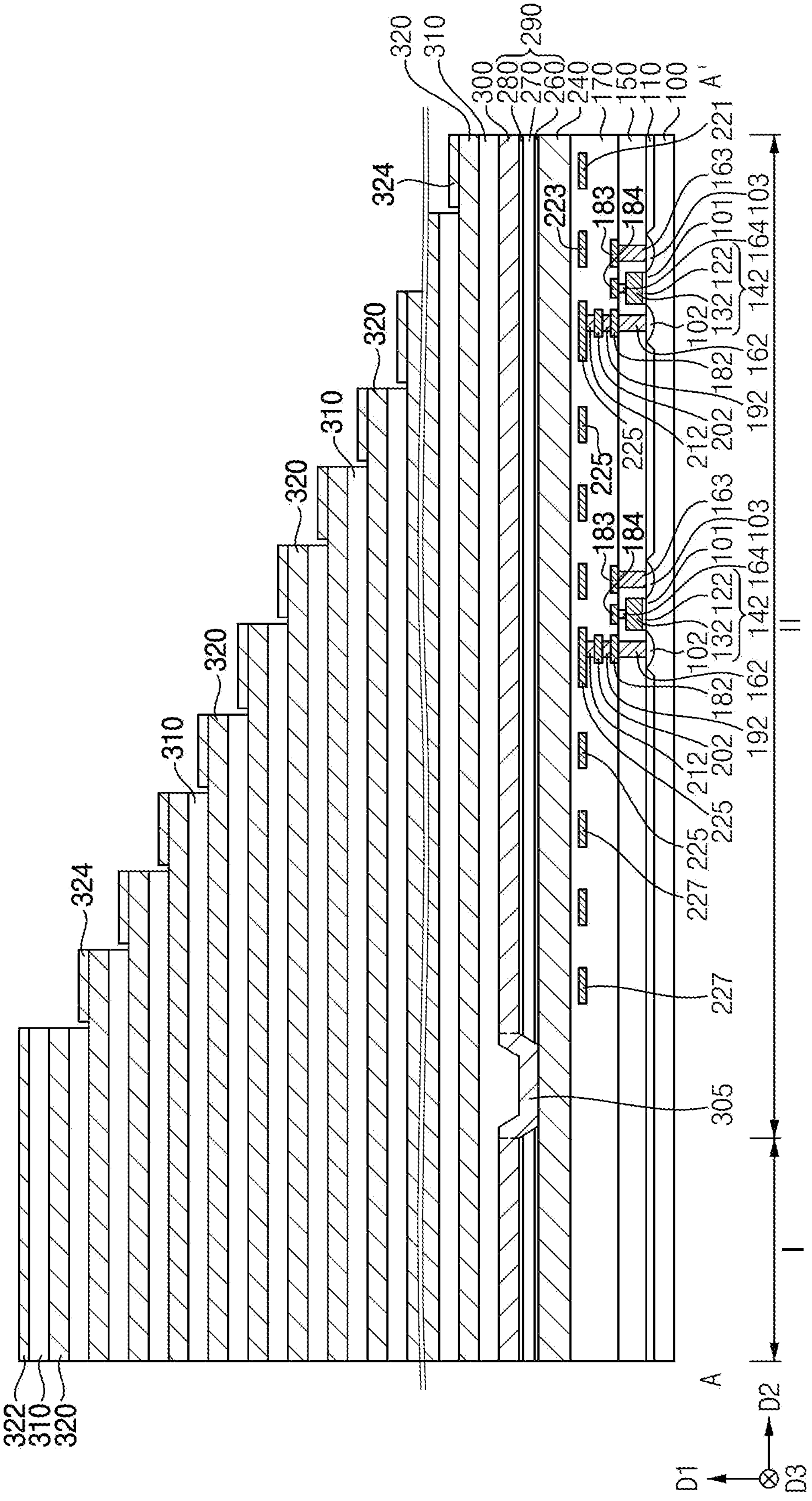
Figure 12:
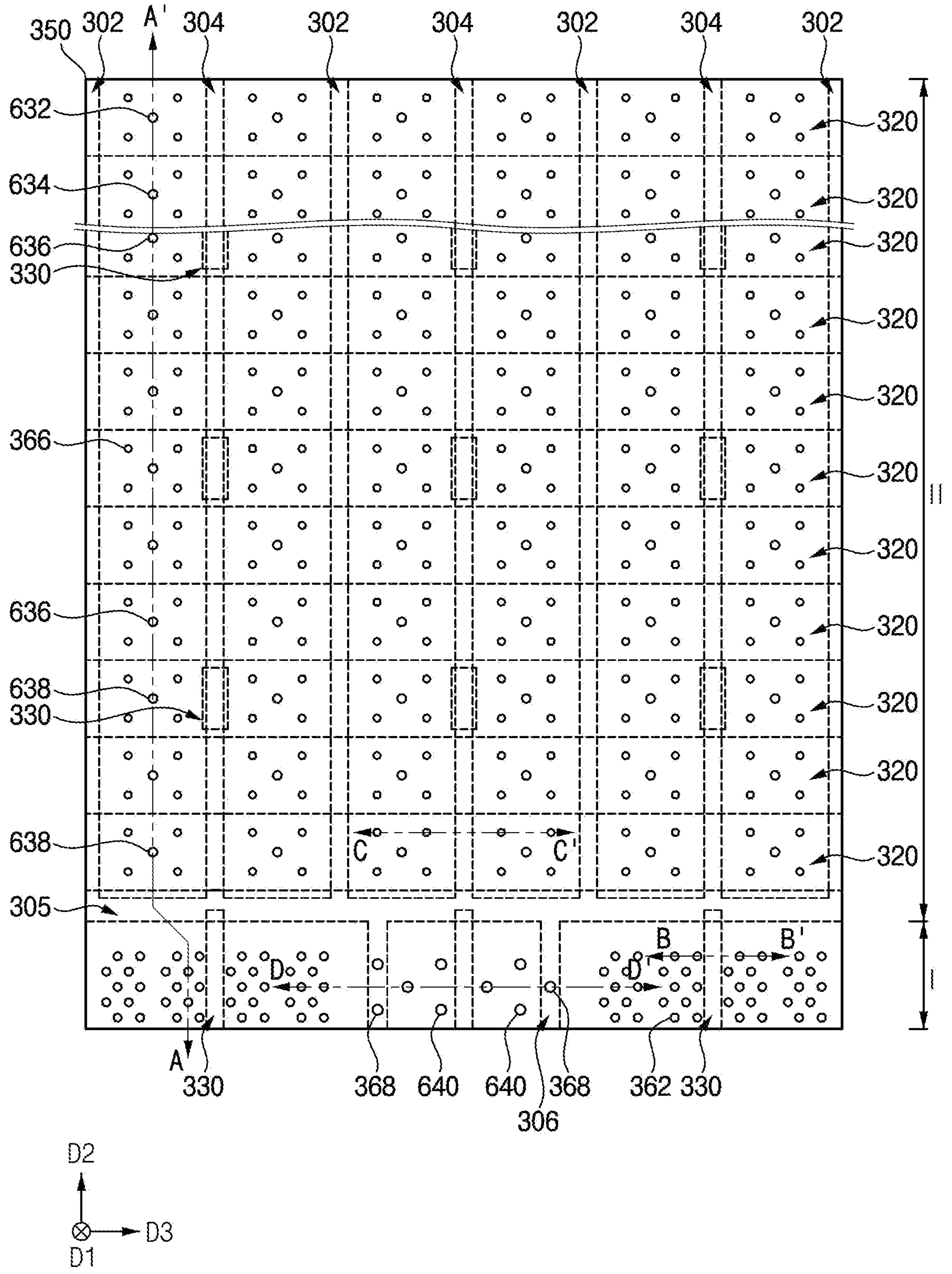
Figure 13:
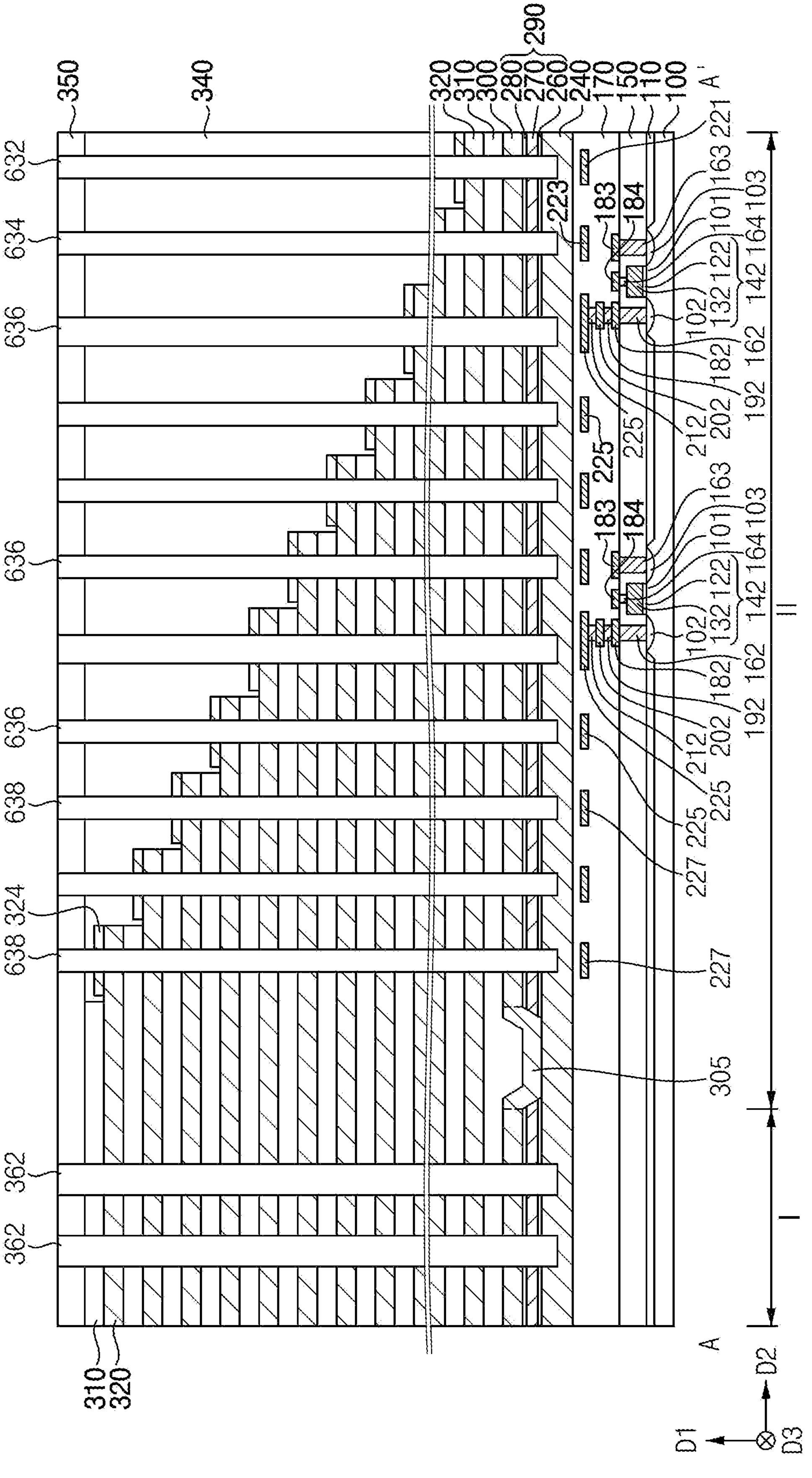
Figure 14:
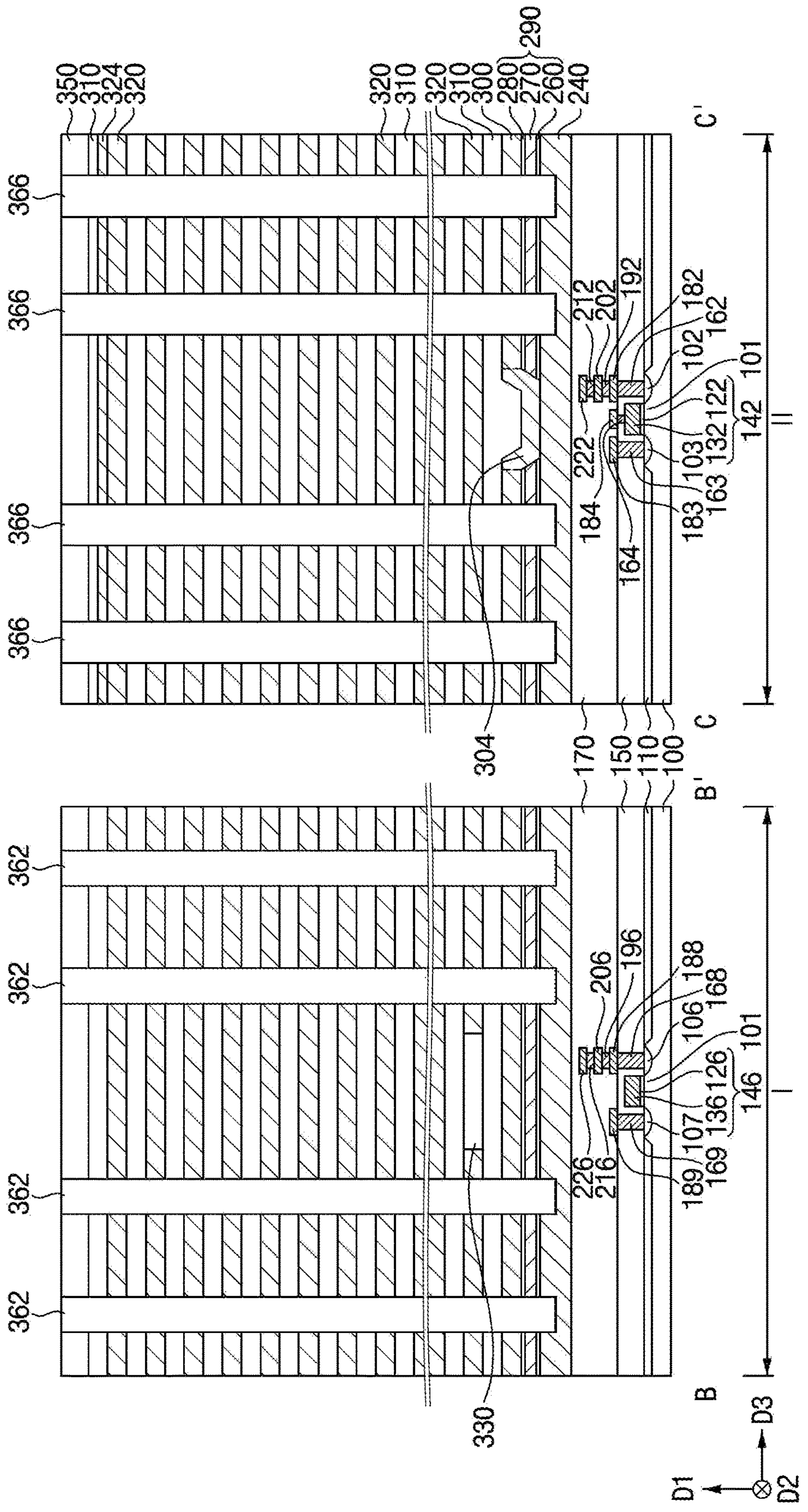
Figure 15:
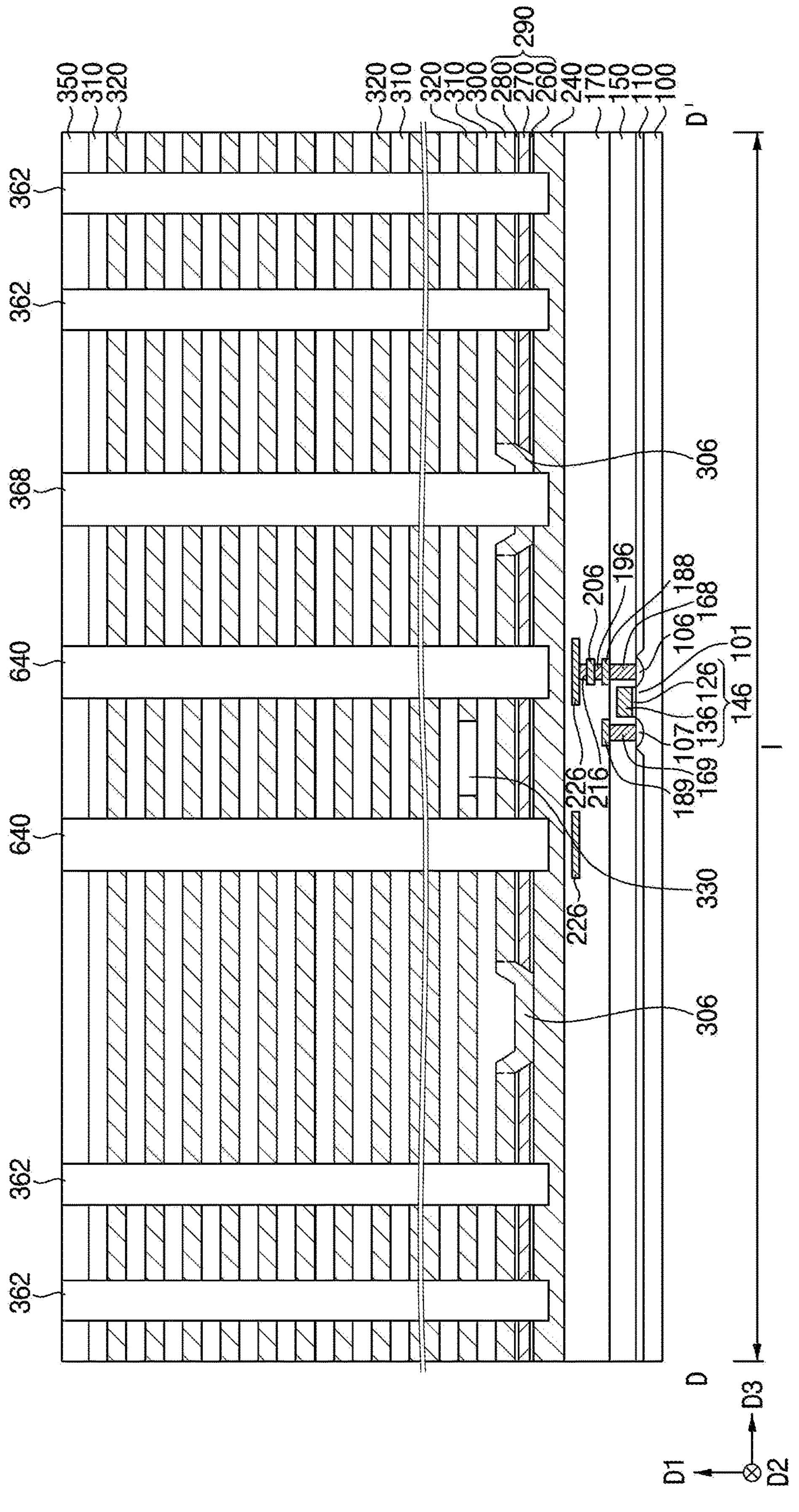

Referring to FIG. 11, an insulation pad layer may be formed, and partially removed to form first and second insulation pads 322 and 324.

In an example embodiment of the present inventive concept, the insulation pad layer may include the same material as that of the fourth sacrificial layer 320; however, the insulation pad layer may have an etching rate different from an etching rate of the fourth sacrificial layer 320.

After forming the insulation pad layer, portions of the insulation pad layer adjacent to sidewalls of the steps, respectively, of the mold may be removed to form the first insulation pad 322 on an upper surface of the uppermost one of first insulation layers 310 and to form the second insulation pad 324 on an upper surface of each of the fourth sacrificial layers 320 that may form the steps of the mold. In some example embodiments of the present inventive concept, each of the first and second insulation pads 322 and 324 may extend in the third direction D3.

Referring to FIGS. 12 to 15, a third insulating interlayer 340 may be formed on the CSP 240 and may cover the mold and the first and second insulation pads 322 and 324. The third insulating interlayer 340 may be planarized until an upper surface of one of the first insulation layers 310 on a step layer on which the second insulation pad 324 is formed is exposed.

During the planarization, the first insulation pad 322, and one of the first insulation layers 310 and one of the fourth sacrificial layers 320 included in an uppermost one of the step layers in the mold may be removed, and a sidewall of the mold may be covered by the third insulating interlayer 340.

A fourth insulating interlayer 350 may be formed on upper surfaces of the mold and the third insulating interlayer 340.

An etching process may be performed to form a first hole extending in the first direction D1 through the fourth insulating interlayer 350, the mold, the support layer 300 and the sacrificial layer structure 290 to expose an upper surface of the CSP 240 on the first region I of the substrate 100, and to form a second hole extending in the first direction D1 through the third and fourth insulating interlayers 340 and 350, a portion of the mold, the support layer 300 and the sacrificial layer structure 290 to expose the upper surface of the CSP 240 on the second region II of the substrate 100. In some example embodiments of the present inventive concept, cept, a plurality of first holes may be spaced apart from each other in the second and third directions D2 and D3 on the first region I of the substrate 100, and a plurality of second holes may be spaced apart from each other in the second and third directions D2 and D3 on the second region II of the substrate 100.

Additionally, fourth to seventh holes extending in the first direction D1 through the third and fourth insulating interlayers 340 and 350, the mold, the support layer 300 and the sacrificial layer structure 290 may be formed to expose the upper surface of the CSP 240 on the second region II of the substrate 100. In some example embodiments of the present inventive concept, each of the fourth to seventh holes may be formed in an area defined by the second holes adjacent to each other in a plan view.

A third hole extending in the first direction D1 through the fourth insulating interlayer 350, the mold and the third support pattern 306 may be formed to expose the upper surface of the CSP 240 on the first region I of the substrate 100, and an eighth hole extending in the first direction D1 through the fourth insulating interlayer 350, the mold and the sacrificial layer structure 290 may be formed to expose the upper surface of the CSP 240 on the first region I of the substrate 100.

In some example embodiments of the present inventive concept, a plurality of third holes may be spaced apart from each other in the second direction D2 through each of the third support patterns 306, and a plurality of eighth holes may be spaced apart from each other in the second and third direction D2 and D3 between the third support patterns 306 neighboring in the third direction D3.

In some example embodiments of the present inventive concept, the first to eighth holes may be simultaneously formed by a single etching process, or may be sequentially formed by independent processes. For example, the first to eighth holes may be formed individually. In some example embodiments of the present inventive concept, the etching process may be performed until each of the first to eighth holes exposes the upper surface of the CSP 240, and further, each of the first to eighth holes may extend through a portion of the upper portion of the CSP 240.

Fifth to twelfth sacrificial patterns 362, 366, 368, 632, 634, 636, 638 and 640 may be formed in the first to eighth holes, respectively.

The fifth to twelfth sacrificial patterns 362, 366, 368, 632, 634, 636, 638 and 640 may be formed by forming a fifth sacrificial layer on the CSP 240 and the fourth insulating interlayer 350 to fill the first to eighth holes, and planarizing the fifth sacrificial layer until an upper surface of the fourth insulating interlayer 350 is exposed.

In an example embodiment of the present inventive concept, the fifth sacrificial layer may have a first layer including an insulating material containing, e.g., carbon, and a second layer on the first layer including, e.g., polysilicon.

Figure 16:
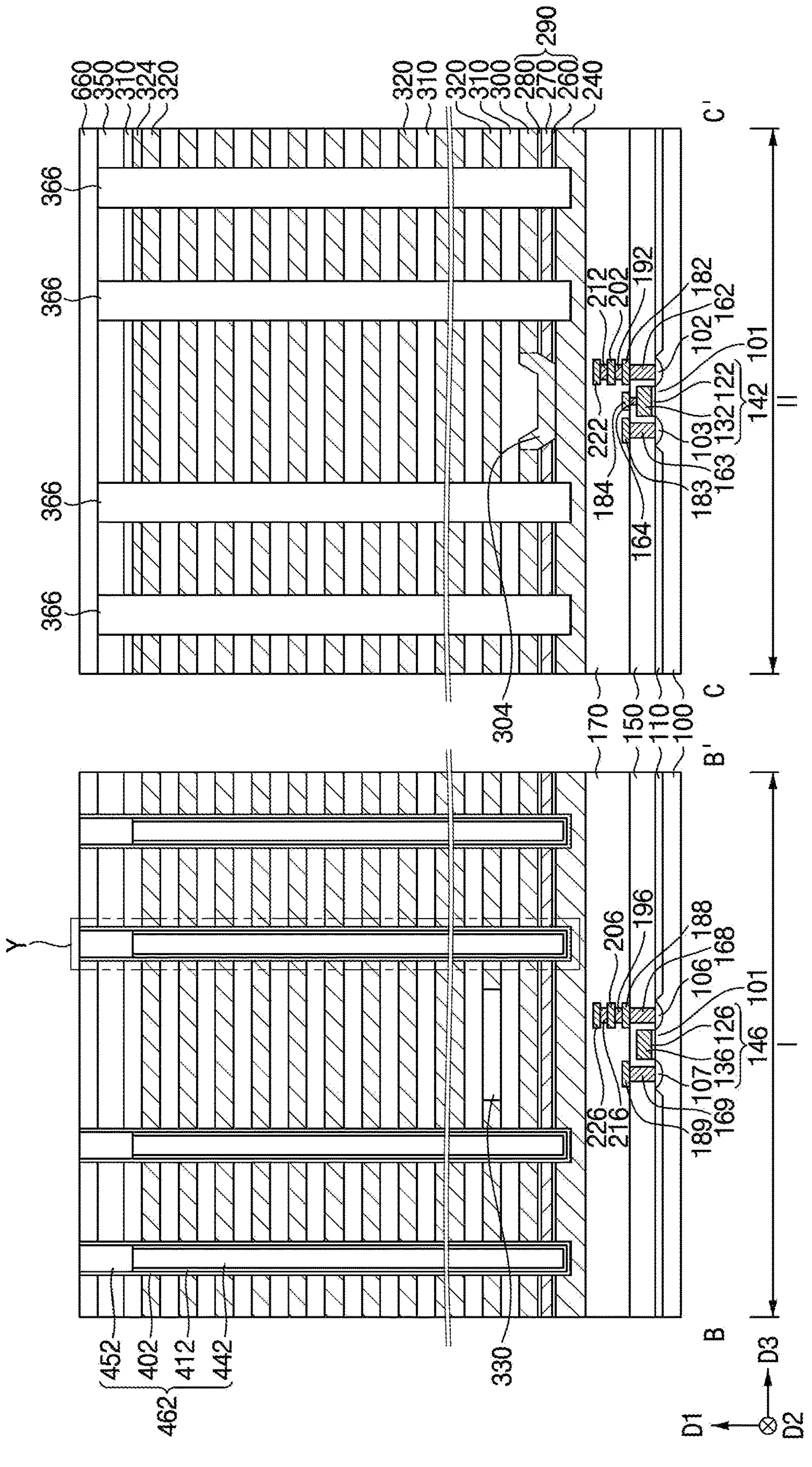

Referring to FIGS. 16 and 17, a fifth insulating interlayer 660 may be formed on the fourth insulating interlayer 350 and the fifth to twelfth sacrificial patterns 362, 366, 368, 632, 634, 636, 638 and 640. Further, the fifth insulating interlayer 980 may be patterned to expose the fifth sacrificial pattern 362 by an etching process, and the exposed fifth sacrificial pattern 362 may be removed to form the first hole again exposing the upper surface of the CSP 240.

A first charge storage structure layer and a first channel layer may sequentially be formed on a sidewall of the first hole, the exposed upper surface of the CSP 240 and an upper surface of the fifth insulating interlayer 660, and a first filling layer may be formed on the first channel layer to fill a remaining portion the first hole.

The first charge storage structure layer may include a first blocking layer, a first charge storage layer and a first tunnel insulation layer sequentially stacked on each other.

The first filling layer, the first channel layer and the first charge storage structure layer may be planarized until the upper surface of the fifth insulating interlayer 660 is exposed. Thus, a first charge storage structure 402, a first channel 412 and a first filling pattern 442 may be formed in the first hole. The first charge storage structure 402 may include a first blocking pattern 372, a first charge storage pattern 382 and a first tunnel insulation pattern 392 sequentially stacked on each other.

Upper portions of the first filling pattern 442 and the first channel 412 may be removed to form a second recess, and a first capping pattern 452 may be formed to fill the second recess.

The first charge storage structure 402, the first channel 412, the first filling pattern 442 and the first capping pattern 452 in the first hole may collectively form a first memory channel structure 462.

In some example embodiments of the present inventive concept, the first memory channel structure 462 may have a pillar shape or cylindrical shape extending in the first direction D1. In some example embodiments of the present inventive concept, a plurality of memory channel structures 462 may be spaced apart from each other in the second and third directions D2 and D3 on the first region I of the substrate 100.

Referring to FIGS. 18 to 21, the fifth insulating interlayer 660 may be patterned to expose the sixth to twelfth sacrificial patterns 366, 368, 632, 634, 636, 638 and 640 by an etching process, and the sixth to twelfth sacrificial patterns 366, 368, 632, 634, 636, 638 and 640 may be removed to form the second to eighth holes again exposing the upper surface of the CSP 240.

An additional etching process may be performed on portions of the fourth sacrificial layers 320 that are adjacent to each of the second to eighth holes to form third and fourth recesses 672 and 674, and during the additional etching process, a portion of the second sacrificial layer 270 that is adjacent to each of the second to eighth holes may also be removed to form a fifth recess 676.

In some example embodiments of the present inventive concept, during the formation of the third recess 672, not only a portion of the fourth sacrificial layer 320 but also the second insulation pad 324, which may be formed on the fourth sacrificial layer 320 and include substantially the same material as the fourth sacrificial layer 320, may be removed, and thus, the third recess 672 may have a width in the horizontal direction greater than a width of the second recess 674 in the horizontal direction.

Figure 23:
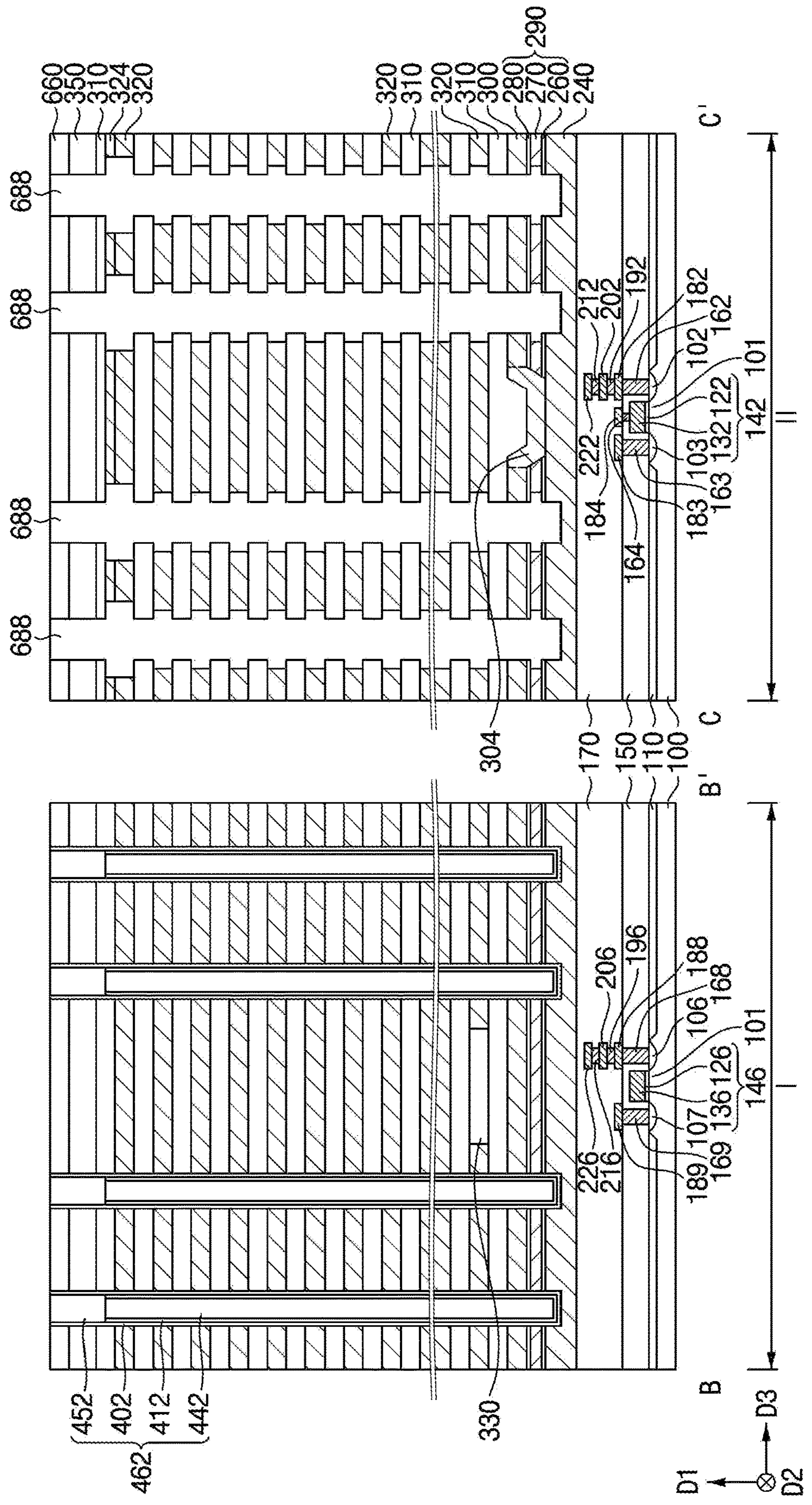
Figure 24:
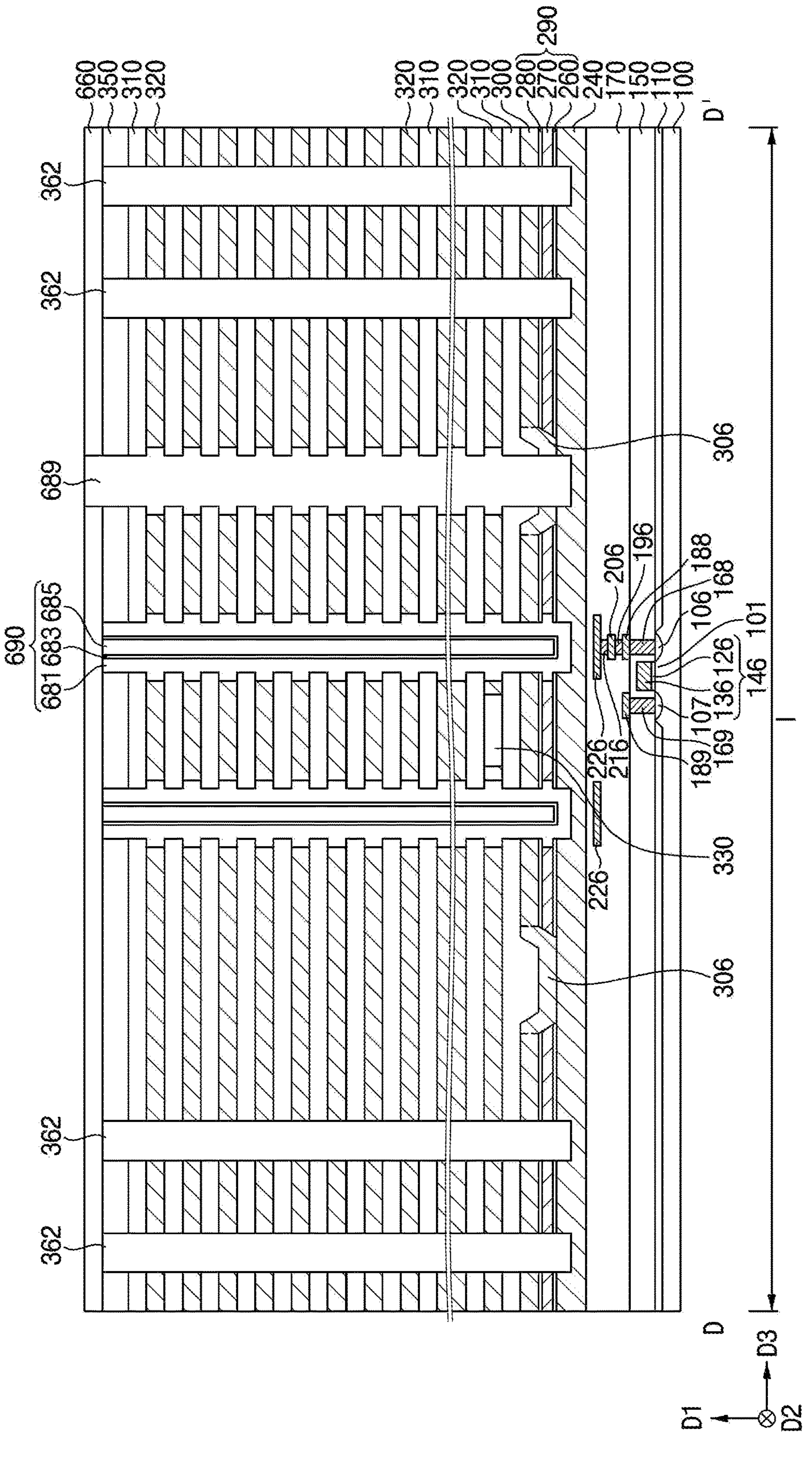

Referring to FIGS. 22 to 24, a second insulation layer may be formed on inner walls of the second to eighth holes and the third to fifth recesses 672, 674 and 676 and the upper surface of the fifth insulating interlayer 660 to fill the fourth and fifth recesses 674 and 676. In addition, a sacrificial liner layer may be formed on the second insulation layer, and a sixth sacrificial layer may be formed on the sacrificial liner layer to fill a remaining portion of the second to eighth holes. Further, the sixth sacrificial layer, the sacrificial liner layer and the second insulation layer may be planarized until the upper surface of the fifth insulating interlayer 660 is exposed.

In some example embodiments of the present inventive concept, the second insulation layer may include an oxide, e.g., silicon oxide, and the sacrificial liner layer may include an insulating nitride, e.g., silicon nitride, and the sixth sacrificial layer may include, e.g., polysilicon.

By the planarization process, a sacrificial pillar including a second insulation pattern 681, a sacrificial liner 683 and a thirteenth sacrificial pattern 685 may be formed in each of the second to eighth holes. For example, first and second sacrificial pillars and third to seventh sacrificial pillars 691, 693, 695, 697 and 690 may be formed in the second to eighth holes, respectively.

After removing the sacrificial liner 683 and the thirteenth sacrificial pattern 685 included in each of the first and second sacrificial pillars, a third insulation pattern may be formed to fill a remaining portion of each of the second and third holes. The third insulation pattern may include substantially the same material as that of the second insulation pattern 681, for example, an oxide such as silicon oxide, and may be merged with the second insulation pattern 681.

Hereinafter, the second insulation pattern 681 and the third insulation pattern in the second hole may be collectively referred to as a first support structure 688, and the second insulation pattern 681 and the third insulation pattern in the third hole may be collectively referred to as a second support structure 689.

Figure 25:
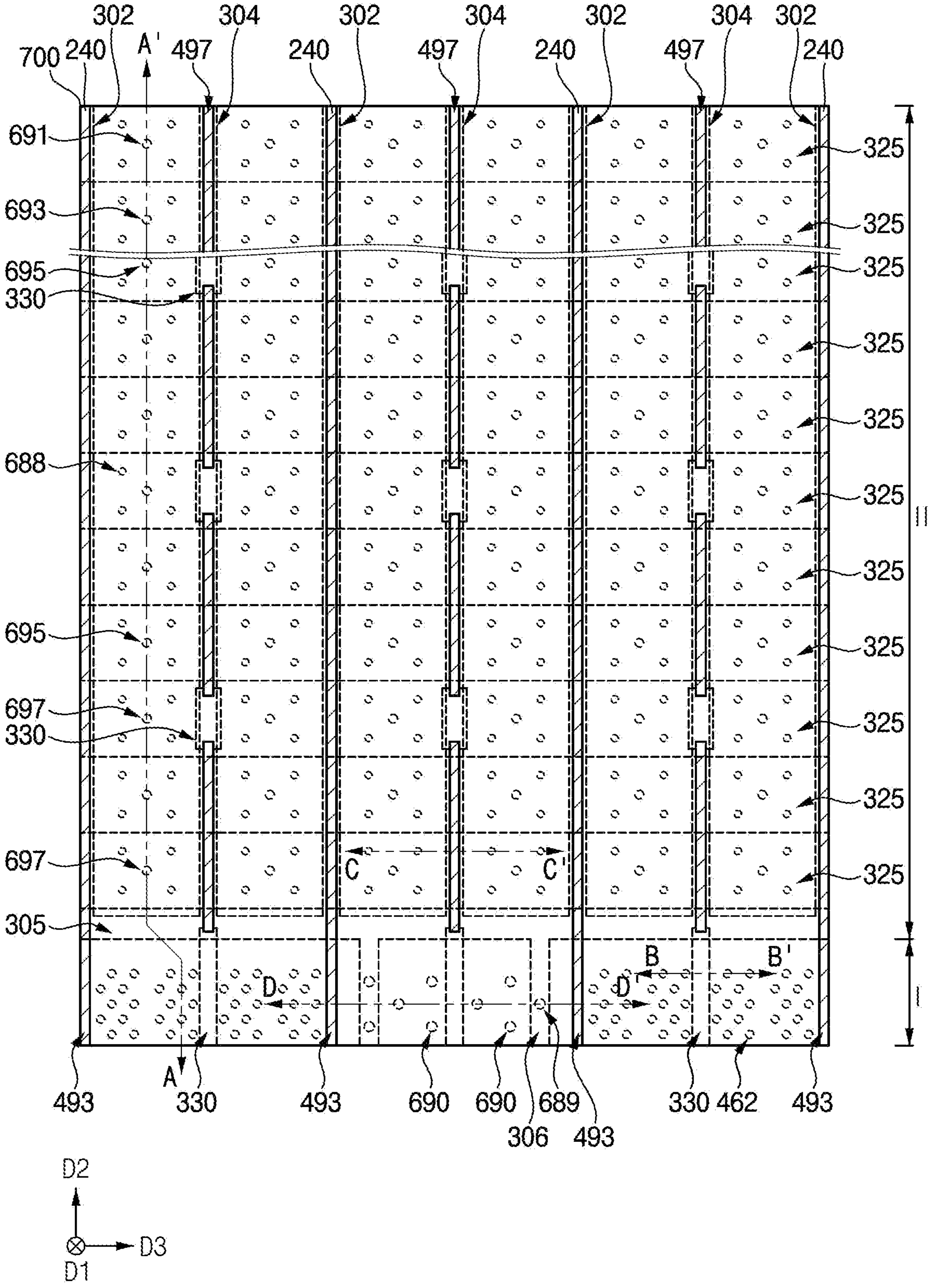
Figure 26:
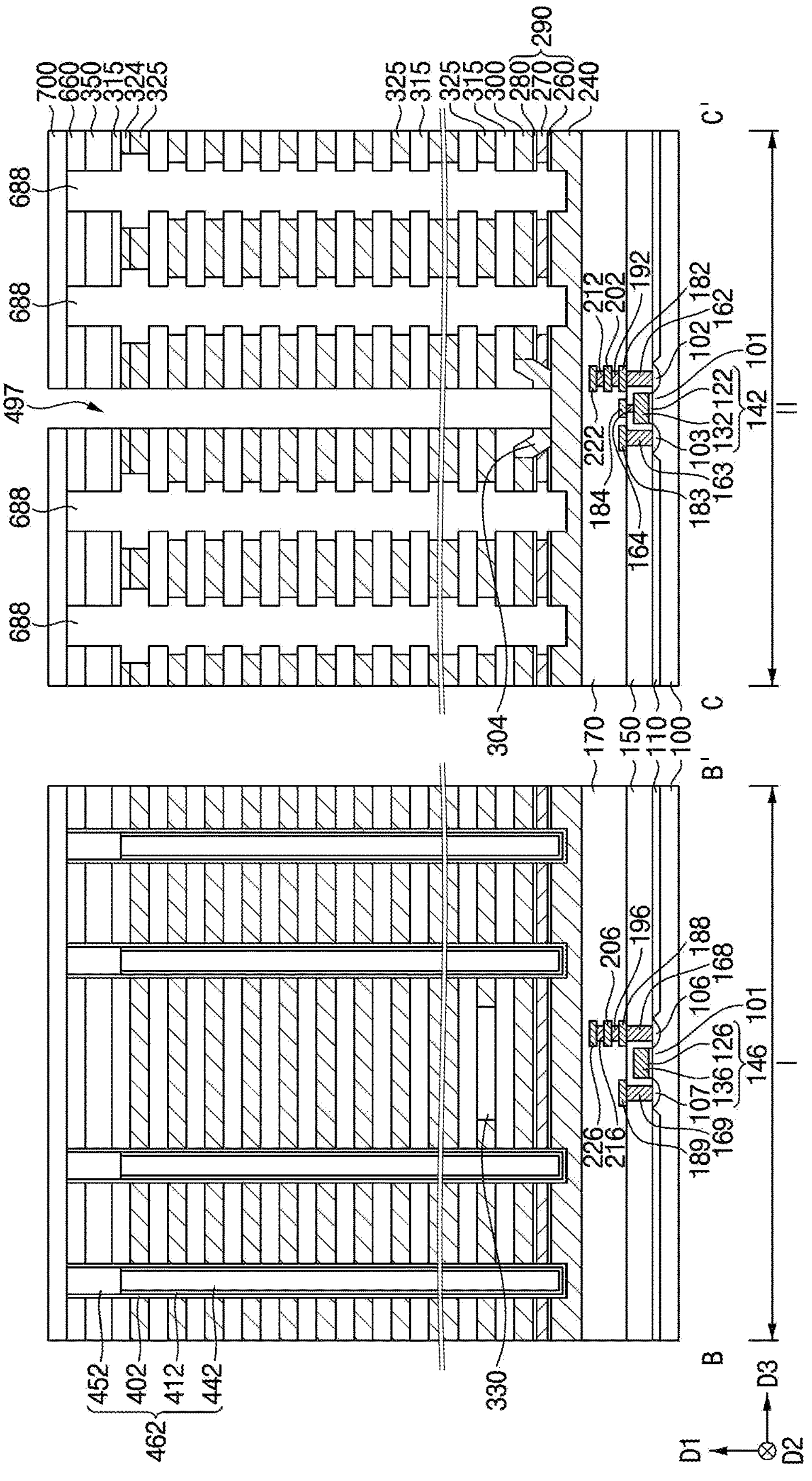
Figure 27:
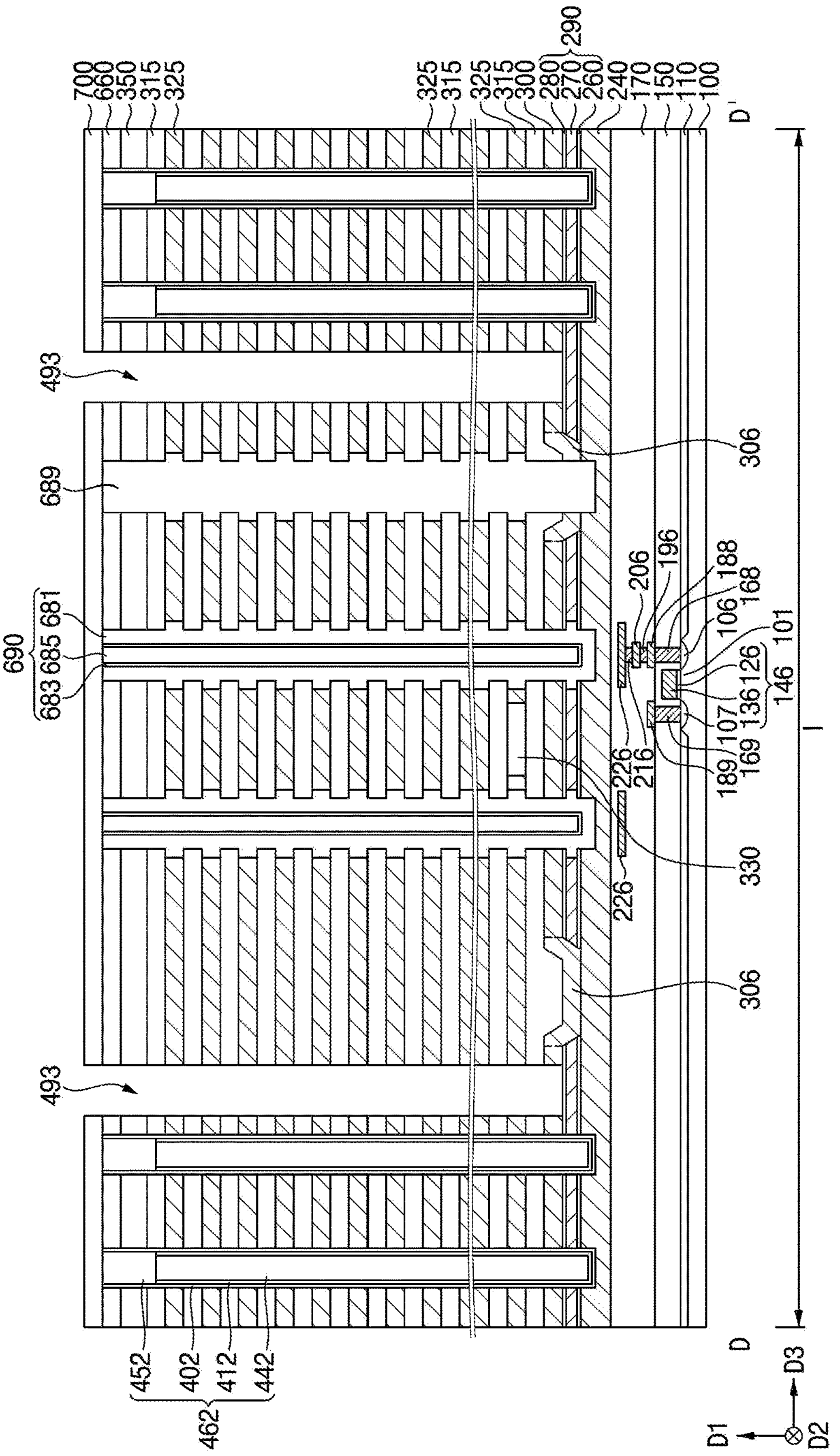

Referring to FIGS. 25 to 27, a sixth insulating interlayer 700 may be formed on the fifth insulating interlayer 660, the first memory channel structure 462, the first and second support structures 688 and 689, and the third to seventh sacrificial pillars 691, 693, 695, 697 and 690, and an etching process may be performed to form a second opening 493 extending in the second direction D2 through the third to sixth insulating interlayers 340, 350, 660 and 700, the mold, the support layer 300, the first and fourth support patterns 302 and 305 and the sacrificial layer structure 290 on the first and second regions I and II of the substrate 100.

In some example embodiments of the present inventive concept, the second opening 493 may extend through the first and fourth support patterns 302 and 305 and may expose the upper surface of the CSP 240 on the second region II of the substrate 100, and the second opening 493 may extend through the support layer 300 and may expose the upper surface of the sacrificial layer structure 290 on the first region I of the substrate 100.

In some example embodiments of the present inventive concept, the second openings 493 may be formed at a regular distance from each other in the third direction D3. Accordingly, the second openings 493 that may be formed by the same etching process may have substantially the same width as each other, and the etching process may be finished in the first and fourth support patterns 302 and 305 and the support layer 300 including the same material as each other, so that the second openings 493 may expose the upper surface of the CSP 240 or the third sacrificial layer 280.

If the second openings 493 are formed at different distances from each other in the third direction D3, for example, when a distance between first ones of the second openings 493 at opposite sides, respectively, of the third support pattern pair (hereafter, an area between the first ones of the second openings 493 may be referred to as a dummy memory block area) is greater than a distance between second ones of the second openings 493 in other areas (hereafter, the other areas may be referred to as an active memory block area), even if the same etching process is performed, a width and a depth of the first ones of the second openings 493 at the respective opposite sides of the dummy memory block area may be greater than a width and a depth, respectively, of the second ones of the second openings 493 in the active memory block area. Thus, to decrease distributions of the widths and the depths of the second openings 493 that may be amplified during subsequent processes, the third support pattern 306 may be aligned with the first support pattern 302 in the second direction D2, so that the etching process for forming the second openings 493 may be finished at the third support pattern 306, which may be formed at a position lower than the support layer 300 in the dummy memory block area.

However, in some example embodiments of the present inventive concept, the second openings 493 may be formed at a regular distance from each other in the third direction D3, and thus, even if the third support pattern 306 in the dummy memory block area might not be aligned with the first support pattern 302 in the second direction D2. The first ones of the second opening 493 at the respective opposite sides of the dummy memory block area may be formed to have the same width and depth as the second ones of the second opening 493 in the active memory block area, so as to extend through the support layer 300 to expose the upper surface of the third sacrificial layer 280.

In some example embodiments of the present inventive concept, the second opening 493 may extend in the second direction D2 on the first and second regions I and II of the substrate 100 to both opposite ends in the second direction D2 of the mold having a staircase shape, and a plurality of second openings 493 may be spaced apart from each other in the third direction D3. Accordingly, the mold may be divided into a plurality of parts spaced apart from each other in the third direction D3 by the second openings 493, and each of the molds may form an active memory block or a dummy memory block. By the formation of the second opening 493, the first insulation layers 310 and the fourth sacrificial layers 320 included in the mold may be divided into a plurality of first insulation patterns 315 and a plurality of fourth sacrificial patterns 325, respectively, and each of the first insulation patterns 315 and each of the fourth sacrificial patterns 325 may extend in the second direction D2.

A third opening 497 extending through the third to sixth insulating interlayers 340, 350, 660 and 700, the mold and the second and fourth support patterns 304 and 305 to expose the upper surface of the CSP 240 may be formed on the second region II of the substrate 100. In some example embodiments of the present inventive concept, a plurality of third openings 497 may be spaced apart from each other in the second direction D2 on the second region II of the substrate 100, which may correspond to a layout of the second support pattern 304. In some example embodiments of the present inventive concept, an end portion of each of the third openings 497 in the second direction D2 may partially extend through the first division pattern 330, and thus, the first division patterns 330 and the third openings 497 may be aligned with each other in the second direction D2.

The second and third openings 493 and 497 may be formed at a regular distance from each other in the third direction D3 on the second region II of the substrate 100.

Even though the mold is divided into a plurality of parts, each of which may extend in the second direction D2 and may be spaced apart from each other in the third direction D3 by the wet etching process for forming the second and third openings 493 and 497, the mold might not collapse by the first and second support structures 688 and 689 and the first memory channel structures 462 that may extend through the mold.

Figure 28:
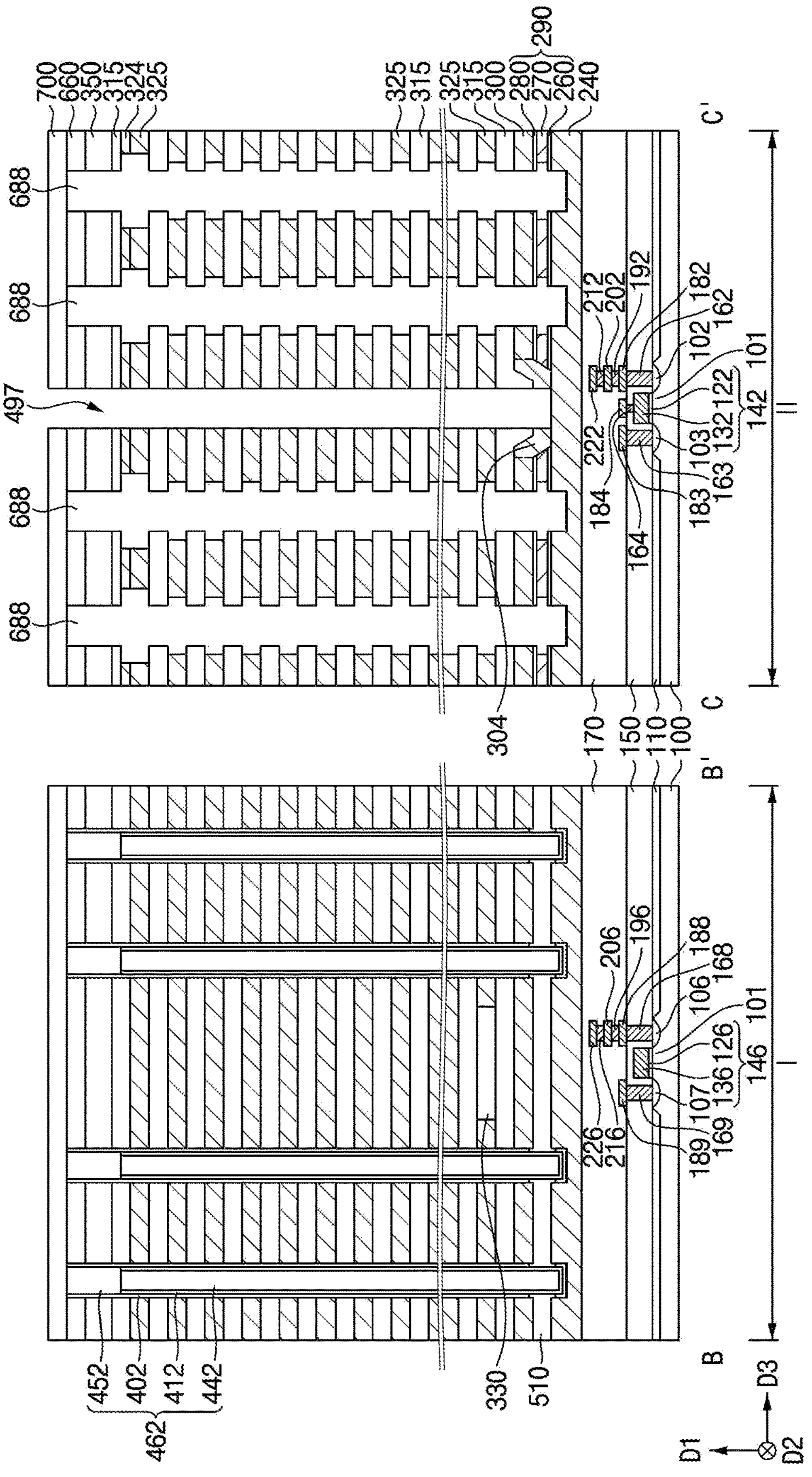
Figure 29:
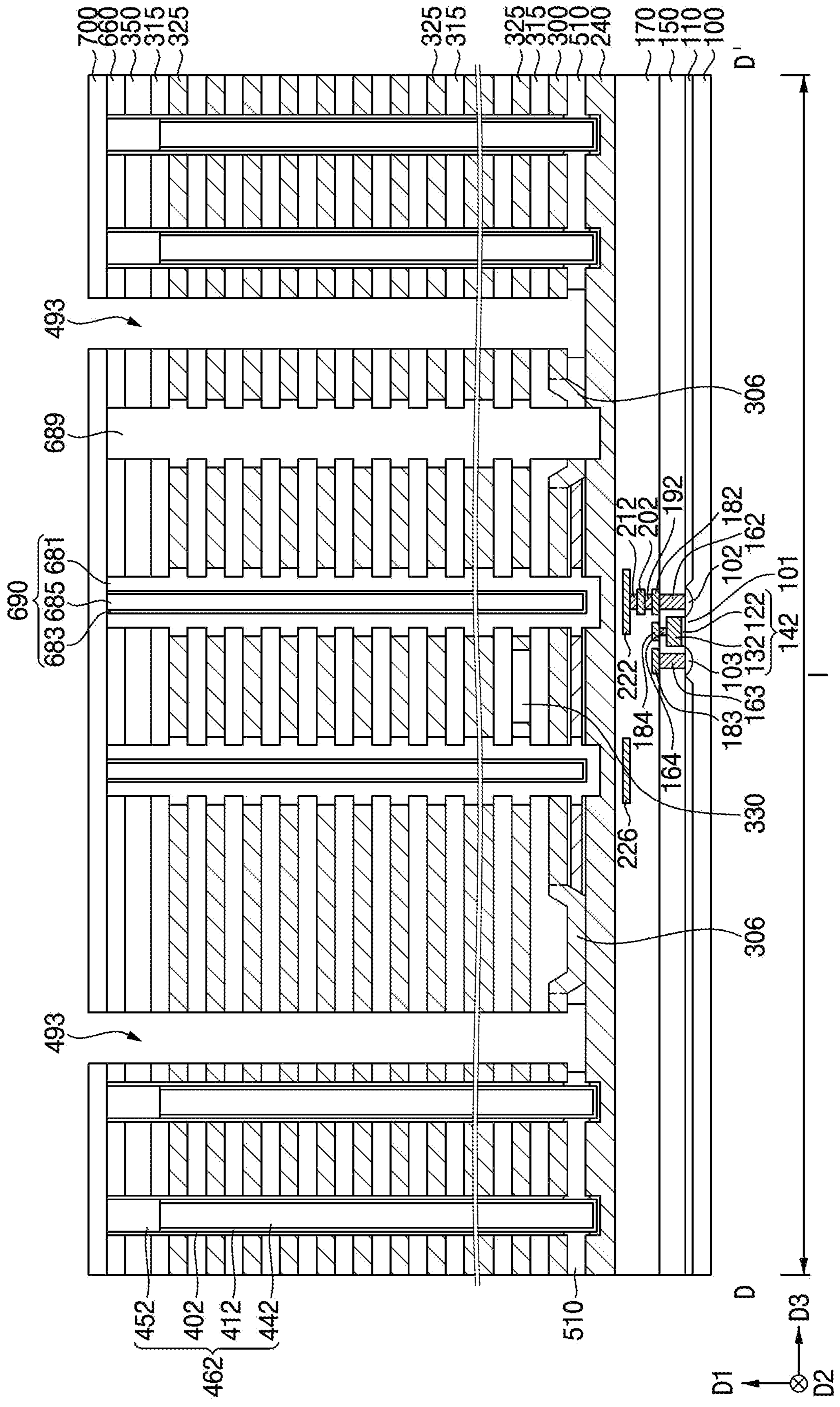

Referring to FIGS. 28 and 29, a spacer layer may be formed on sidewalls of the second and third openings 493 and 497, the upper surfaces of the CSP 240 and the third sacrificial layer 280 exposed by the second and third openings 493 and 497, and an upper surface of the sixth insulating interlayer 700, and an anisotropic etching process may be performed on the spacer layer to remove portions of the spacer layer on the upper surface of the CSP 240 and the third sacrificial layer 280 so that a spacer may be formed.

The spacer layer may include, e.g., polysilicon.

A wet etching process may be performed through the second and third openings 493 and 497, and thus the sacrificial layer structure 290 exposed by the second opening 493 may be removed to form a first gap between the CSP 240 and the support layer 300 on the first region I of the substrate 100.

The wet etching process may be performed using, e.g., hydrofluoric acid (HF) and/or phosphoric acid ($H_3PO_4$). In some example embodiments of the present inventive concept, the third opening 497 may extend through the third support pattern 306 to expose the upper surface of the CSP 240 on the second region II of the substrate 100, instead of extending through the support layer 300 to expose the sacrificial layer structure 290. Thus, the sacrificial layer structure 290 might not be removed by the third support pattern 306 on the second region II of the substrate 100 when the wet etching process is performed.

The etching solution might not flow into the dummy memory block area by the third support patterns 306 on the first region I of the substrate 100, and thus, the sacrificial layer structure 290 might not be removed. However, in some example embodiments of the present inventive concept, the third support pattern 306 might not be formed in the active memory block areas, for example, in ones of the active memory block areas adjacent to the dummy memory block area in the third direction D3, so the sacrificial layer structure 290 may be removed to form the first gap in the ones of the active memory block areas.

As the first gap is formed, a portion of a sidewall of the first charge storage structure 402 may be exposed, and an exposed portion of the sidewall of the first charge storage structure 402 may also be removed by the wet etching process to expose a portion of an outer sidewall of the first channel 412. Thus, the first charge storage structure 402 may be divided into an upper portion, which extends through the mold and covering a portion of the outer sidewall of the channel 412, and a lower portion, which covers a lower surface of the channel 412 on the CSP 240.

The spacer 500 may be removed, and a channel connection layer may be formed on the sidewalls of the second and third openings 493 and 497 and in the first gap, and a portion of the channel connection layer in the second and third openings 493 and 497 may be removed by, e.g., an etch back process to form a channel connection pattern 510 in the first gap.

As the channel connection pattern 510 is formed, the channels 412 between neighboring ones of the second openings 493 in the third direction D3 may be connected with each other on the first region of the substrate 100, for example, in each of the active memory block areas on the first regions of the substrate 100.

In some example embodiments of the present inventive concept, an air gap 515 may be formed in the channel connection pattern 510.

Figure 30:
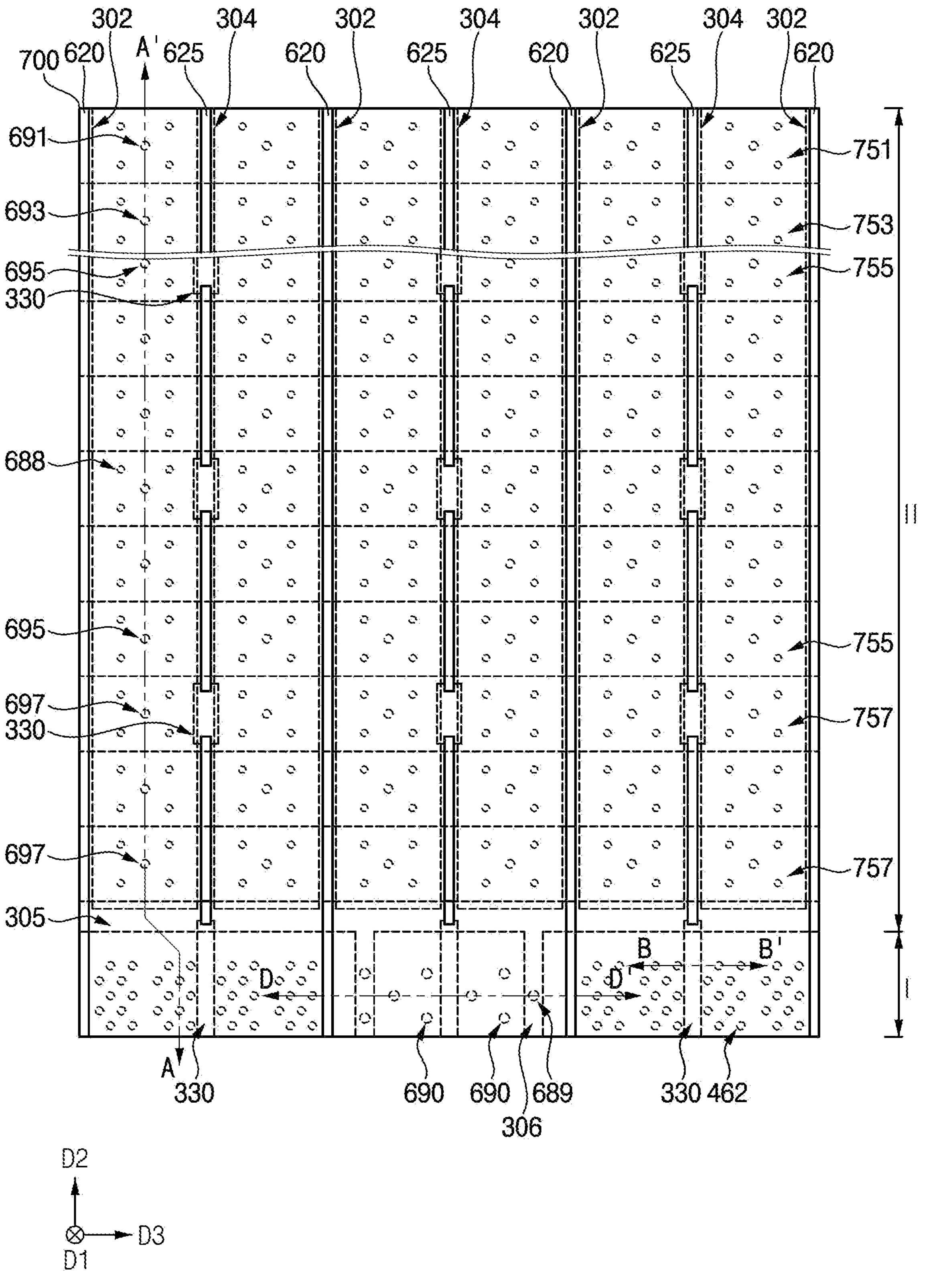
Figure 31:
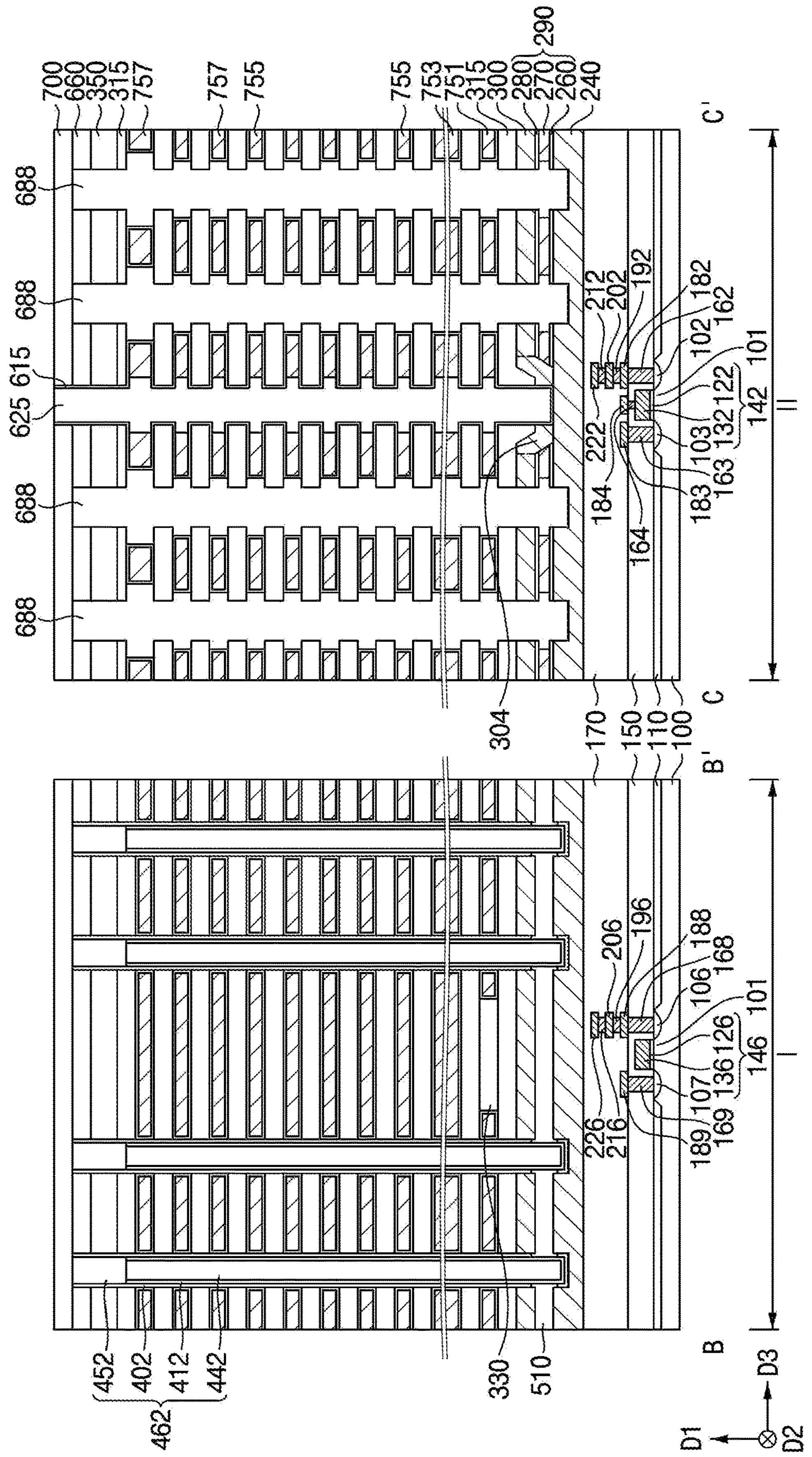
Figure 32:
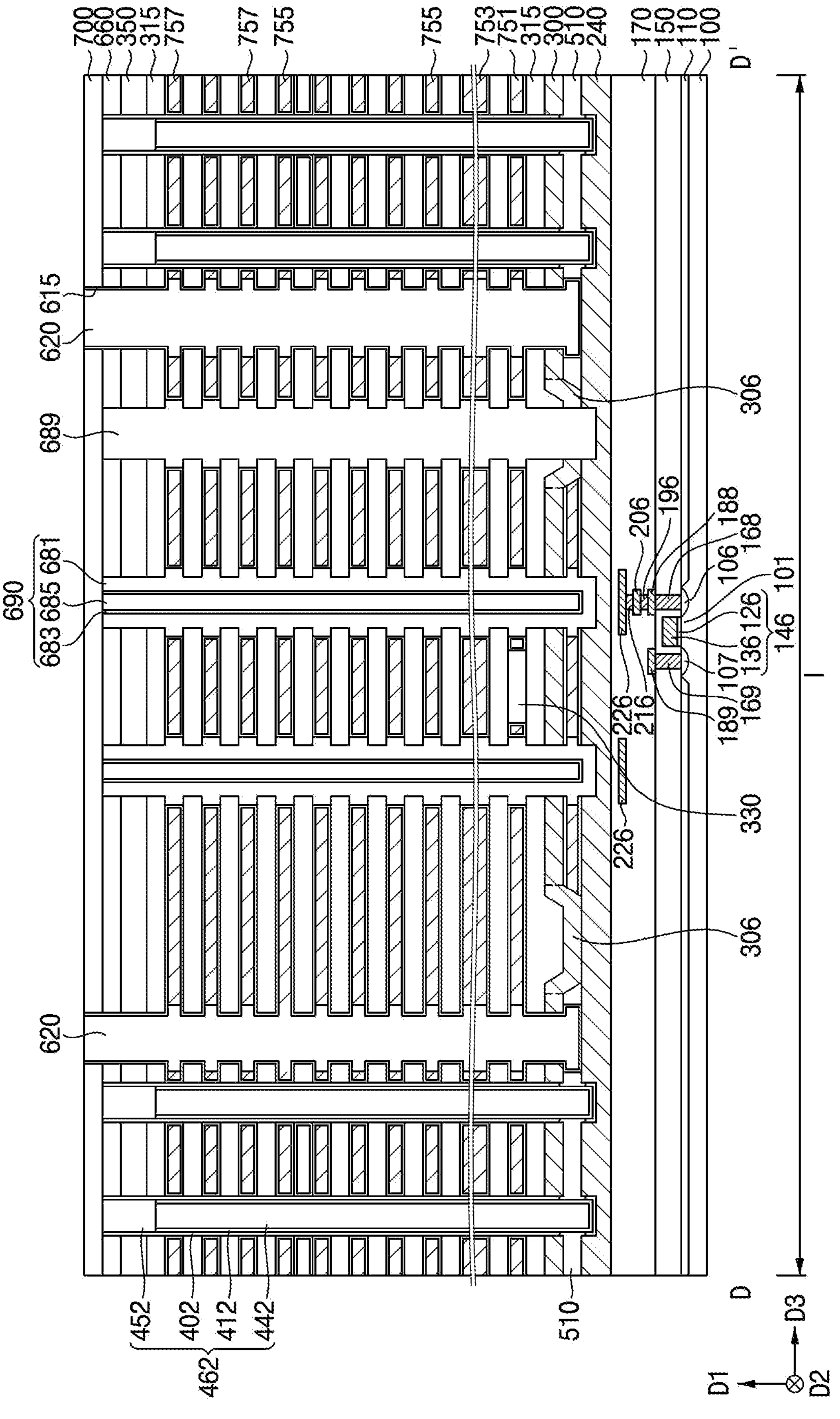

Referring to FIGS. 30 to 32, the second insulation pad 324 and the fourth sacrificial patterns 325 exposed by the second and third openings 493 and 497 may be removed to form a second gap between neighboring ones of the first insulation patterns 315 at respective levels in the first direction D1, and a portion of an outer sidewall of the first charge storage structure 402 included in the first memory channel structure 462, a portion of a sidewall of each of the first and second support structures 688 and 689, and a portion of a sidewall of each of the third to seventh sacrificial pillars 691, 693, 695, 697 and 690 may be exposed by the second gap 590.

In some example embodiments of the present inventive concept, a wet etching process may be performed using, e.g., phosphoric acid ($H_3PO_4$) or sulfuric acid ($H_2SO_4$) to remove the fourth sacrificial patterns 325.

The wet etching process may be performed through the second and third openings 493 and 497, and a portion of the fourth sacrificial pattern 325 that is between the second and third openings 493 and 497 may be removed by an etching solution provided from the second and third openings 493 and 497 in both directions, respectively. For example, an entirety of the fourth sacrificial pattern 325 that is between the second and third openings 493 and 497 may be removed.

A second blocking layer may be formed on the portion of the outer sidewall of the first charge storage structure 402, the portion of the sidewall of each of the first and second support structures 688 and 689, the portion of the sidewall of each of the third to seventh sacrificial pillars 691, 693, 695, 697 and 690 exposed by the second gaps, an inner wall of each of the second gaps, surfaces of the first insulation patterns 315, sidewalls of the fourth to sixth insulating interlayers 350, 660 and 700 and an upper surface of the sixth insulating interlayer 700, and gate electrode layer may be formed on the second blocking layer.

The gate electrode layer may be partially removed to form a gate electrode in each of the second gaps. In some example embodiments of the present inventive concept, the gate electrode layer may be partially removed by a wet etching process. As a result, the fourth sacrificial pattern 325 in the mold including the step layers, each of which may include the fourth sacrificial pattern 325 and the first insulation pattern 315, may be replaced with the gate electrode and the second blocking layer covering lower and upper surfaces of the gate electrode.

In some example embodiments of the present inventive concept, the gate electrode may extend in the second direction D2, and a plurality of gate electrodes may be stacked in a plurality of levels, respectively, spaced apart from each other in the first direction D1 to form a preliminary gate electrode structure. The preliminary gate electrode structure may have a staircase shape including the gate electrode as a step layer. An end portion of each of the gate electrodes in the second direction D2, which might not be overlapped by overlying ones of the upper gate electrodes in the first direction D1, that is, a portion corresponding to a step of a step layer of the preliminary gate electrode structure and having a relatively greater thickness may be referred to as a pad.

In some example embodiments of the present inventive concept, a plurality of preliminary gate electrode structures may be spaced apart from each other in the third direction D3, which may be separated by the second openings 493 in the third direction D3. As illustrated above, the third openings 497 may be formed only on the second region II of the substrate 100, so that the preliminary gate electrode structures might not be entirely separated from each other in the third direction D3 by the third openings 497. However, one of the gate electrodes of the preliminary gate electrode structure that may be formed at a lowermost level may be separated from each other in the third direction D3 by the third openings 497 and the first division pattern 330.

The preliminary gate electrode structure may include first to fourth gate electrodes 751, 753, 755 and 757 sequentially stacked on the substrate 100 in the first direction D1.

A second division layer may be formed on the second blocking layer to fill the second and third openings 493 and 497, and may be planarized until the upper surface of the sixth insulating interlayer 700 is exposed.

Accordingly, the second blocking layer may be transformed into a second blocking pattern 615, and second and third division patterns 620 and 625 may be formed in the second and third openings 493 and 497, respectively.

Figure 33:
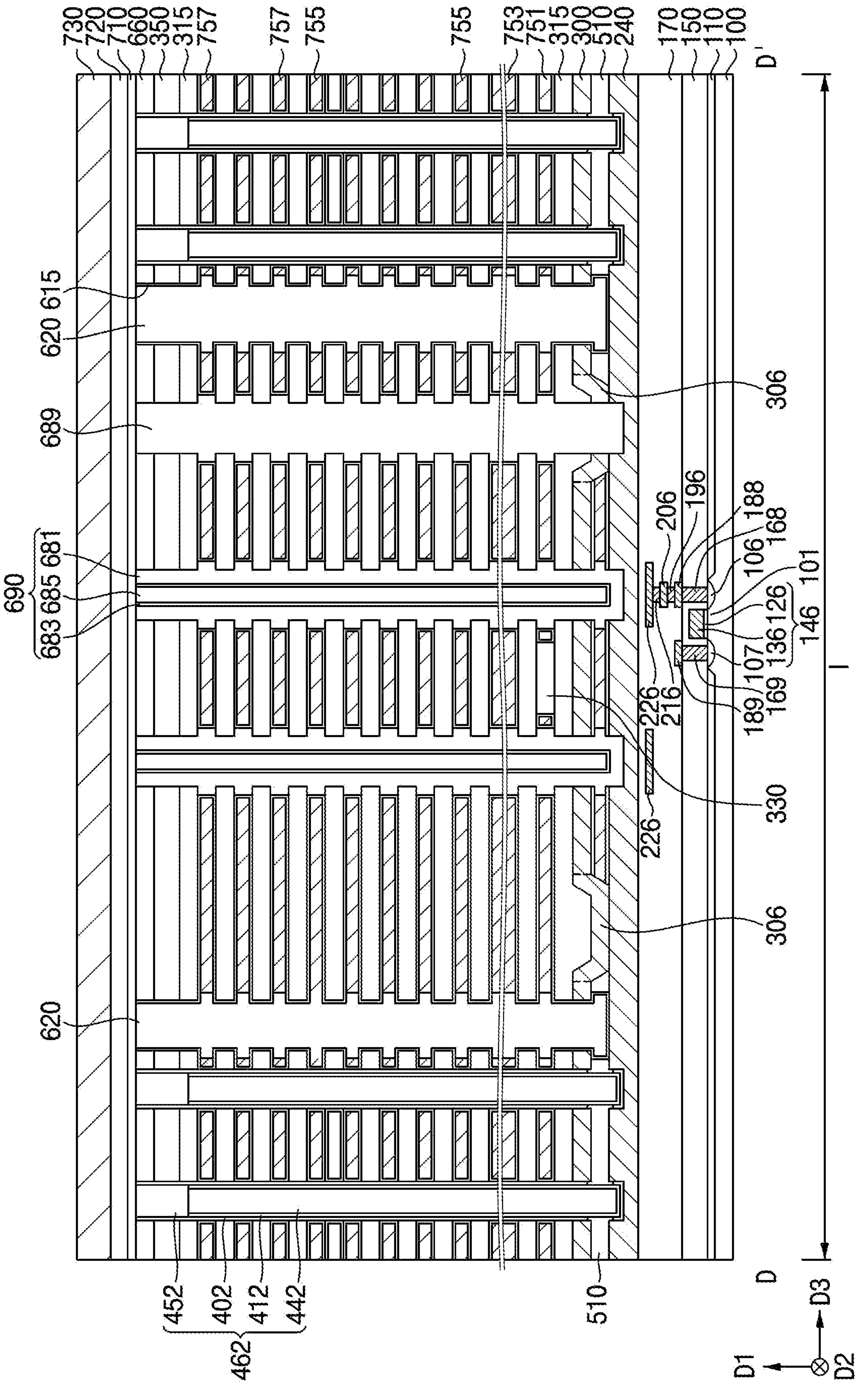

Referring to FIG. 33, a planarization process may be performed on the sixth insulating interlayer 700 until the upper surface of the fifth insulating interlayer 660 is exposed, and upper portions of the second and third division patterns 620 and 625 may also be removed through the planarization process.

Thus, upper surfaces of the first memory channel structure 462, the first and second support structures 688 and 689, and the third to seventh sacrificial pillars 691, 693, 695, 697 and 690 may be exposed.

A seventh insulating interlayer 710, an etch stop layer 720 and a fifth gate electrode layer 735 may be sequentially stacked on the fifth insulating interlayer 660, the first memory channel structure 462, the first and second support structures 688 and 689, and the third to seventh sacrificial pillars 691, 693, 695, 697 and 690.

Figure 34:
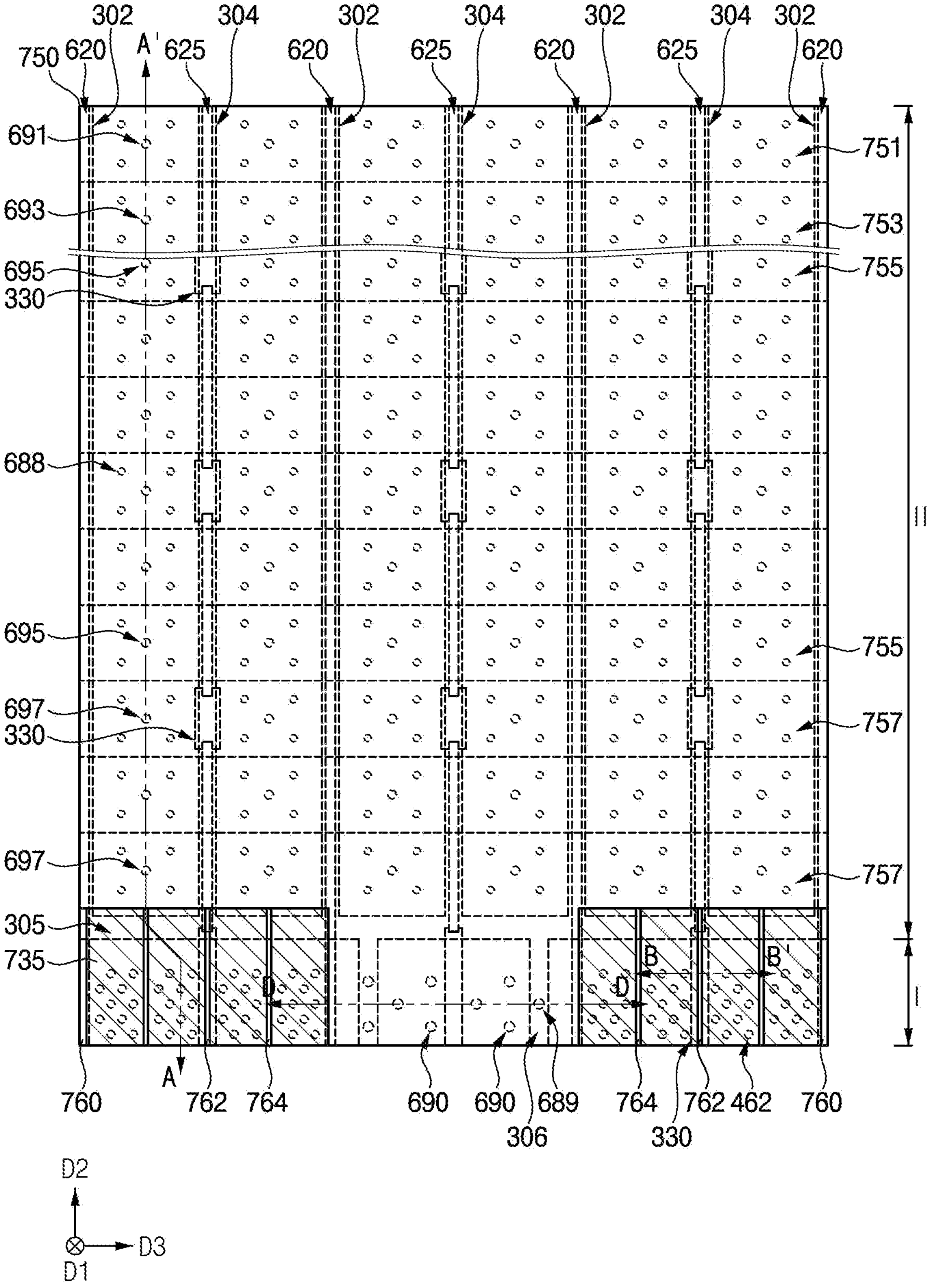
Figure 35:
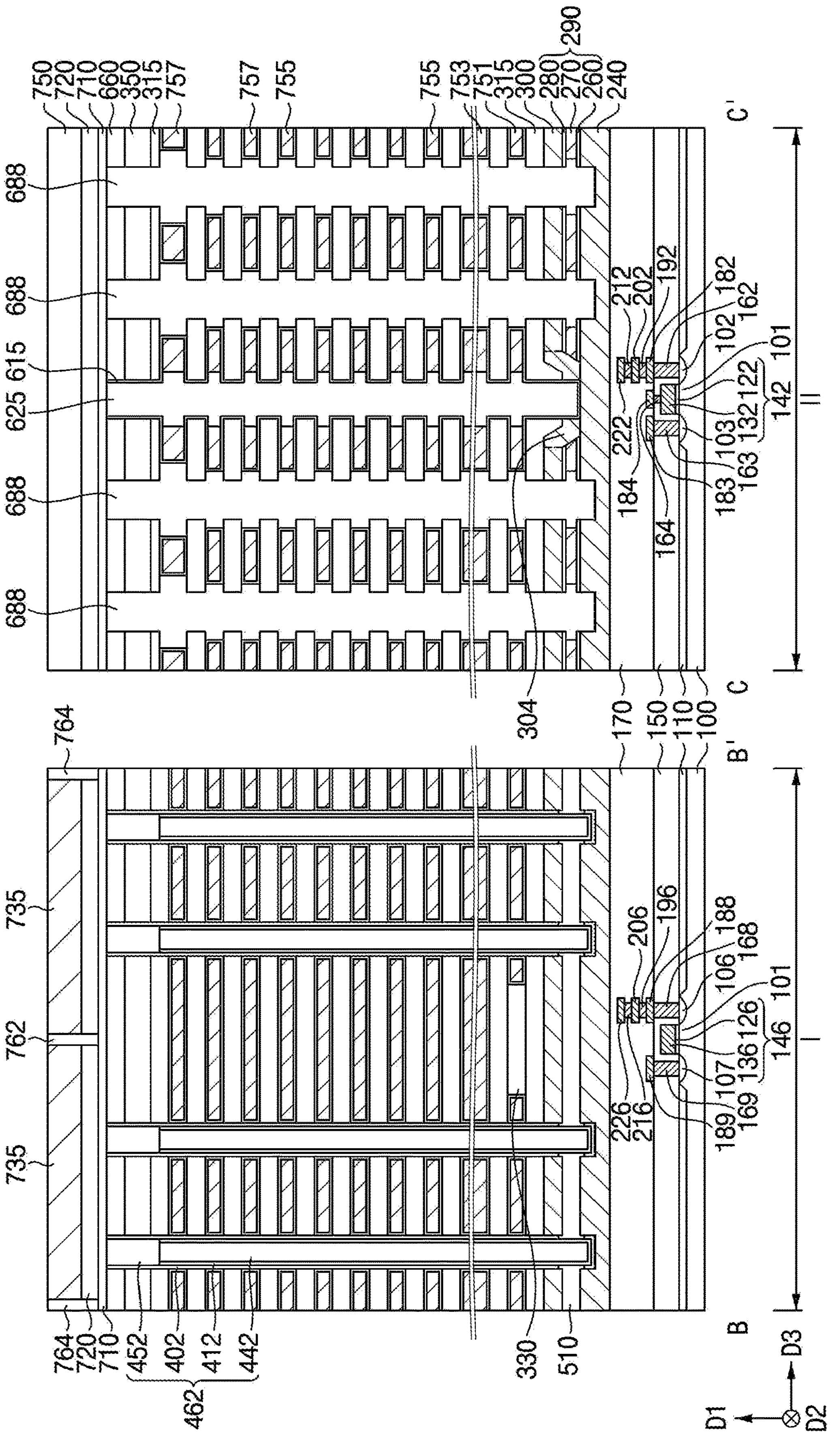
Figure 36:
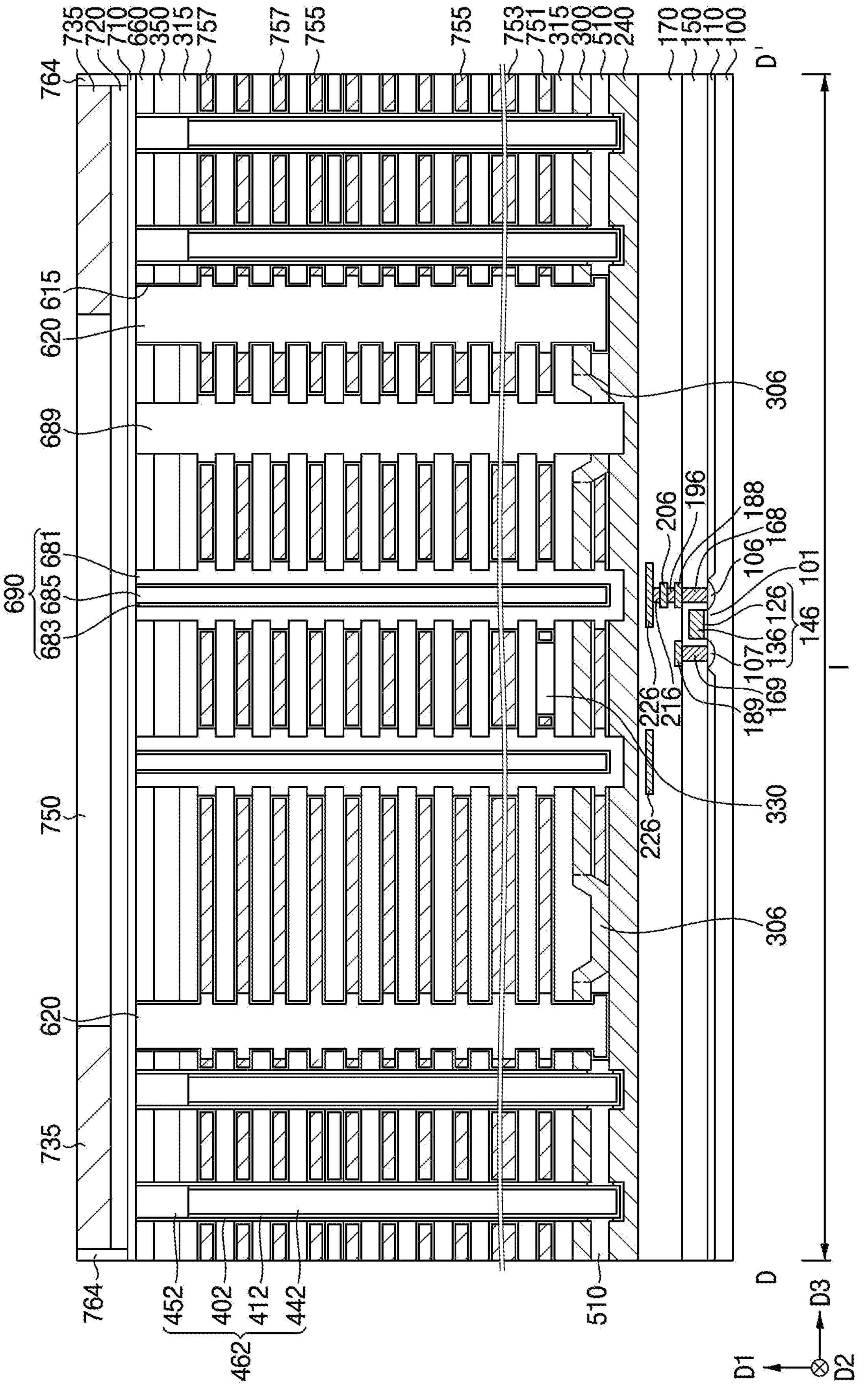

Referring to FIGS. 34 to 36, a portion of the fifth gate electrode layer 735 on the second region II of the substrate 100 and in the dummy memory block area on the first region I of the substrate 100 may be removed by an etching process to form a fourth opening exposing an upper surface of the etch stop layer 720, and an eighth insulating interlayer 750 may be formed to fill the fourth opening.

However, in the etching process, a portion of the second region II of the substrate 100 adjacent to the first region I of the substrate 100 might not be removed.

Fifth to seventh openings may be formed through the fifth gate electrode layer 735 and the etch stop layer 720 to expose an upper surface of the seventh insulating interlayer 710, and fourth to sixth division patterns 760, 762 and 764 may be formed to fill the fifth to seventh opening, respectively.

In some example embodiments of the present inventive concept, the fourth division pattern 760 may overlap the second division pattern 620 in the first direction D1. Further, the fifth division pattern 762 may overlap an end portion of the third division pattern 625 and the first division pattern 330 in the first direction D1, and the sixth division pattern 764 may be formed on a central portion in the third direction D3 between the fourth and fifth division patterns 760 and 762, or a central portion in the third direction D3 between the fifth division pattern 762 and a sidewall of the eighth insulating interlayer 750. In some example embodiments of the present inventive concept, each of the fourth to sixth division patterns 760, 762 and 764 may extend in the second direction D2 on the first region I of the substrate 100 and the portion of the second region II adjacent to the first region I of the substrate 100.

Accordingly, the fifth gate electrode layer 730 may be divided into a plurality of fifth gate electrodes 735, each of which may extend in the second direction D2, spaced apart from each other in the third direction D3 by the fourth to sixth division patterns 760, 762 and 764.

The fifth gate electrode 735 together with the preliminary gate electrode structure including the first to fourth gate electrodes 751, 753, 755 and 757 thereunder may form a gate electrode structure.

In some example embodiments of the present inventive concept, a length of the fifth gate electrode 735 in the second direction D2 may be smaller than a length of an uppermost one of fourth gate electrodes 757 in the second direction D2. Thus, a pad at an end portion of the uppermost one of fourth gate electrodes 757 in the second direction D2 might not be overlapped with the fifth gate electrode 735 in the first direction D1, and the gate electrode structure may have a staircase shape as a whole.

Figure 37:
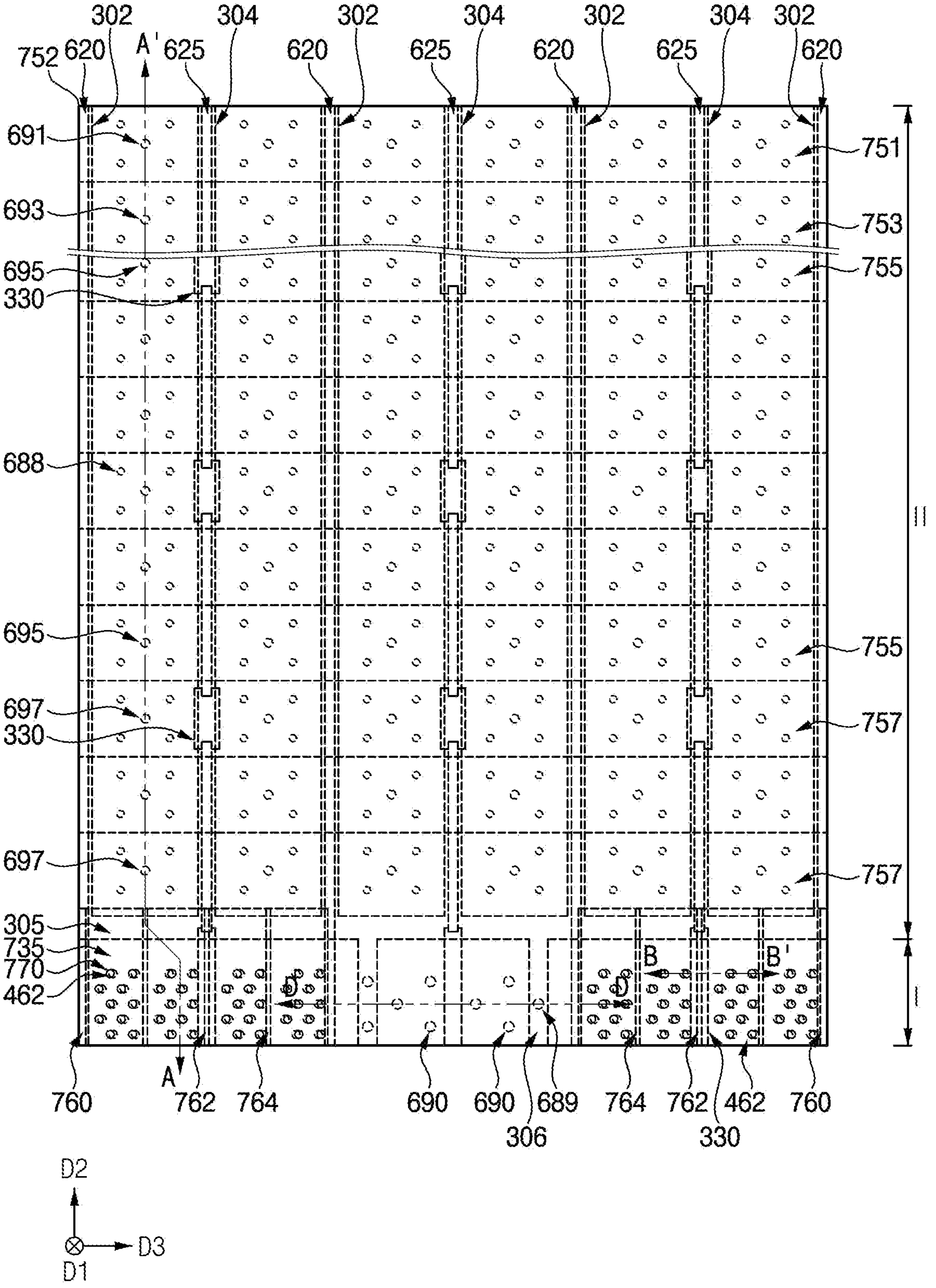
Figure 38:
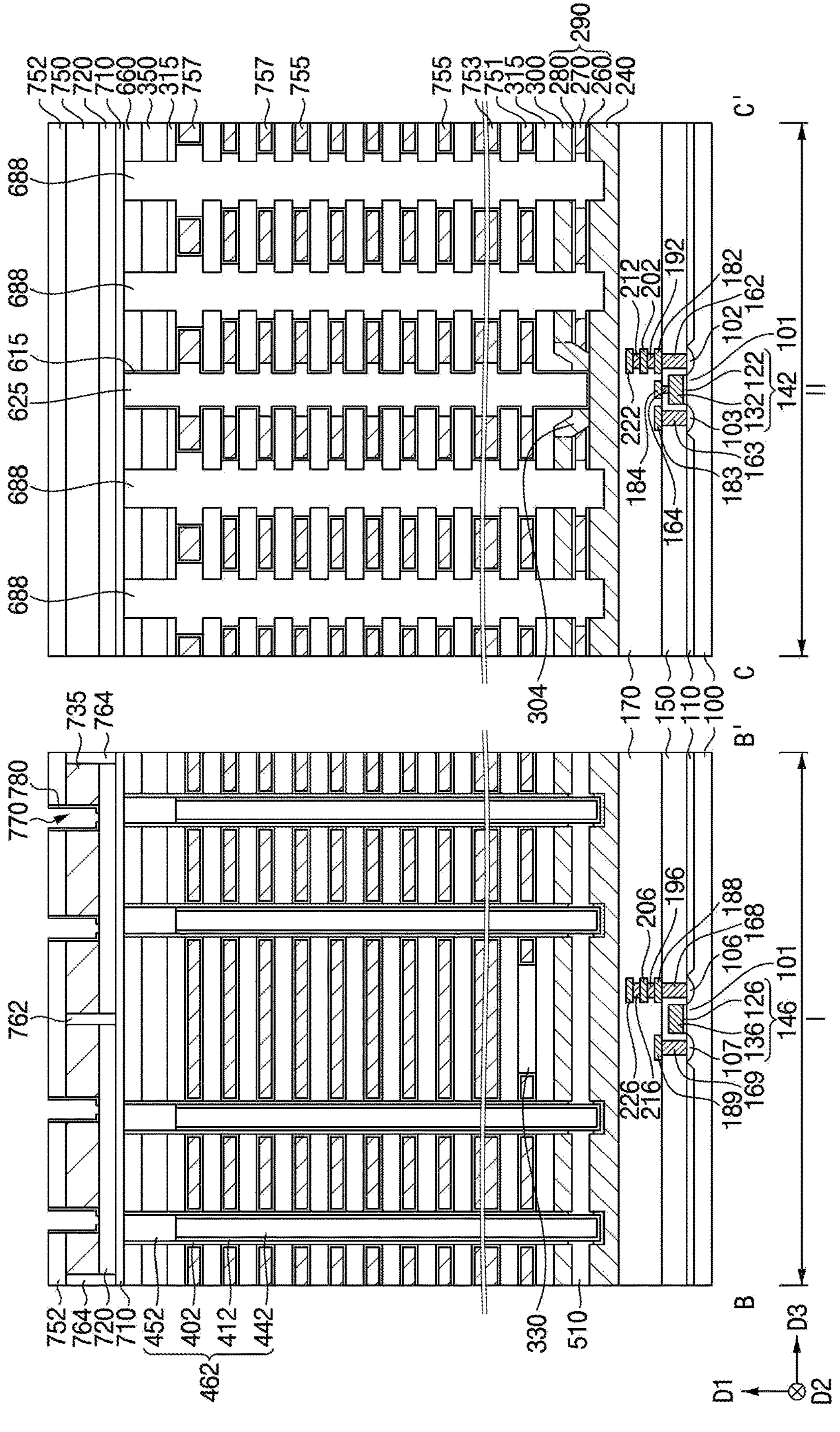
Figure 39:
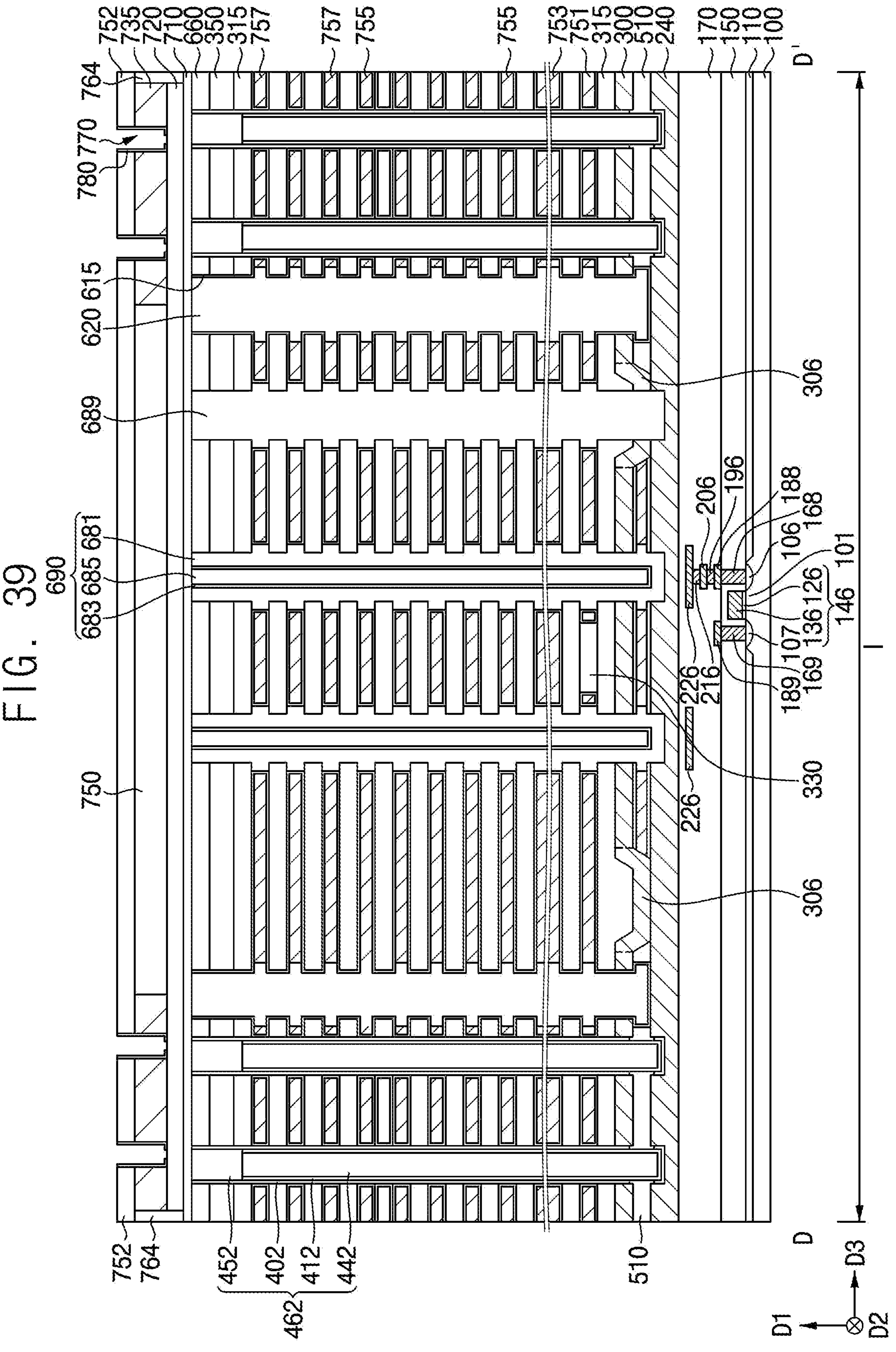

Referring to FIGS. 37 to 39, a ninth insulating interlayer 752 may be formed on the fifth gate electrode 735. In addition, the fourth to sixth division patterns 760, 762 and 764 and the eighth insulating interlayer 750, and a ninth hole 770 may be formed through the ninth insulating interlayer 752 and the fifth gate electrode 735 to expose the upper surface of the etch stop layer 720.

In some example embodiments of the present inventive concept, a plurality of ninth holes 770 may be spaced apart from each other in the second and third directions D2 and D3 to at least partially overlap the first memory channel structure 462 in the first direction D1.

A second charge storage structure layer may be formed on a sidewall and a bottom of the ninth hole 770 and an upper surface of the ninth insulating interlayer 752, and an etch-back process may be performed on the second change storage layer to form a second charge storage structure 780 on the sidewall and an edge portion of the bottom of the ninth hole 770. For example, the second charge storage structure 780 may be formed on the bottom surface of the ninth hole 770. The second charge storage structure 780 may include a third blocking pattern, a second charge storage pattern and a second tunnel insulation pattern sequentially stacked from the sidewall of the ninth hole 770, which may correspond to the first charge storage structure 402.

Figure 40:
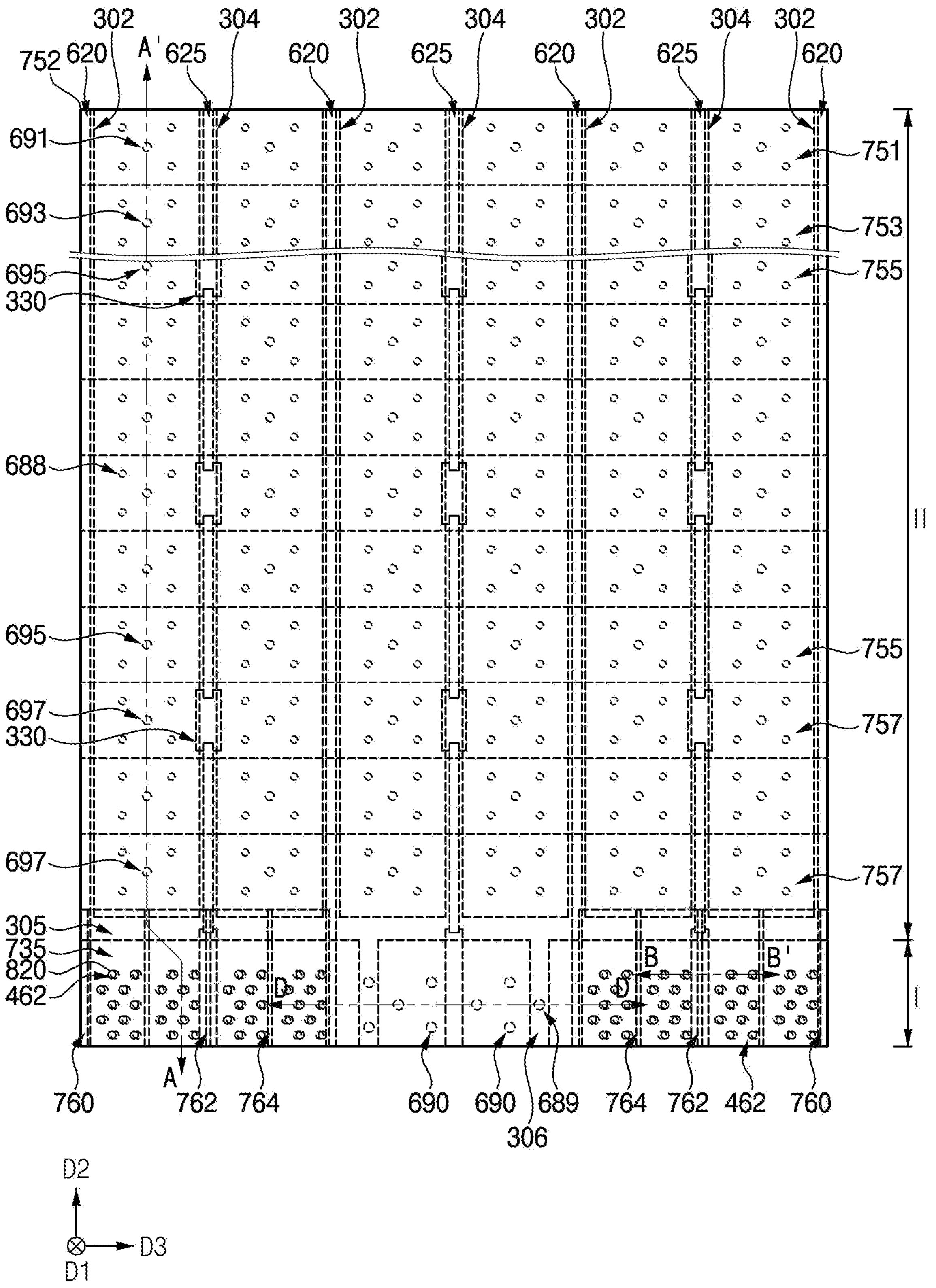
Figure 41:
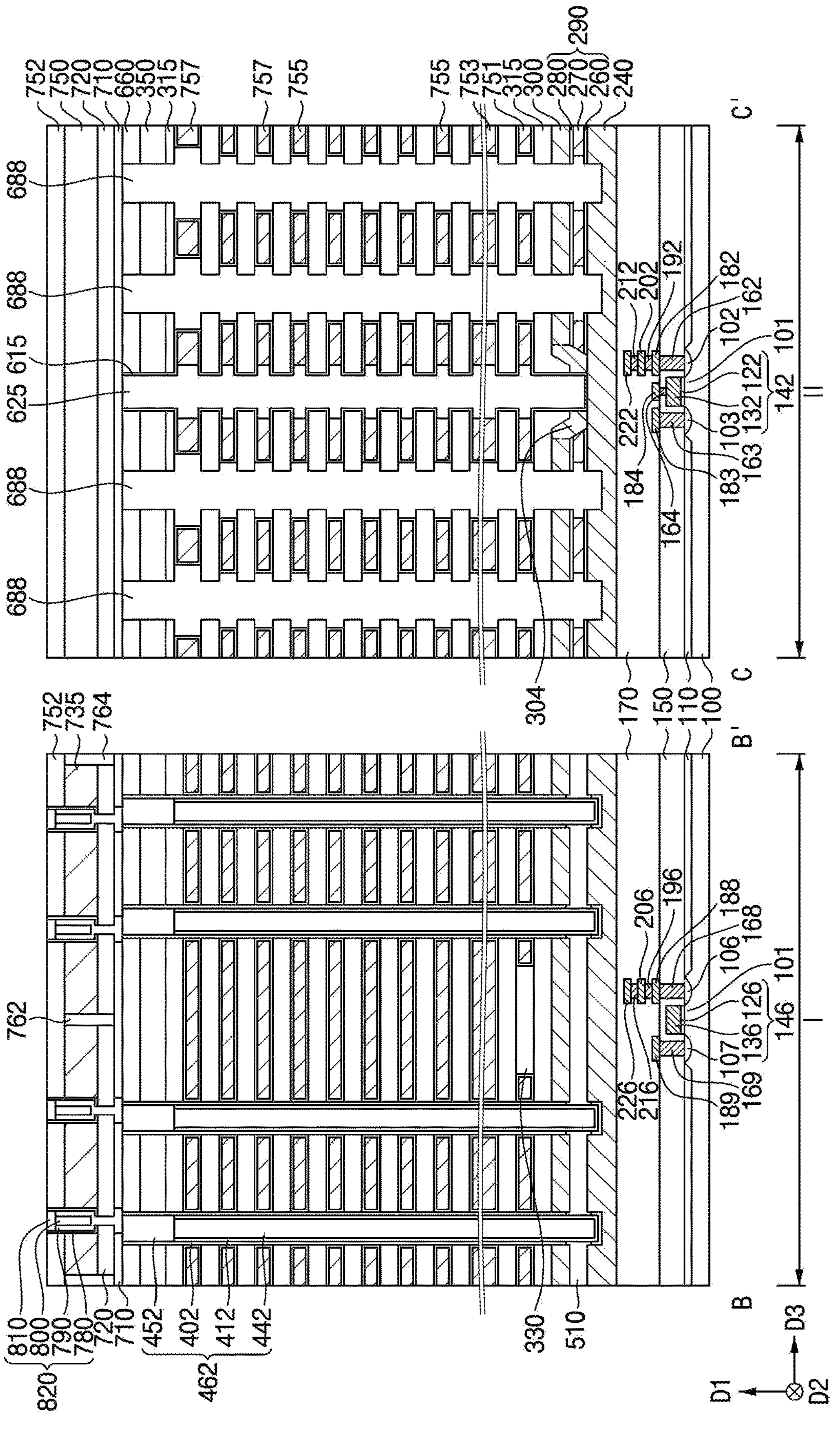
Figure 42:
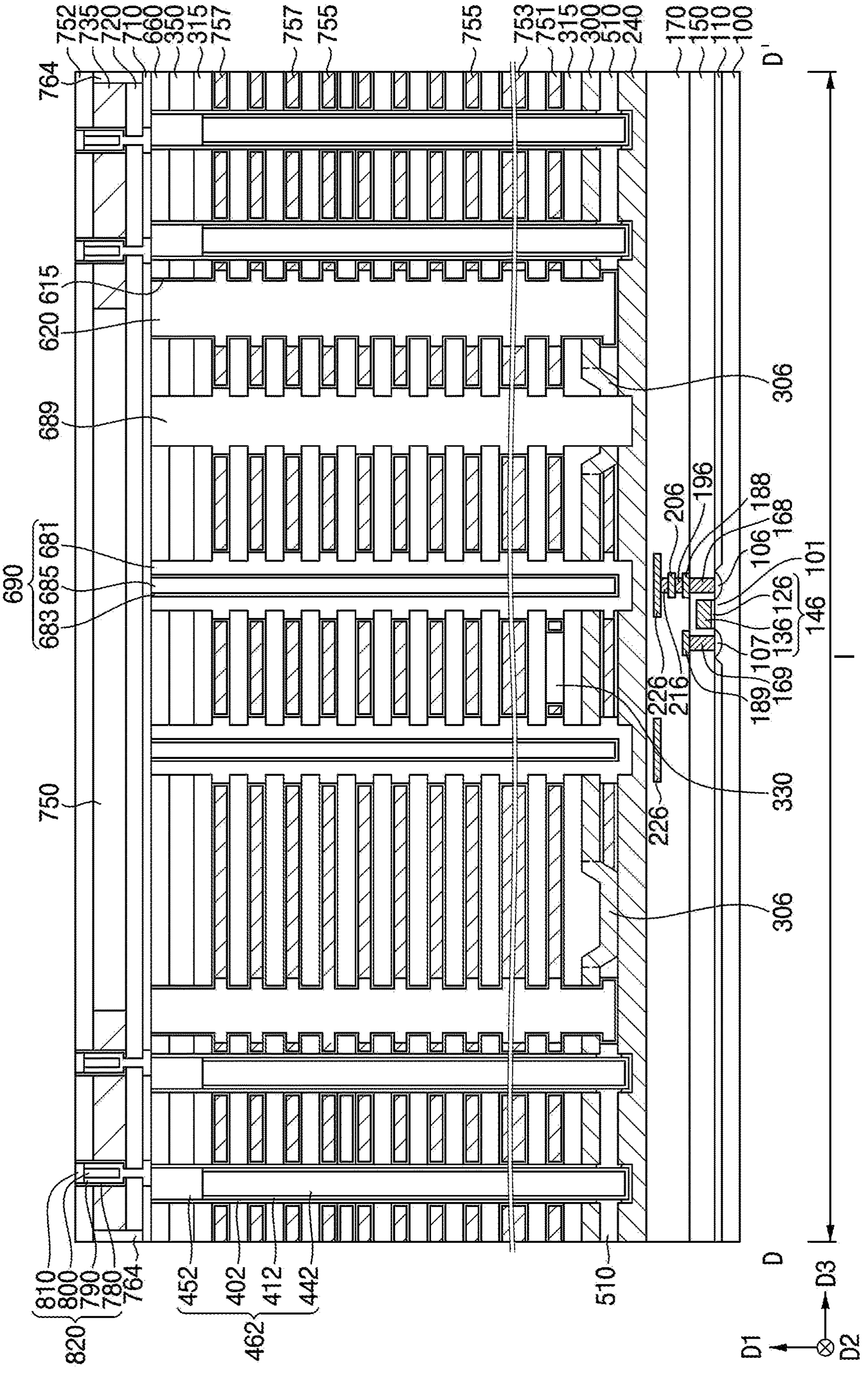

Referring to FIGS. 40 to 42, a portion of the etch stop layer 720, which is exposed by the second charge storage structure 780, and a portion of the seventh insulating interlayer 710 that is disposed under the etch stop layer 720 may be removed to enlarge the ninth hole 770 in the first direction D1. In addition, a portion of the seventh insulating interlayer 710 adjacent to the enlarged ninth hole 770 may be additionally removed to enlarge the ninth hole 770 in the horizontal direction, and thus, a tenth hole may be formed to at least partially expose an upper surface of the first memory channel structure 462.

The tenth hole may also expose an upper surface of a portion of the fifth insulating interlayer 660 adjacent to the first memory channel structure 462.

A second channel 790, a second filling pattern 800 and a second capping pattern 810 may be formed in the tenth hole.

In some example embodiments of the present inventive concept, the second channel 790 may include a lower portion at least partially surrounded by the seventh insulating interlayer 710, a central portion at least partially surrounded by the etch stop layer 720, and an upper portion at least partially surrounded by the second charge storage structure 780. For example, a lower surface and a sidewall of the second filling pattern 800 may be covered by the upper portion of the second channel 790. The second capping pattern 810 may be formed on the second channel 790 and the second filling pattern 800, and may be at least partially surrounded by the second charge storage structure 780.

The second charge storage structure 780, the second channel 790, the second filling pattern 800 and the second capping pattern 810 may collectively form a second memory channel structure 820. The second memory channel structure 820 may contact the upper surface of the first memory channel structure 462, and may be connect to the first memory channel structure 462.

Figure 43:
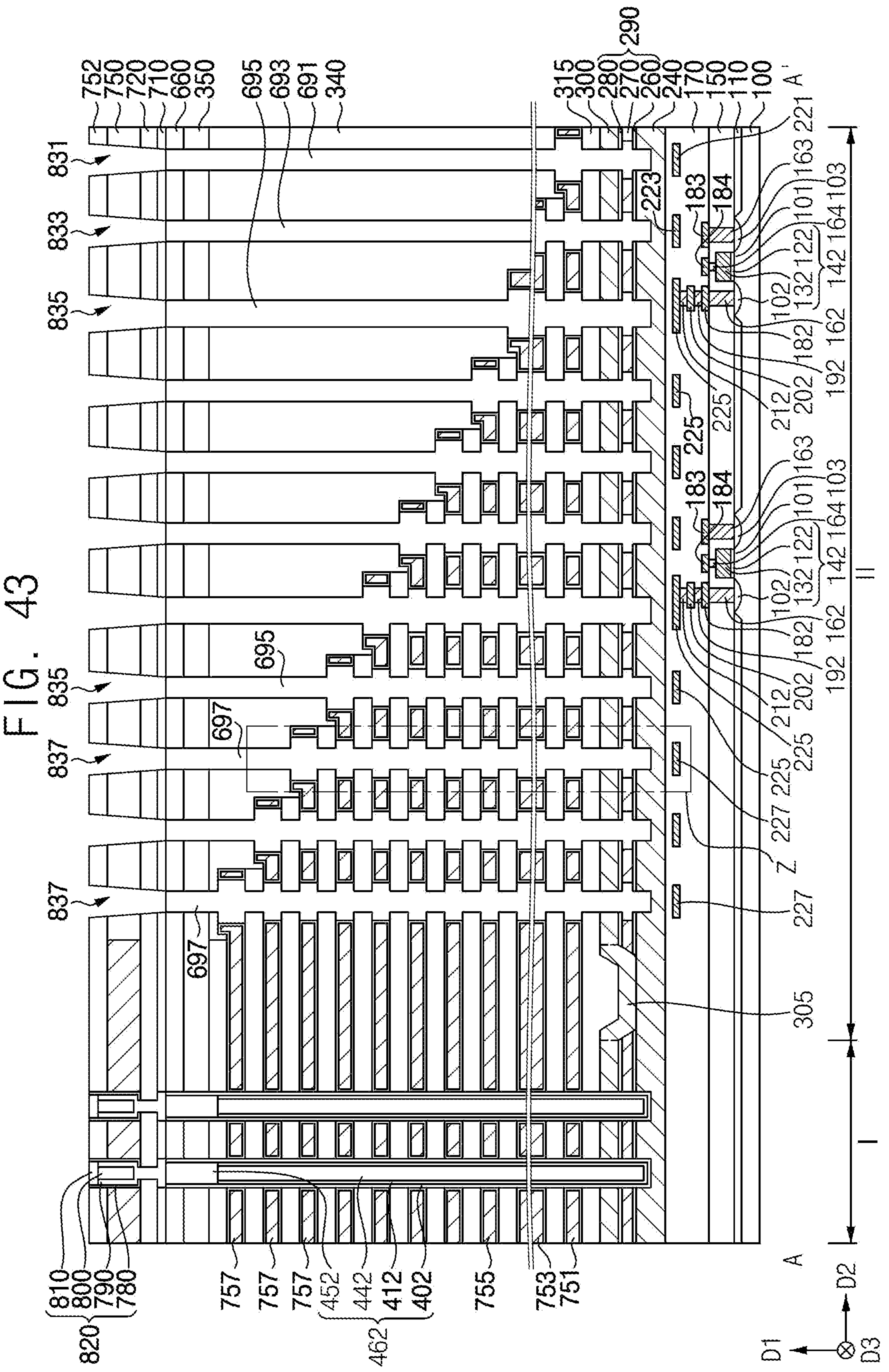
Figure 44:
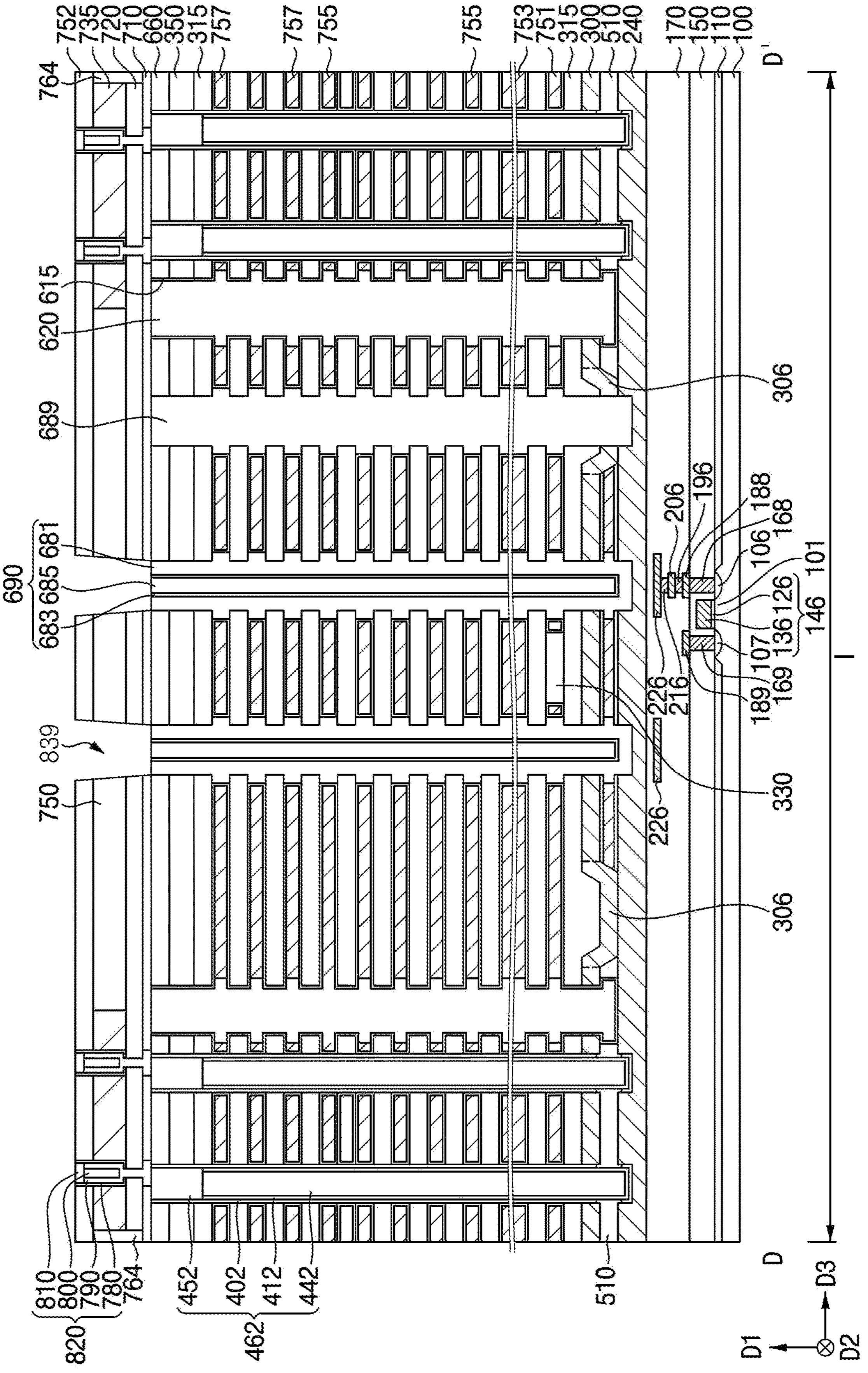

Referring to FIGS. 43 and 44, eleventh to fifteenth holes 831, 833, 835, 837 and 839 may be formed through the seventh to ninth insulating interlayer 710, 750 and 752 and the etch stop layer 720 to expose the third to seventh sacrificial pillars 691, 693, 695, 697 and 690, respectively.

Figure 45:
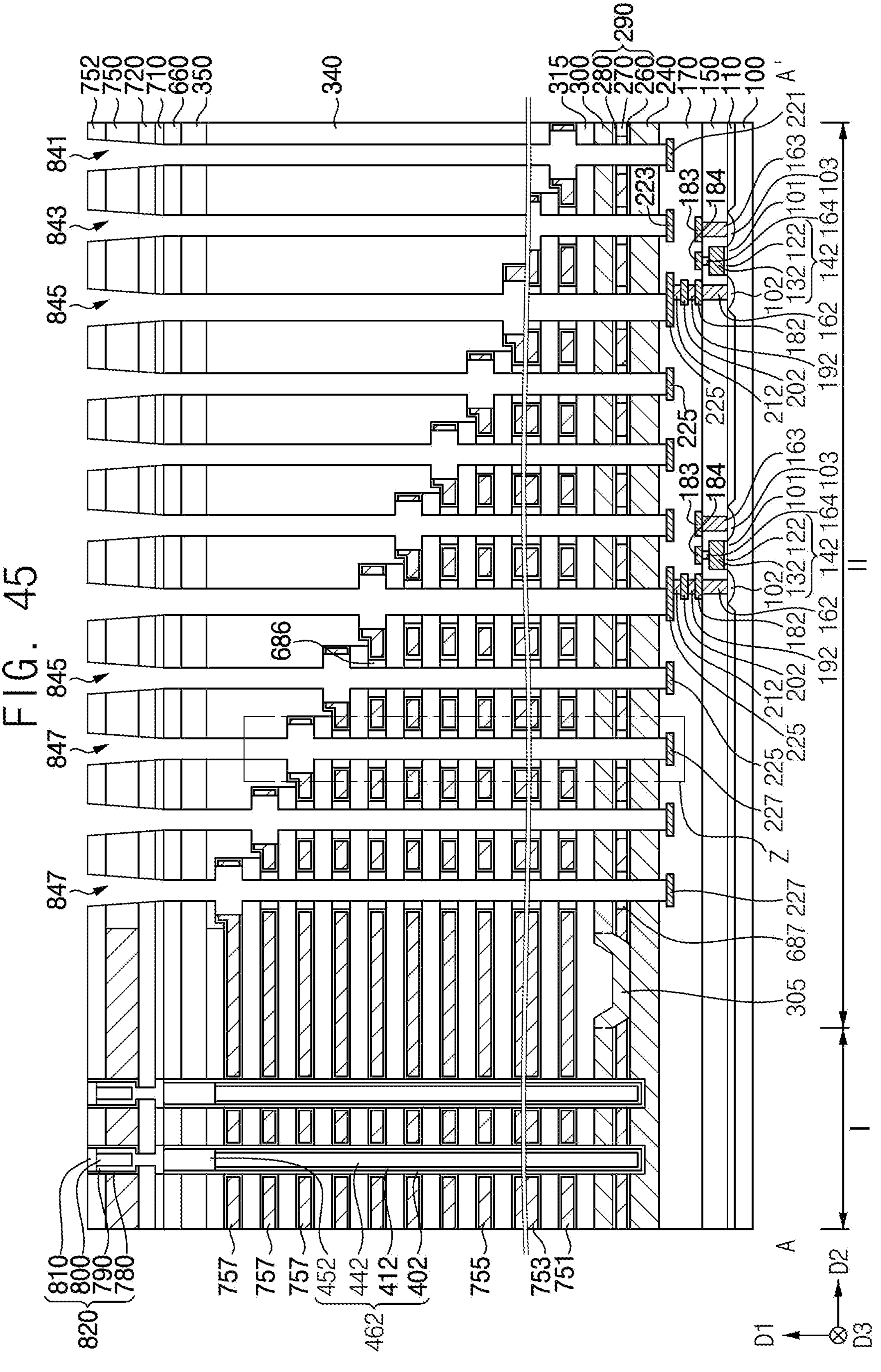
Figure 46:
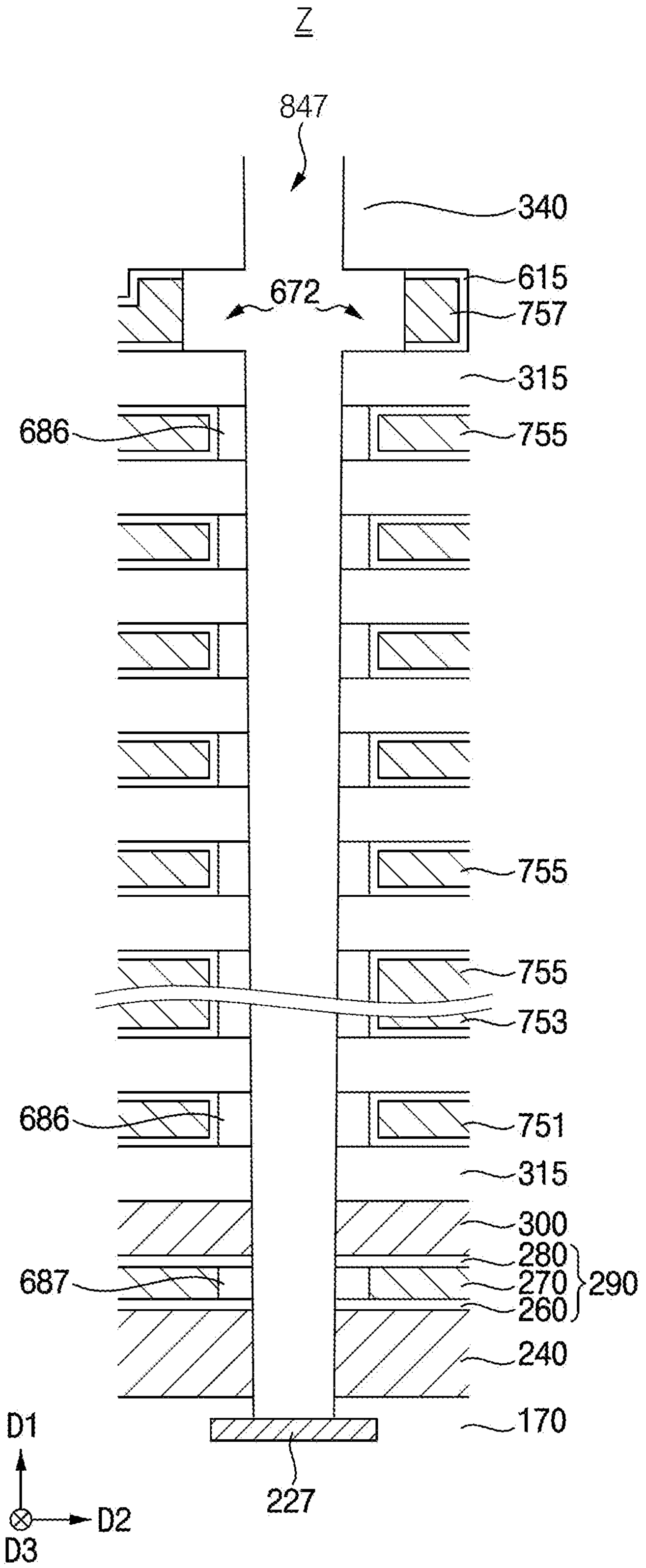
Figure 47:
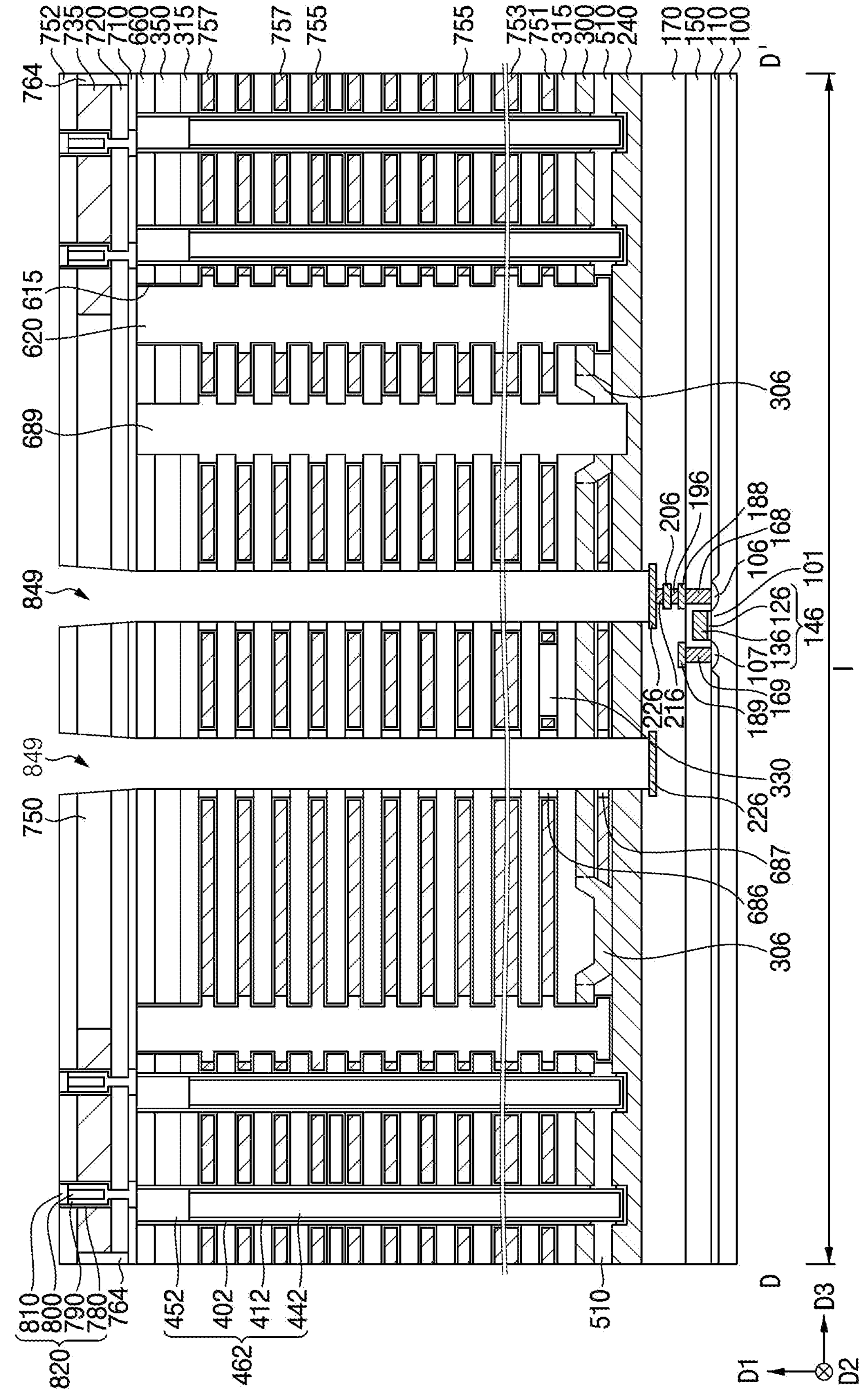

Referring to FIGS. 45 to 47, the third to seventh sacrificial pillars 691, 693, 695, 697 and 690 may partially be removed by an etching process to form sixteenth to twentieth holes 841, 843, 845, 847 and 849, respectively, and thus the upper surface of the CSP 240 may be exposed.

For example, the thirteenth sacrificial pattern 685 and the sacrificial liner 683 included in each of the third to seventh sacrificial pillars 691, 693, 695, 697 and 690 may be removed. Thereafter, the second insulation pattern 681 included in each of the third to seventh sacrificial pillars 691, 693, 695, 697 and 690 may be partially removed. For example, a portion of the second insulation pattern 681 in the third recess 672 having a relatively large width in the first direction D1 may be entirely removed, while portions of the second insulation pattern 681 in the fourth and fifth recesses 674 and 676 having relatively small widths may remain as the fourth and fifth insulation patterns 686 and 687, respectively.

A sidewall of the second blocking pattern 615 exposed by the third recess 672 may be removed, and thus a sidewall of an uppermost one of the gate electrodes in each of the sixteenth to twentieth holes 841, 843, 845, 847 and 849 may be exposed.

Portions of the CSP 240 exposed by the sixteenth to twentieth holes 841, 843, 845, 847 and 849, respectively, and upper portions of the second insulating interlayer 170, which is disposed under the CSP 240, may be removed to expose upper surfaces of the tenth, eleventh, eighth, twelfth and ninth lower wires 221, 223, 225, 227 and 226, respectively.

Figure 48:
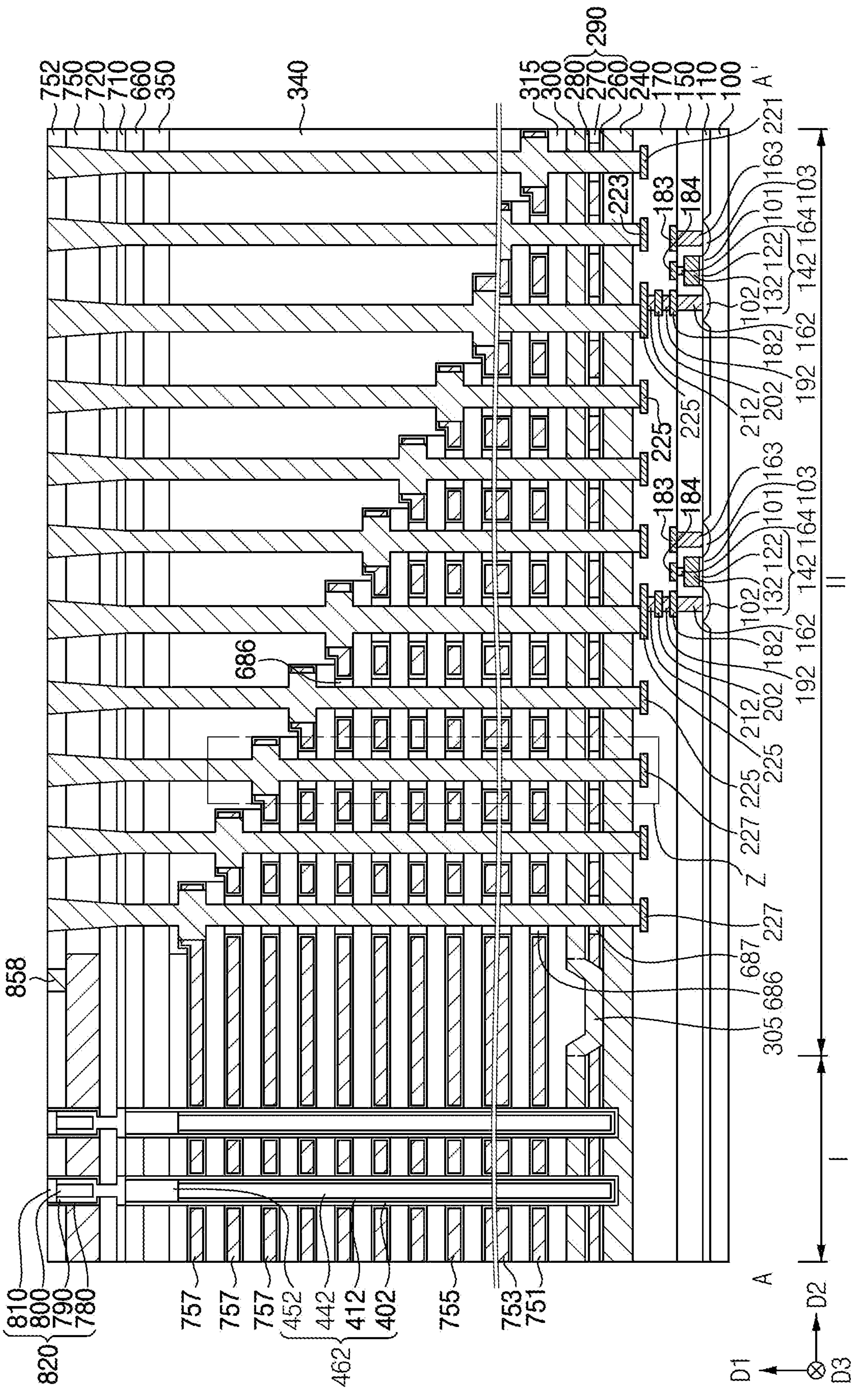
Figure 49:
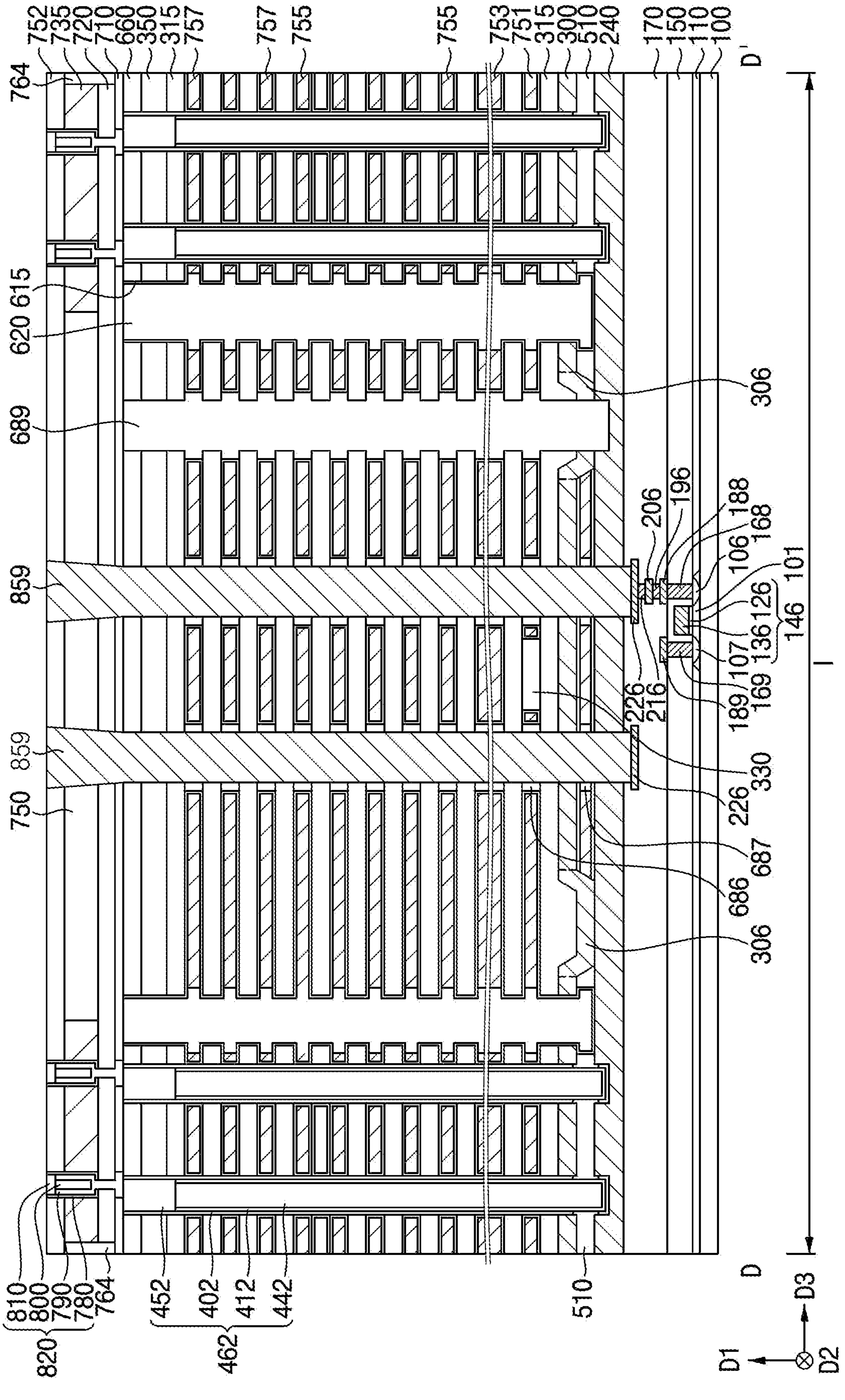

Referring to FIGS. 48 and 49 together with FIGS. 2 and 4, first to fifth upper contact plugs 851, 853, 855, 857 and 859 may be formed in the sixteenth to twentieth holes 841, 843, 845, 847 and 849, respectively, to contact upper surfaces of the tenth, eleventh, eighth, twelfth and ninth lower wirings 221, 223, 225, 227 and 226, respectively.

In addition, a sixth upper contact plug 858 may be formed through the ninth insulating interlayer 752 to contact the upper surface of the fifth gate electrode 735.

Referring back to FIGS. 1 to 6, the tenth to twelfth insulating interlayers 860, 880 and 900 may sequentially stacked on the ninth insulating interlayer 752 and the first to sixth upper contact plugs 851, 853, 855, 857, 859 and 858. In addition, a seventh upper contact plugs 870, upper vias 890 and upper wirings 910 may be formed through the tenth to twelfth insulating interlayers 860, 880 and 900, respectively.

Insulating interlayers, upper vias and upper wirings may be additionally formed on the twelfth insulating interlayer 900 and the upper wirings 910.

The semiconductor device may be manufactured by performing the above processes.

As illustrated above, the third support pattern 306 on the first region I of the substrate 100 may be offset from the first support pattern 302, which is in the second region II, in the third direction D3 instead of being aligned with the first support pattern 302 in the second direction D2 of the substrate 100. Thus, the second opening 493 extending in the second direction D2 on the first and second regions I and II of the substrate 100 may penetrate through the first support pattern 302 on the second region II of the substrate 100, while the second opening 493 might not penetrate through the third support pattern 306 but may penetrate through the support layer 300 on the first region I of the substrate 100.

During the formation of the first gap by removing the sacrificial layer structure 290 through the second opening 493, the first gap may also be formed in the active memory block adjacent to the dummy memory block, and the channel connection pattern 510 may be formed in the first gap. Thus, the first memory channel structures 412 in the active memory block adjacent to the dummy memory block may be electrically connected to each other, and the active memory block including the first memory channel structures 412 may serve as the active memory block that actually operates.

The fourth insulation pattern 686 may be formed between the fifth upper contact plug 859 and each of the gate electrodes in the dummy memory block, and thus electrical insulation between the fifth upper contact plug 859 and each of the gate electrodes may be secured.

While the present inventive concept has been described with reference to example embodiments thereof, it will be understood by those of ordinary skill in the art that various changes in form and details may be made thereto without departing from the spirit and scope of the present inventive concept.

What is claimed is:

1. A semiconductor device comprising:

a lower circuit pattern disposed on a substrate;

a common source plate (CSP) disposed on the lower circuit pattern;

a channel connection pattern disposed on the CSP;

a sacrificial layer structure disposed on the CSP, wherein the sacrificial layer structure is spaced apart from the channel connection pattern;

a support layer disposed on the channel connection pattern and the sacrificial layer structure;

first and second gate electrode structures each including gate electrodes sequentially stacked on the support layer and spaced apart from each other in a first direction substantially perpendicular to an upper surface of the substrate, wherein each of the gate electrodes extends in a second direction substantially parallel to the upper surface of the substrate, and the gate electrodes have a shape in which lengths of the gate electrodes in the second direction decrease in a stepwise manner from a lowermost level toward an uppermost level in the first direction;

a first channel disposed on the CSP, wherein the first channel extends through the first gate electrode structure, the support layer and the channel connection pattern; and a plurality of contact plugs each extending through the second gate electrode structure, the support layer, the sacrificial layer structure and the CSP and including a protrusion extending from a sidewall thereof facing an end sidewall of a respective one of the gate electrodes at a level in the first direction corresponding with the respective one of the gate electrodes, wherein the contact plugs are electrically connected to the lower circuit pattern.

2. The semiconductor device of claim 1, further comprising a division pattern separating the first and second gate electrode structures, wherein the division pattern extends in the second direction and contacts sidewalls of the gate electrodes included in the first and second gate electrode structures.

3. The semiconductor device of claim 2, wherein the division pattern extends through the support layer and the channel connection pattern and contacts an upper surface of the CSP.

4. The semiconductor device of claim 1, further comprising a support pattern disposed between the channel connection pattern and the sacrificial layer structure, wherein the support pattern contacts an upper surface of the CSP and includes substantially a same material as that of the support layer.

5. The semiconductor device of claim 4, wherein the support pattern overlaps the second gate electrode structure in the first direction.

6. The semiconductor device of claim 5, further comprising:

a support structure extending through the second gate electrode structure and the support pattern and contacting the upper surface of the CSP.

7. The semiconductor device of claim 6, wherein the support structure includes a protrusion portion extending from a sidewall of the support structure, wherein the sidewall of the support structure faces each of sidewalls of the gate electrodes included in the second gate electrode structure in a horizontal direction substantially parallel to the upper surface of the substrate.

8. The semiconductor device of claim 1, further comprising an insulation pattern disposed between a sidewall of each of the gate electrodes included in the second gate electrode structure and a portion of a sidewall of the contact plug facing the sidewall of each of the gate electrodes in a horizontal direction that is substantially parallel to the upper surface of the substrate.

9. The semiconductor device of claim 1, wherein the sacrificial layer structure includes first to third sacrificial layers sequentially stacked on each other in the first direction, and wherein each of the first and third sacrificial layers includes an oxide, and the second sacrificial layer includes a nitride.

10. The semiconductor device of claim 9, further comprising an insulation pattern disposed between a sidewall of the second sacrificial layer and a portion of a sidewall of the contact plug facing the sidewall of the second sacrificial layer in a horizontal direction substantially parallel to the upper surface of the substrate, wherein the insulation pattern includes an oxide.

11. The semiconductor device of claim 1, further comprising a second channel disposed on and electrically connected to the first channel.

12. The semiconductor device of claim 1, wherein each of the channel connection pattern and the support layer includes polysilicon doped with impurities, and the sacrificial layer structure includes an insulating material.

13. A semiconductor device comprising:

a lower circuit pattern disposed on a substrate;

a common source plate (CSP) disposed on the lower circuit pattern;

a channel connection pattern disposed on the CSP;

a sacrificial layer structure disposed on the CSP, wherein the sacrificial layer structure is spaced apart from the channel connection pattern;

a support pattern disposed on the CSP, wherein the support pattern is interposed between the channel connection pattern and the sacrificial layer structure;

a support layer disposed on the channel connection pattern and the sacrificial layer structure, wherein the support layer includes substantially a same material as that of the support pattern and is connected to the support pattern;

first and second gate electrode structures each including gate electrodes sequentially stacked on the support layer and spaced apart from each other in a first direction substantially perpendicular to an upper surface of the substrate, wherein each of the gate electrodes extends in a second direction substantially parallel to the upper surface of the substrate;

a channel disposed on the CSP, wherein the channel extends through the first gate electrode structure, the support layer and the channel connection pattern; and a contact plug extending through the second gate electrode structure, the support layer, the sacrificial layer structure and the CSP, wherein the contact plug is electrically connected to the lower circuit pattern, and wherein the contact plug includes a protrusion extending from a sidewall thereof facing an end sidewall of one of the gate electrodes at a level in the first direction corresponding with the respective one of the gate electrodes, wherein the support pattern overlaps the second gate electrode structure in the first direction.

14. The semiconductor device of claim 13, wherein the substrate includes a cell array region, in which memory cells are disposed, and an extension region at least partially surrounding the cell array region, and wherein the support pattern extends in the second direction on the cell array region of the substrate.

15. The semiconductor device of claim 13, wherein the first gate electrode structure is disposed at each of opposite sides of the second gate electrode structure in a third direction substantially perpendicular to the first and second directions, and wherein the support pattern is disposed on a portion of the CSP that is adjacent to the first gate electrode structure and extends in the third direction.

16. The semiconductor device of claim 13, further comprising a division pattern disposed between the first and second gate electrode structures, wherein the division pattern extends in the second direction and contacts sidewalls of the gate electrodes included in the first and second gate electrode structures.

17. The semiconductor device of claim 16, wherein the division pattern extends through the support layer and the channel connection pattern, and contacts an upper surface of the CSP.

18. A semiconductor device comprising:

a lower circuit pattern disposed on a substrate;

a common electrode plate (CSP) disposed on the lower circuit pattern;

a channel connection pattern disposed on the CSP;

a sacrificial layer structure disposed on the CSP, wherein the sacrificial layer structure is spaced apart from the channel connection pattern;

a support pattern disposed on the CSP, wherein the support pattern is interposed between the channel connection pattern and the sacrificial layer structure;

a support layer disposed on the channel connection pattern and the sacrificial layer structure, wherein the support layer includes substantially a same material as that of the support pattern, and is connected to the support pattern;

first and second gate electrode structures each including gate electrodes sequentially stacked on the support layer and spaced apart from each other in a first direction substantially perpendicular to an upper surface of the substrate, wherein each of the gate electrodes extends in a second direction substantially parallel to the upper surface of the substrate;

a division pattern extending in the second direction on the CSP through the support layer and the channel connection pattern, wherein the division pattern separates the first and second gate electrode structures from each other;

a first memory channel structure disposed on the CSP, wherein the first memory channel structure extends through the first gate electrode structure and the support layer and is connected to the channel connection pattern;

a second memory channel structure disposed on the first memory channel structure;

a support structure extending through the second gate electrode structure and the support pattern, and contacting an upper surface of the CSP; and a plurality of contact plugs each extending through the second gate electrode structure, the support layer, the sacrificial layer structure and the CSP, and are electrically connected to the lower circuit pattern, wherein the gate electrodes have a shape in which lengths of the gate electrodes in the second direction decrease in a stepwise manner from a lowermost level toward an uppermost level in the first direction, and a distal end of each of the gate electrodes is in contact with a respective one of the contact plugs.

19. The semiconductor device of claim 18, wherein the support pattern overlaps the second gate electrode structure in the first direction.

20. The semiconductor device of claim 18, wherein an upper surface of the first memory channel structure, an upper surface of the support structure and an upper surface of an isolation pattern are substantially coplanar with each other.

* * * * *